(12) United States Patent
Sato et al.

(10) Patent No.: US 8,193,631 B2
(45) Date of Patent: Jun. 5, 2012

(54) SEMICONDUCTOR DEVICE AND METHOD OF MANUFACTURING THE SEMICONDUCTOR DEVICE

(75) Inventors: Kimitoshi Sato, Chiyoda-ku (JP); Mika Okumura, Chiyoda-ku (JP); Yasuo Yamaguchi, Chiyoda-ku (JP); Makio Horikawa, Chiyoda-ku (JP)

(73) Assignee: Mitsubishi Electric Corporation (JP)

( * ) Notice: Subject to any disclaimer, the term of this patent is extended or adjusted under 35 U.S.C. 154(b) by 940 days.

(21) Appl. No.: 12/164,464

(22) Filed: Jun. 30, 2008

(65) Prior Publication Data

US 2009/0166623 A1    Jul. 2, 2009

(30) Foreign Application Priority Data

Dec. 28, 2007   (JP) ................. 2007-339298

(51) Int. Cl.
*H01L 23/48* (2006.01)
(52) U.S. Cl. ........ 257/693; 257/700; 257/704; 257/784; 257/E33.058; 257/E33.059
(58) Field of Classification Search .................. 257/270, 257/49, 693, 700, 704, 784, E33.58–59
See application file for complete search history.

(56) References Cited

U.S. PATENT DOCUMENTS

| | | | |
|---|---|---|---|
| 5,756,901 A | 5/1998 | Kurle et al. | |
| 5,987,989 A * | 11/1999 | Yamamoto et al. | ........ 73/514.24 |
| 6,030,850 A | 2/2000 | Kurle et al. | |
| 2003/0155622 A1 | 8/2003 | Ishibashi et al. | |
| 2004/0163472 A1 | 8/2004 | Nagahara | |
| 2005/0023547 A1 | 2/2005 | Hartwell et al. | |
| 2007/0062285 A1 | 3/2007 | Yamaguchi et al. | |

FOREIGN PATENT DOCUMENTS

| | | |
|---|---|---|
| CN | 1447921 A | 10/2003 |
| DE | 195 37 814 A1 | 4/1997 |
| DE | 101 96 531 B4 | 8/2003 |
| DE | 103 51 608 A1 | 9/2004 |
| DE | 10 2004 033 162 A1 | 3/2005 |
| JP | 9-129898 | 5/1997 |
| JP | 9-211022 | 8/1997 |
| JP | 2000-150916 | 5/2000 |
| JP | 2001-119040 | 4/2001 |
| JP | 2007-85747 | 4/2007 |

* cited by examiner

*Primary Examiner* — Minchul Yang
(74) *Attorney, Agent, or Firm* — Studebaker & Brackett PC; Donald R. Studebaker; John F. Guay

(57) ABSTRACT

A first interconnection is formed along a groove of a substrate and on a bottom surface of the groove, and has a first thickness. A second interconnection is electrically connected to the first interconnection and has a second thickness larger than the first thickness. An acceleration sensing unit is electrically connected to the second interconnection. A sealing unit has a portion opposed to the substrate with the first interconnection therebetween, and surrounds the second interconnection and the acceleration sensing unit on the substrate. A cap is arranged on the sealing unit to form a cavity on a region of the substrate surrounded by the sealing unit. Thereby, airtightness of the cavity can be ensured and also an electric resistance of the interconnection connected to the acceleration sensing unit can be reduced.

13 Claims, 59 Drawing Sheets

SEMICONDUCTOR DEVICE AND METHOD OF MANUFACTURING THE SEMICONDUCTOR DEVICE

BACKGROUND OF THE INVENTION

1. Field of the Invention

The invention relates to a semiconductor device, and particularly to a semiconductor device provided with a cavity.

2. Description of the Background Art

A certain kind of semiconductor device has an element formed in a cavity. Particularly, when an element having a movable portion is arranged in a sealed cavity, characteristics of the element are improved in some cases. For example, according to Japanese Patent Laying-Open No. 2007-085747, a capacitance type acceleration sensor that is a semiconductor device has an acceleration sensing unit inside a cap (cavity) having airtightness. This cavity is defined by a substrate, a joint frame formed on the substrate and the cap joined to the joint frame. An interconnection held between oxide films extends through the joint frame.

In a process of manufacturing the acceleration sensor, the joint frame is formed on a surface on which the interconnection is present. The surface bearing the joint frame has irregularities formed at an edge portion of the interconnection and depending on the thickness of the interconnection. Therefore, the joint frame formed on this surface likewise has irregularities at its upper surface. When the irregularities at the upper surface of the joint frame are excessively large, it is difficult to join closely the joint frame and the cap together, which results in a problem that airtightness of the cavity cannot be ensured without difficulty. In particular, when a large shift or deviation occurs between the interconnection and the oxide film overlapped together, the irregularities at the upper surface of the joint frame become large, which makes the above problem more serious. For reducing the irregularities at the upper surface of the joint frame in the above conventional method, it is necessary to reduce the thickness of the interconnection. Thus, the above conventional method suffers from a problem that it is difficult to achieve both the ensuring of airtightness of the cavity and the reduction in electric resistance of the interconnection.

SUMMARY OF THE INVENTION

The invention has been made in view of the above, and an object of the invention is to provide a semiconductor device and a method of manufacturing the semiconductor device that can achieve both the ensuring of the airtightness of the cavity and the reduction in electric resistance of the interconnection.

A semiconductor device according to one aspect of the invention includes a substrate, first and second interconnections, an element, a member and a cap. The substrate has a groove. The first interconnection is formed along the groove and on a bottom surface of the groove, and has a first thickness. The second interconnection is formed on the substrate, is electrically connected to the first interconnection and has a second thickness larger than the first thickness. The element is arranged on the substrate and is electrically connected to the second interconnection. The member having a portion opposed to the substrate with the first interconnection therebetween, and surrounds the second interconnection and the element on the substrate. The cap is arranged on the member to form a cavity on a region of the substrate surrounded by the member.

According to another aspect of the invention, a semiconductor device includes a substrate, an interconnection, a covering film, a filling portion, an element and a member. The substrate has a groove. The interconnection is formed along the groove and on a bottom surface of the groove to form a concave portion between the interconnection and a side surface of the groove. The covering film is made of one material and covers an inner surface of the concave portion. The filling portion is made of a material different from the one material and fills the concave portion covered with the covering film. The element is formed on the substrate and is electrically connected to the interconnection. The member has a portion opposed to the substrate with the interconnection and the filling portion therebetween, and surrounds the element on the substrate. The cap is arranged on the member to form a concavity on a region of the substrate surrounded by the member.

According to the invention, a method of manufacturing a semiconductor device includes the following steps. An interconnection covering a part of a main surface of a substrate is formed. On the substrate, an insulating film having a first portion covering the interconnection and a second portion covering the main surface not covered with the interconnection is formed. A first mask layer covering at least a part of the second portion and not covering at least a part of the first portion is formed. The insulating film not covered with the first mask layer is removed by isotropic etching. An element and a member are formed after the removing of the insulating film so that the element is arranged on the substrate and electrically connected to the interconnection and so that the member surrounds the element on the substrate and has a portion opposed to the substrate with the interconnection and the insulating film therebetween. A cap is formed on the member to form a cavity on a region of the substrate surrounded by the member.

According to the invention, a method of manufacturing a semiconductor device includes the following steps. An interconnection covering a part of a main surface of a substrate is formed. On the substrate, an insulating film having a first portion covering the interconnection and a second portion covering the main surface not covered with the interconnection is formed. A first mask layer covering at least a part of the second portion and not covering at least a part of the first portion is formed. The insulating film not covered with the first mask layer is removed by isotropic etching. An element and a member are formed after the removing of the insulating film so that the element is arranged on the substrate and electrically connected to the interconnection and so that the member surrounds the element on the substrate and has a portion opposed to the substrate with the interconnection and the insulating film therebetween. A cap is formed on the member to form a cavity on a region of the substrate surrounded by the member.

In the semiconductor device according to one aspect of the invention, since the second interconnection having the thickness larger than the first thickness is arranged, the electric resistance of the interconnection for electrical connection to the element can be smaller than that in the case where only the interconnection of the first thickness is arranged. Since the 11 interconnection having the thickness smaller than the second thickness is arranged between the member and the substrate, occurrence of the irregularities at the upper surface of the member can be suppressed as compared with the case where only the interconnection of the second thickness is arranged. Therefore, the member and the cap can be joined closely. Therefore, the airtightness of the cavity can be ensured and also the electric resistance of the interconnection can be reduced.

In the semiconductor device according to another aspect of the invention, since the filling portion fills the concave portion formed between the side surface of the groove and the interconnection, the irregularities at the surface formed of the upper surfaces of the interconnection and the filling portion can be small even when the interconnection has a large thickness. Therefore, the occurrence of the irregularities at the upper surface of the member formed on this surface can be suppressed so that the member and the cap can be joined closely. Therefore, the airtightness of the cavity can be ensured and also the electric resistance of the interconnection can be reduced.

In the semiconductor device according to still another aspect of the invention, since the pattern is made of the same material as the interconnection, the interconnection and the pattern can be patterned collectively and thus simultaneously. Therefore, the pattern having the portion located on the opposite sides of the pattern can reduce the irregularities caused by the interconnection, without being affected by overlapping deviation.

In the method of manufacturing the semiconductor device of the invention, since the isotropic etching is performed for removing the insulating film not covered with the first mask layer, the edge of the insulating film has a gently stepped form. Therefore, the irregularities at the surface formed of the upper surfaces of the insulating film and the interconnection become gentle so that the irregularities at the upper surface of the member formed of the insulating film and the interconnection become small. Accordingly, the member and the cap can be closely joined together so that the airtightness of the cavity can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

(First Embodiment)

First, description will be given on a structure of an acceleration sensor that is a semiconductor device of a first embodiment.

Figure 1:
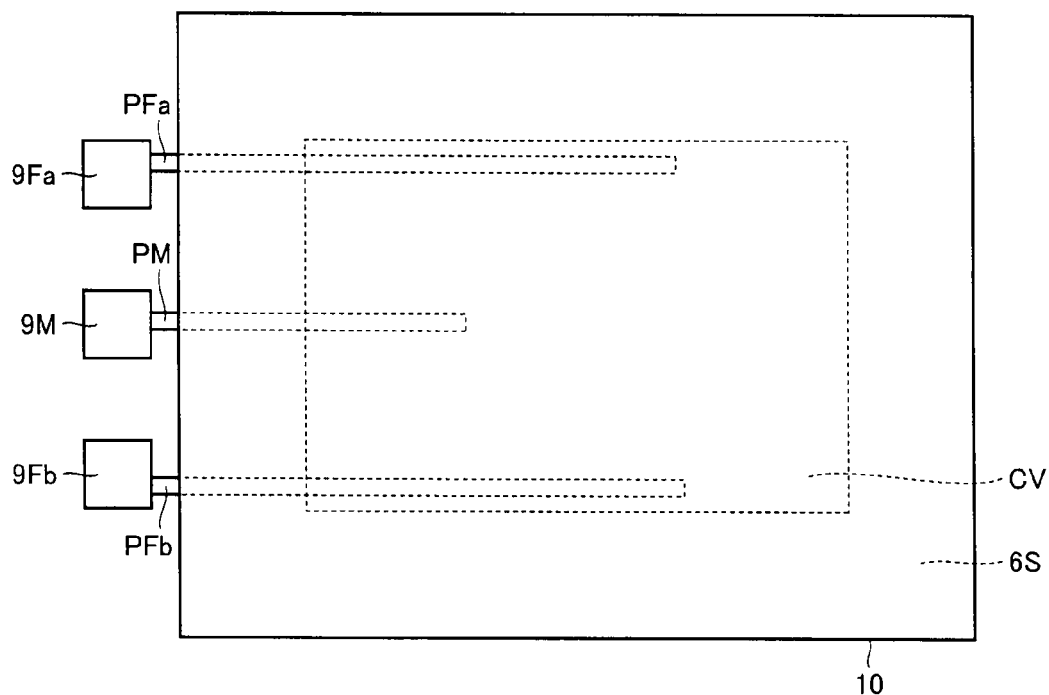
FIG. 1 is a plan schematically showing a structure of an acceleration sensor that is a semiconductor device of a first embodiment of the invention, but does not show a substrate as well as an interlayer insulating film and a nitride film arranged on the substrate.
Figure 2:
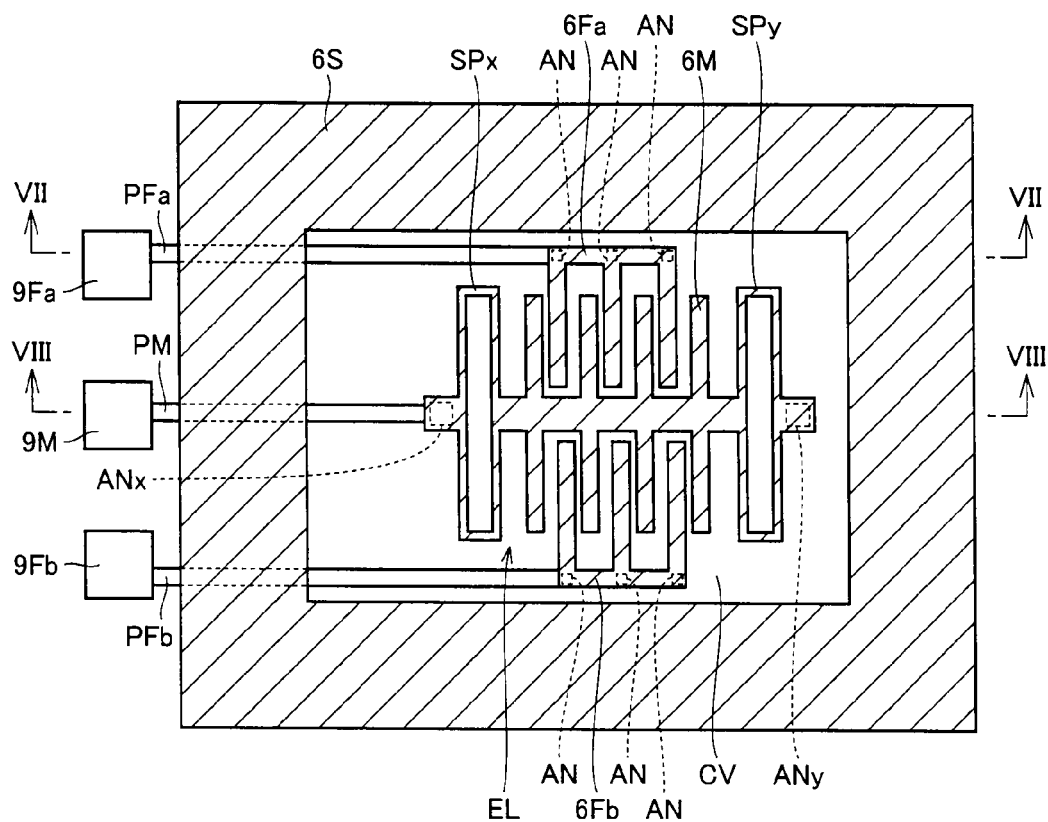
FIG. 2 is a plan not showing a cap in FIG. 1 as well as the interlayer insulating film and the nitride film formed on the substrate.
Figure 3:
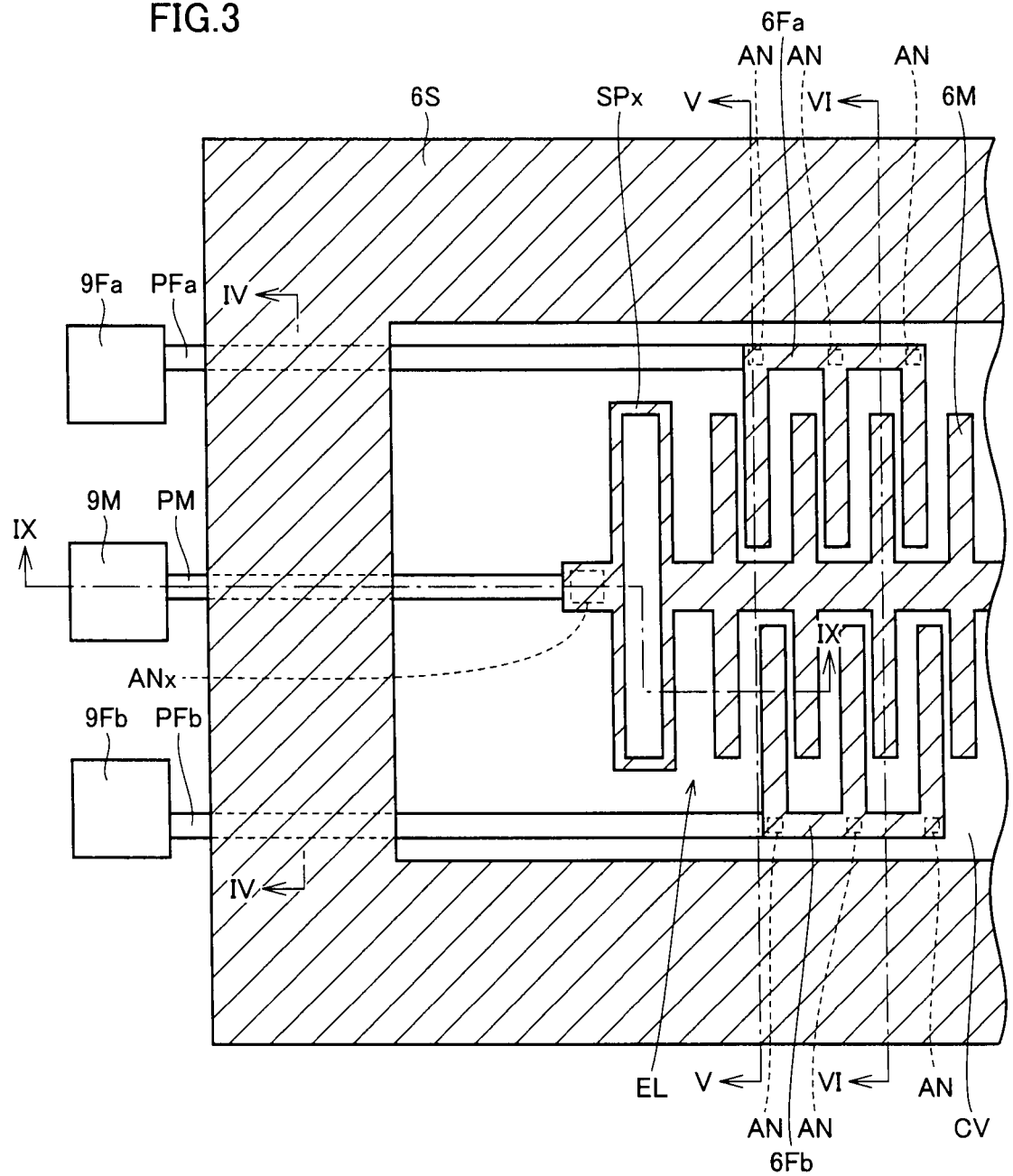
FIG. 3 is a fragmentary view showing on an enlarged scale a structure in FIG. 2, but does not show the substrate as well as the interlayer insulating film and the nitride film formed on the substrate.
Figure 9:
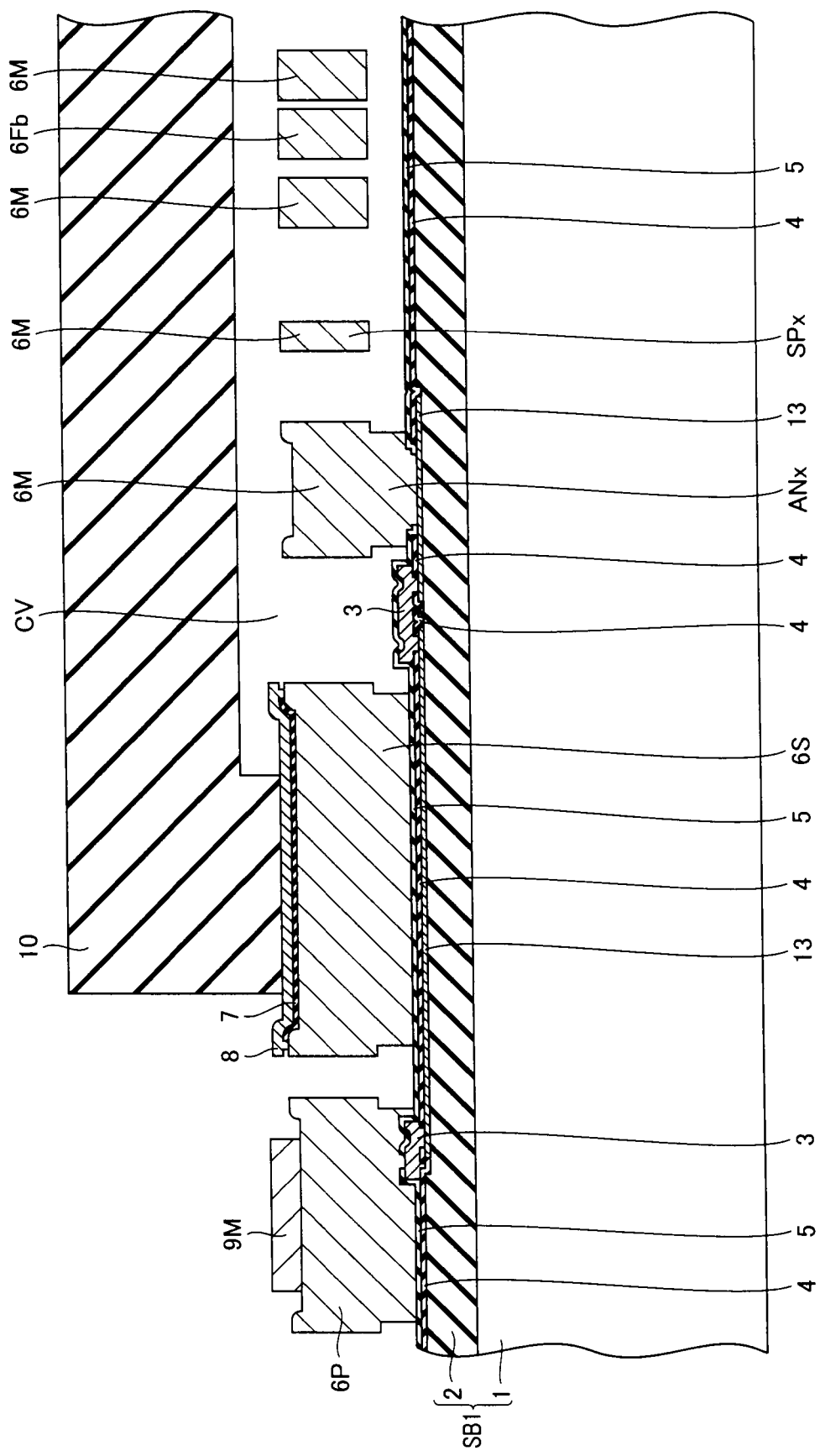
FIG. 9 is a schematic and fragmentary cross section taken along line IX-IX of FIG. 3.

Referring primarily to FIG. 9, an acceleration sensor that is a semiconductor device of the first embodiment primarily has a substrate SB1, a doped polycrystalline silicon layer 13 (first interconnection), a doped polycrystalline silicon layer 3 (second interconnection), an acceleration sensing unit EL (element) in FIG. 2, a sealing unit 6S (member) and a cap 10.

Substrate SB1 has a silicon substrate 1 having a main surface, and an oxide film 2 formed on the main surface. Oxide film 2 has a groove formed on the side opposite to silicon substrate 1. Thus, substrate SB1 has the groove.

Doped polycrystalline silicon layer 13 extends along this groove and is located on the bottom surface thereof Doped polycrystalline silicon layer 13 is made of Doped Polycrystalline Silicon (DOPS). Impurities used for the doping are, e.g., phosphorus. Doped polycrystalline silicon layer 13 has a first thickness that is equal to a depth of the groove and preferably is lower than or equal to 100 nm.

Doped polycrystalline silicon layer 3 is made of doped polycrystalline silicon arranged on substrate SB1, and has a second thickness that is larger than the first thickness and is preferably equal to about 400 nm. Doped polycrystalline silicon layer 3 has portions in contact with doped polycrystalline silicon layer 13. Therefore, doped polycrystalline silicon layers 3 and 13 are electrically connected together. Doped polycrystalline silicon layers 3 and 13 form three systems of interconnections PFa, PFb and PM (FIGS. 2 and 11) connecting the inside and the outside of a cavity CV together. Preferably, a size WM (FIG. 12) of a space between the side surface of the groove and the side surface of doped polycrystalline silicon layer 13 is substantially equal to a sum of a size of the first thickness and an overlapping or registration accuracy of an exposing device used for a photoengraving process in a process of manufacturing the acceleration sensor. For example, when doped polycrystalline silicon layer 13 is 100 nm in thickness, and the size of registration accuracy is 200 nm, space size WM is preferably about 300 nm.

Acceleration sensing unit EL (FIG. 2) is an element arranged on substrate SB1 for sensing an acceleration, and is made of doped polycrystalline silicon. Acceleration sensing unit EL is electrically connected to doped polycrystalline silicon layer 3 via doped polycrystalline silicon layer 13.

Sealing unit 6S has a portion opposed to substrate SB1 with doped polycrystalline silicon layer 13 therebetween, and surrounds doped polycrystalline silicon layer 3 and acceleration sensing unit EL (FIG. 2) on substrate SB1. A thickness of sealing unit 6S is larger than that of each doped polycrystalline silicon layer 13 or 3, and is, e.g., equal to 4 μm. Sealing unit 6S is made of the same material as acceleration sensing unit EL, and thus is made of doped polycrystalline silicon.

Cap 10 is arranged on sealing unit 6S to form cavity CV on a region of substrate SB1 surrounded by sealing unit 6S. The irregularities at the interface between cap 10 and sealing unit 6S preferably have sizes of several tens of nanometers or lower. When anode joining is performed for joining cap 10 and sealing unit 6S together, cap 10 is preferably made of glass. When plasma joining or cold joining is performed instead of the anode joining, a silicon substrate may be used instead of cap 10.

The acceleration sensor of this embodiment further includes electrode pads 9Fa, 9Fb and 9M, pad bases 6P individually formed between substrate SB1 and respective electrode pads 9Fa, 9Fb and 9M, an interlayer insulating film 4, a nitride film 5, an oxide film 7 and a polycrystalline silicon film 8.

Each of electrode pads 9Fa, 9Fb and 9M is made of aluminum, and is located outside cavity CV and particularly on individual pad bases 6P formed on substrate SB1, respectively. Thus, pad base 6P is made of the doped polycrystalline silicon. Electrode pads 9Fa, 9Fb and 9M are electrically connected through individual pad bases 6P to interconnections PFa, PFb and PM, respectively. Pad bases 6P may be eliminated, and electrode pads 9Fa, 9Fb and 9M may be in direct contact with interconnections PFa, PFb and PM, respectively.

Interlayer insulating film 4 insulates doped polycrystalline silicon layers 3 and 13 in a part of a portion where these are stacked together. Interlayer insulating film 4 has an opening through which doped polycrystalline silicon layers 3 and 13 are in contact with each other. Interlayer insulating film 4 isolates doped polycrystalline silicon layer 3 from oxide film 2 in a region on substrate SB1 where doped polycrystalline silicon layer 13 is not formed.

Nitride film 5 covers substrate SB1, doped polycrystalline silicon layer 13, interlayer insulating film 4 and doped polycrystalline silicon layer 3. Nitride film 5 has an opening, in which each of pad bases 6P and acceleration sensing unit EL are connected to corresponding one of interconnections PFa, PFb and PM (FIG. 2). Polycrystalline silicon film 8 covers a surface on the cap 10 side of sealing unit 6S. Oxide film 7 is located between portions of sealing unit 6S and polycrystalline silicon film 8. When the anode joining is not used, it is preferable to eliminate oxide film 7 and polycrystalline silicon film 8.

Description will now be given on a structure of acceleration sensor EL and a principle on which acceleration sensing unit EL senses the acceleration.

Figure 10:
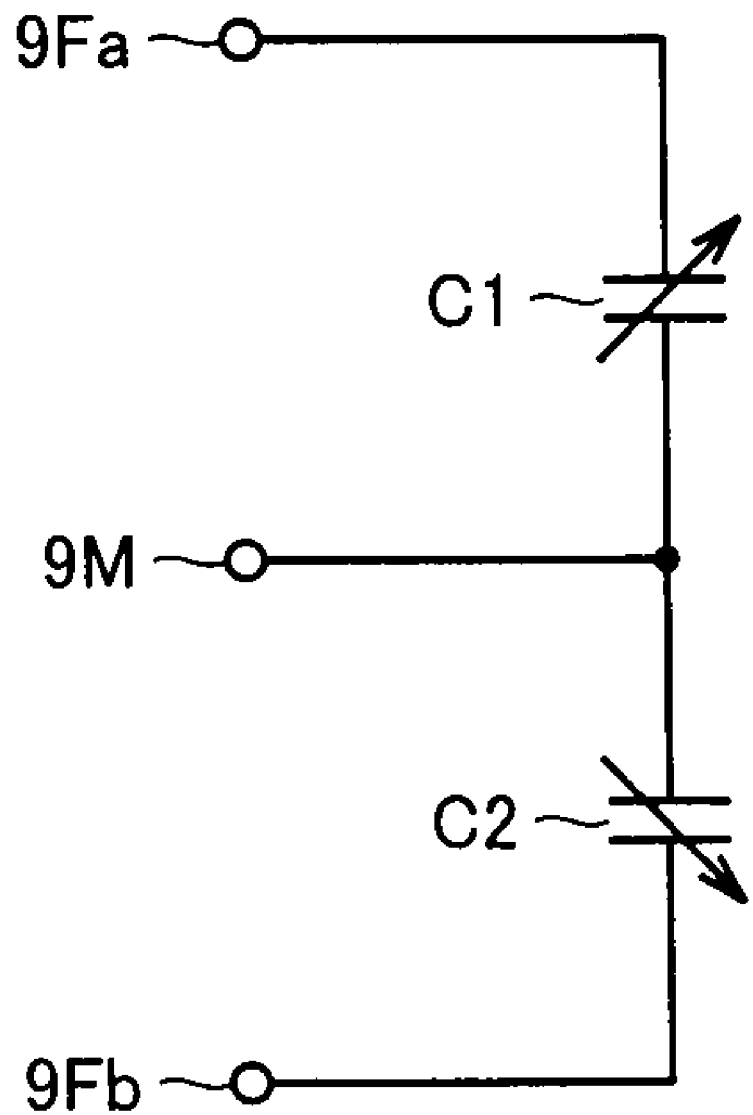
FIG. 10 is a circuit diagram schematically showing a structure of the acceleration sensor that is the semiconductor device in the first embodiment of the invention.

Referring primarily to FIG. 2, acceleration sensing unit EL has fixed electrodes 6Fa and 6Fb as well as a movable electrode 6M. Each of fixed and movable electrodes 6Fa, 6Fb and 6M has a comb electrode. Each of comb electrodes of fixed electrodes 6Fa and 6Fb is opposed to the comb electrode of movable electrode 6M in one direction (i.e., a lateral direction in FIG. 2) with a space therebetween so that a capacitor C1 or C2 (FIG. 10) is formed.

Movable electrode 6M has spring units SPx and SPy. Each of spring units SPx and SPy is elastically extensible and compressible in the one direction (i.e., the lateral direction in FIG. 2) on substrate SB1. One end of each of spring units SPx and SPy is a fixed end that is fixed to substrate SB1 by an anchor ANx or ANy. The other ends, i.e., free ends of spring units SPx and SPy are fixed to one and the other ends of movable electrode 6M, respectively. Thereby, movable electrode 6M is carried for displacement in one direction with respect to substrate SB1. The displacement occurs according to an acceleration exerted in the one direction on movable electrode 6M. Therefore, the acceleration in the one direction can be sensed or detected by calculating this displacement based on the electrostatic capacitances of capacitors C1 and C2.

A structure of a modification of this embodiment will be described below.

Figure 11:
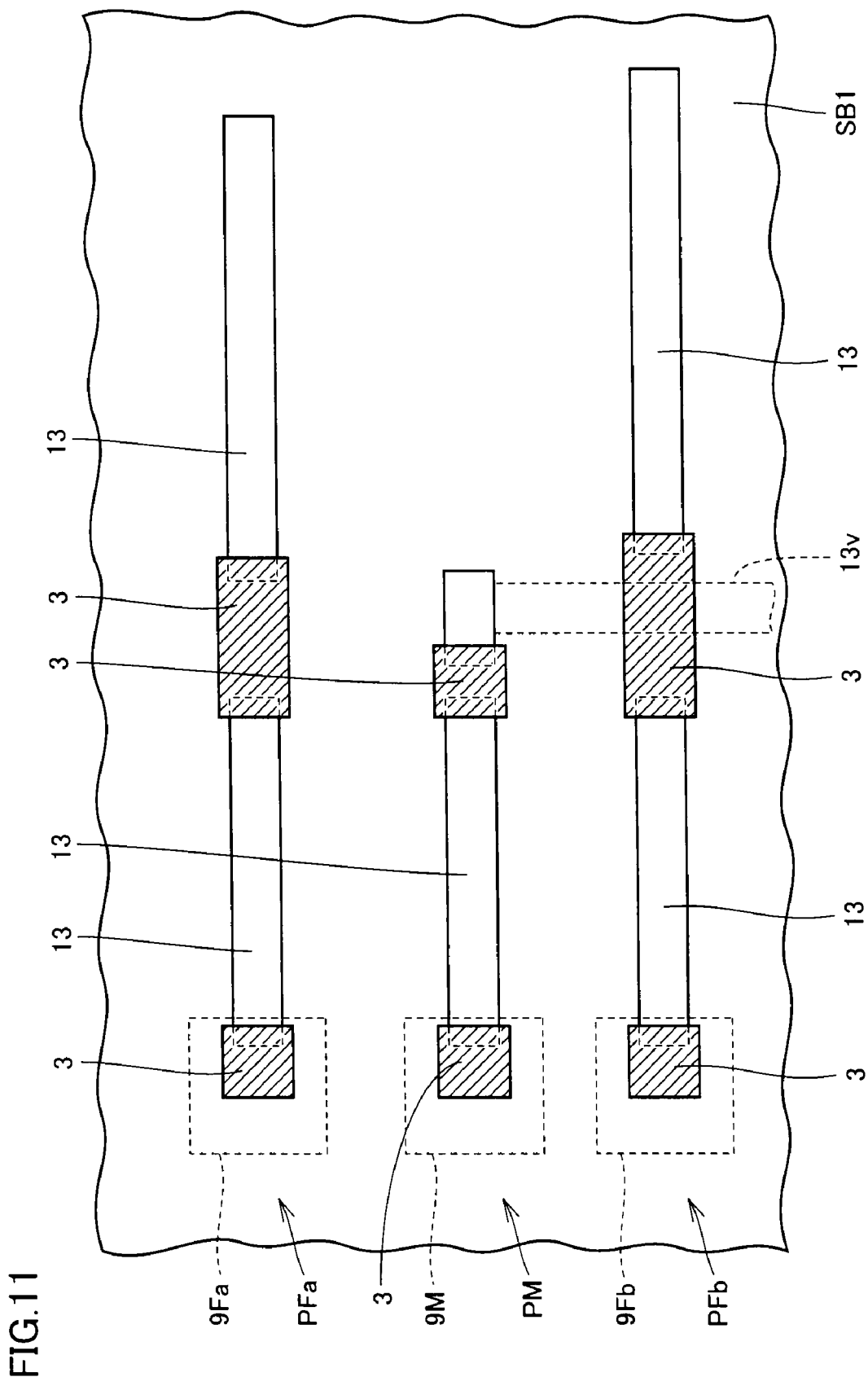
FIG. 11 is a fragmentary plan schematically showing a state of formation of interconnections of the acceleration sensor that is the semiconductor device in the first embodiment of the invention and, for the sake of simplicity, shows only the substrate and the interconnections thereon with certain parts of the interconnections hatched.

Referring to FIG. 11, the acceleration sensor of the foregoing embodiment has one acceleration sensing unit EL, but an acceleration sensor of the modification has a plurality of acceleration sensing units EL (not shown). Movable electrodes 6M of respective acceleration sensing units EL are electrically connected to a common electrode pad 9M. For this connection, interconnection PM may have a plurality of divided portions connected to respective acceleration sensing units EL. For this connection, doped polycrystalline silicon layer 13 has divided portions that form doped polycrystalline silicon layers 13v, respectively.

Doped polycrystalline silicon layer 13v crosses doped polycrystalline silicon layer 3 of interconnection PFb on substrate SB1. In this crossing portion, interlayer insulating film 4 isolates doped polycrystalline silicon layer 13v from doped polycrystalline silicon layer 3 of interconnection PFb. Doped polycrystalline silicon layers 13v and 13 can be formed collectively by patterning one doped polycrystalline silicon layer.

Description will now be given on the method of manufacturing the acceleration sensor that is the semiconductor device of the embodiment.

Figure 13:
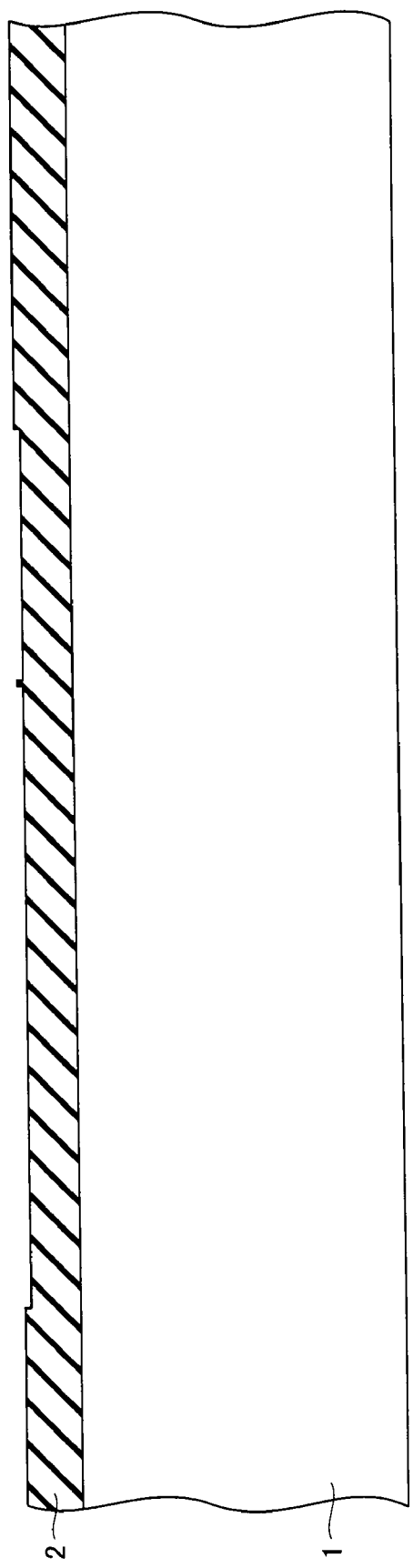
FIGS. 13 to 24 are schematic and fragmentary cross sections showing first to twelfth steps of a method of manufacturing the acceleration sensor that is the semiconductor device in the first embodiment of the invention, respectively, and particularly show sections in the position corresponding to that in FIG. 9.

Referring primarily to FIG. 13, oxide film 2 is formed on silicon substrate 1. For reducing a parasitic capacitance related to silicon substrate 1, oxide film 2 has usually a thickness of 1 μm or more. Oxide film 2 is provided at its surface with a groove of a depth equal to a thickness (first thickness) of doped polycrystalline silicon layer 13 (FIG. 9). The groove has the depth, e.g., of 100 nm.

Figure 14:
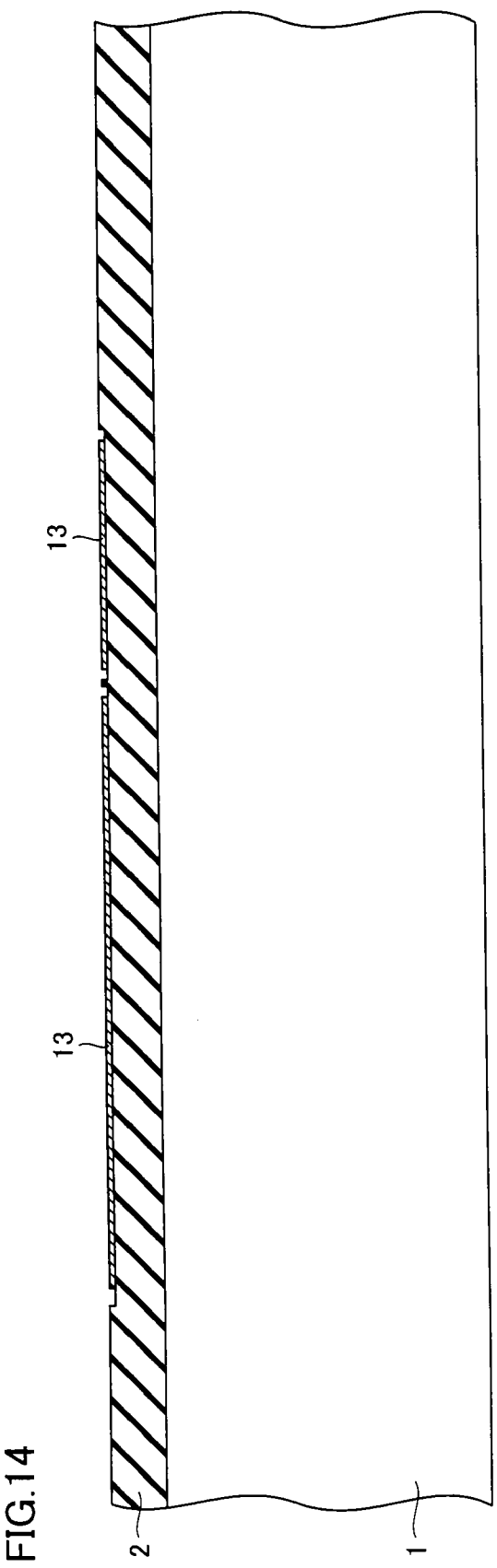

Referring to FIG. 14, a doped polycrystalline silicon layer is formed, and is patterned by a photoengraving method to form doped polycrystalline silicon layer 13.

Figure 15:
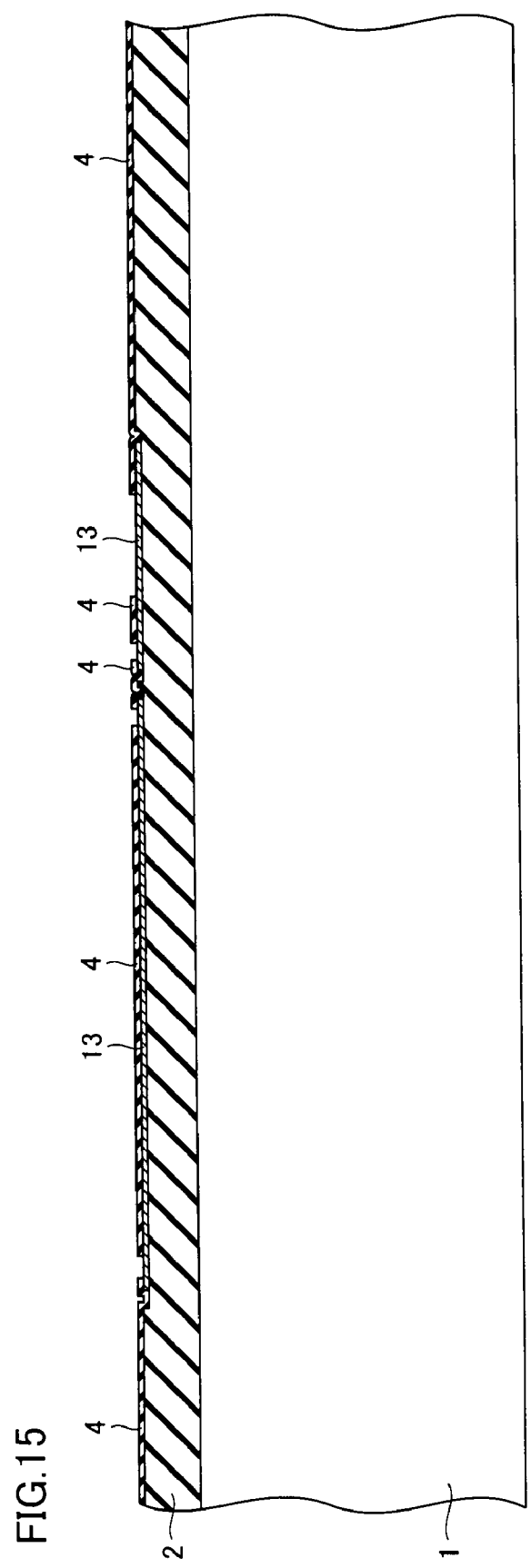

Referring to FIG. 15, an insulating film such as an oxide film is formed, and is patterned by the photoengraving method to form interlayer insulating film 4.

Figure 16:
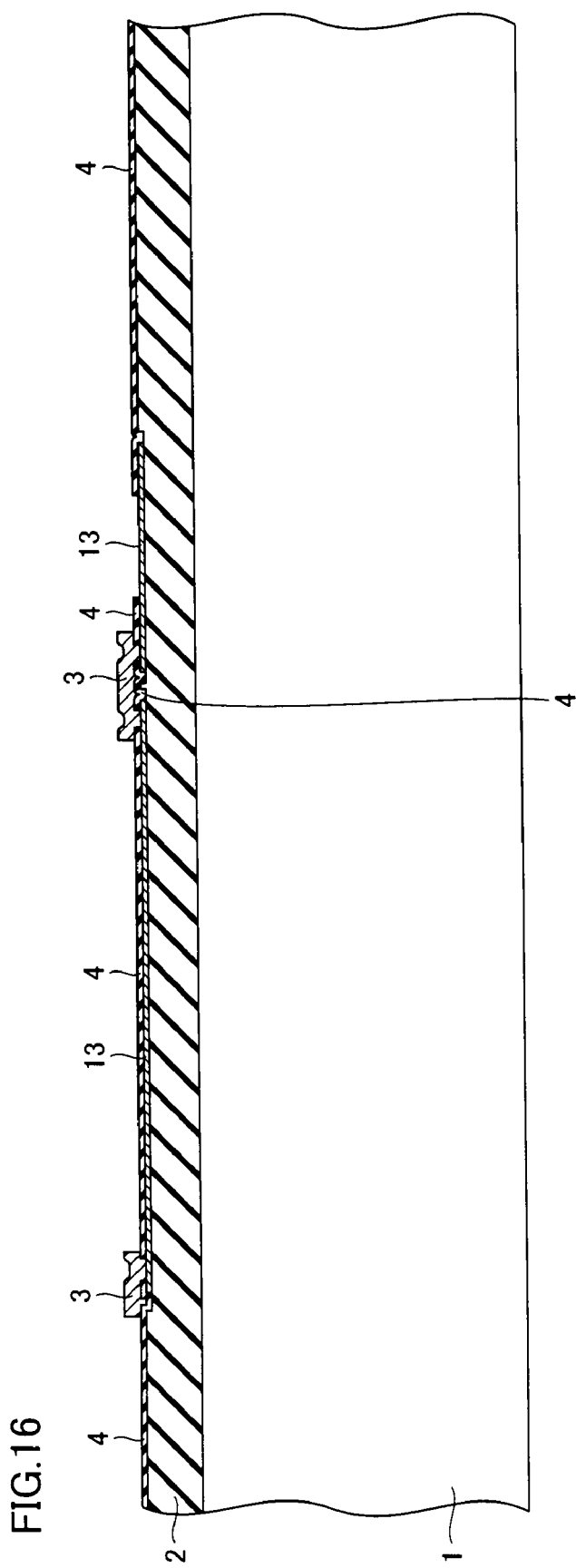

Referring to FIG. 16, a doped polycrystalline silicon layer is formed, and is patterned by the photoengraving method to form doped polycrystalline silicon layer 3. The doped polycrystalline silicon layer thus formed has a thickness, e.g., of 400 nm.

Figure 17:
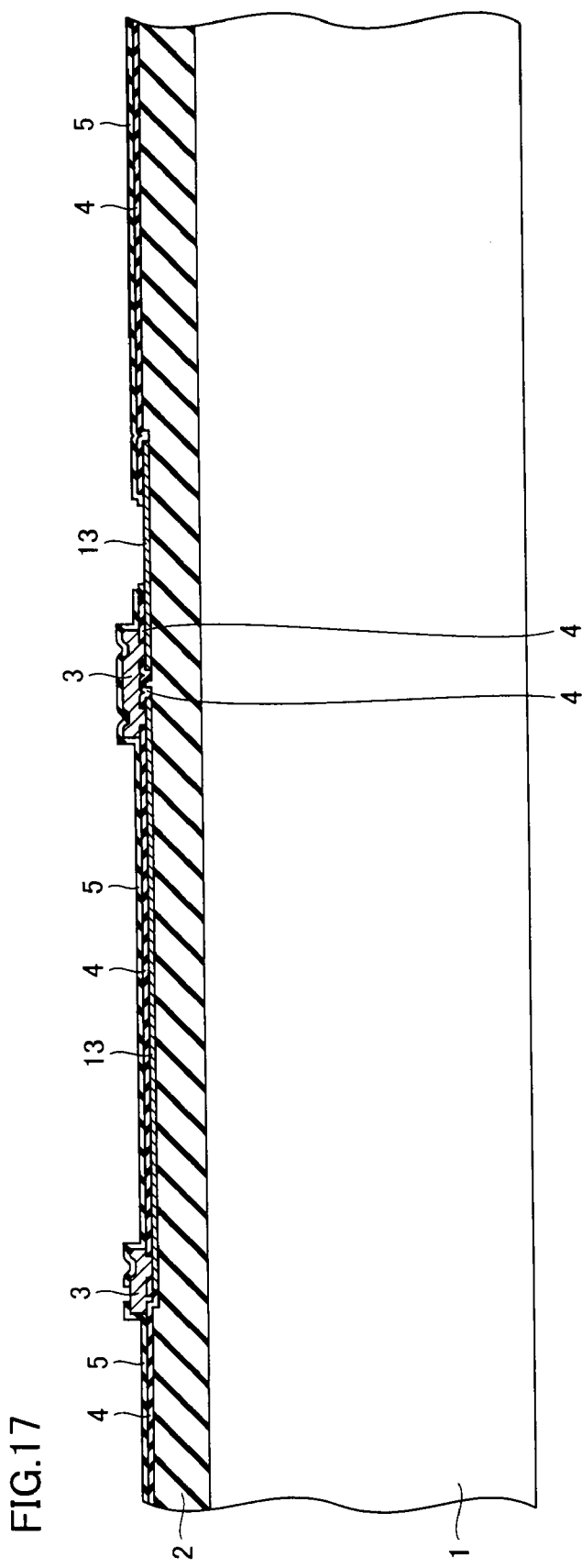

Referring to FIG. 17, a nitride file is formed, and is patterned by the photoengraving method to form nitride film 5.

Figure 18:
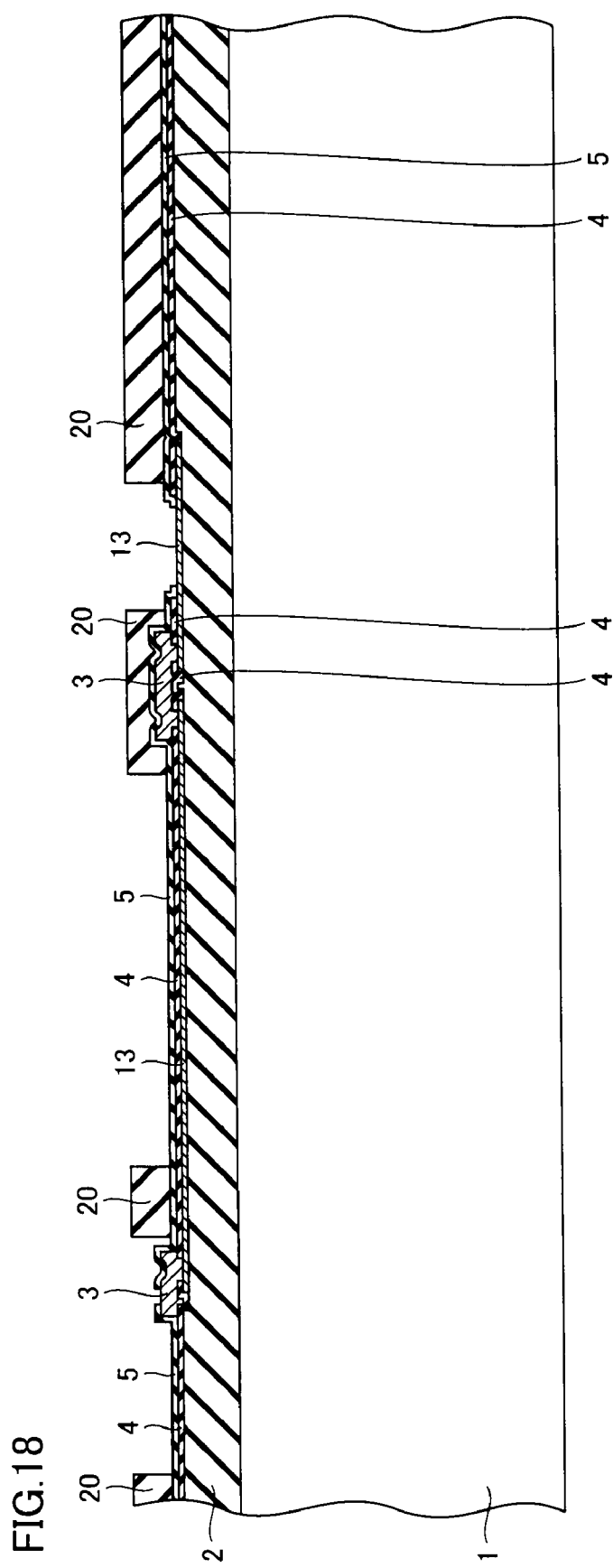

Referring primarily to FIG. 18, a layer made, e.g., of PSG (PhosphoSilicate Glass) is formed, and is patterned by the photoengraving method to form a sacrifice layer 20. Sacrifice layer 20 is formed in a region where acceleration sensing unit EL (FIG. 9) is floated on substrate SB1.

Figure 19:
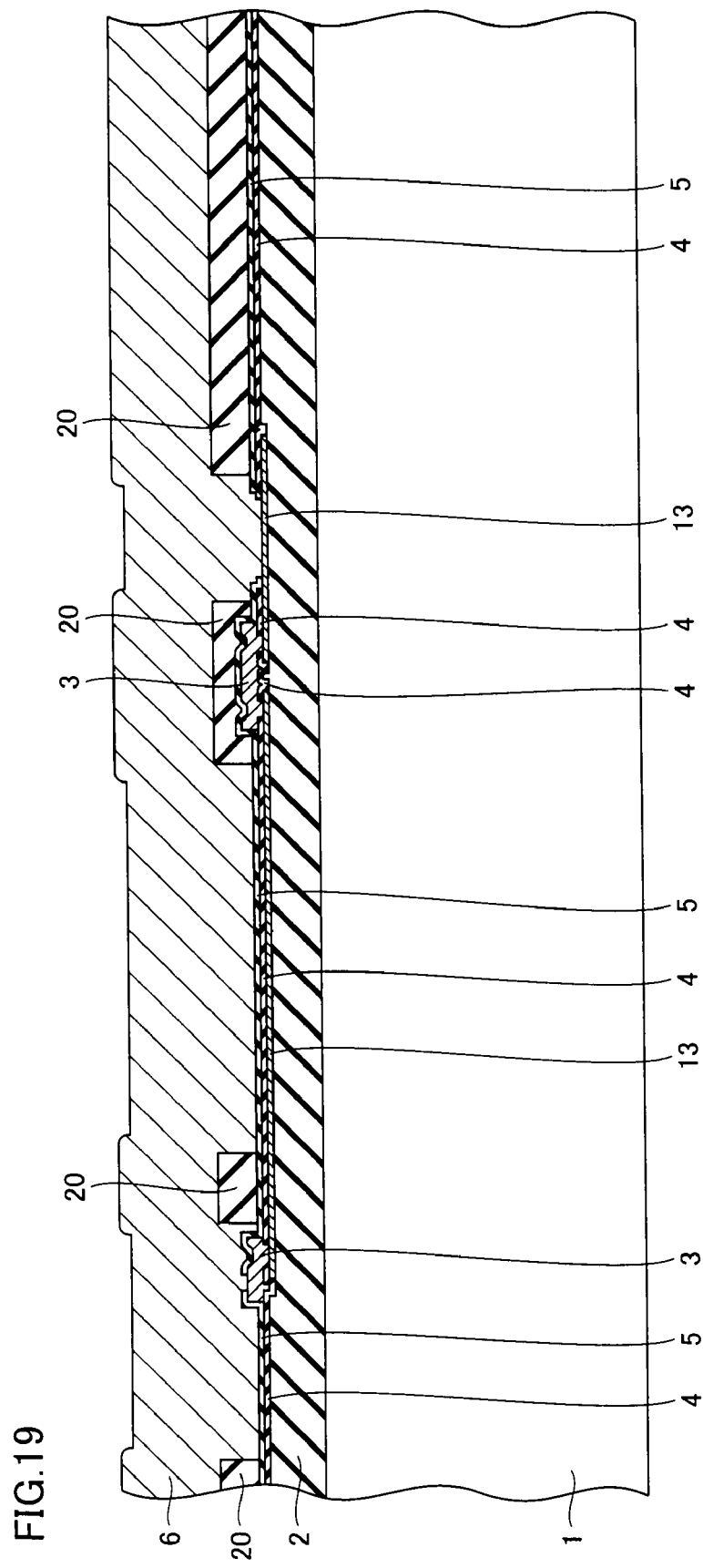

Referring to FIG. 19, a doped polycrystalline silicon layer 6 is formed. Doped polycrystalline silicon layer 6 has a thickness, e.g., of 4 μm.

Figure 20:
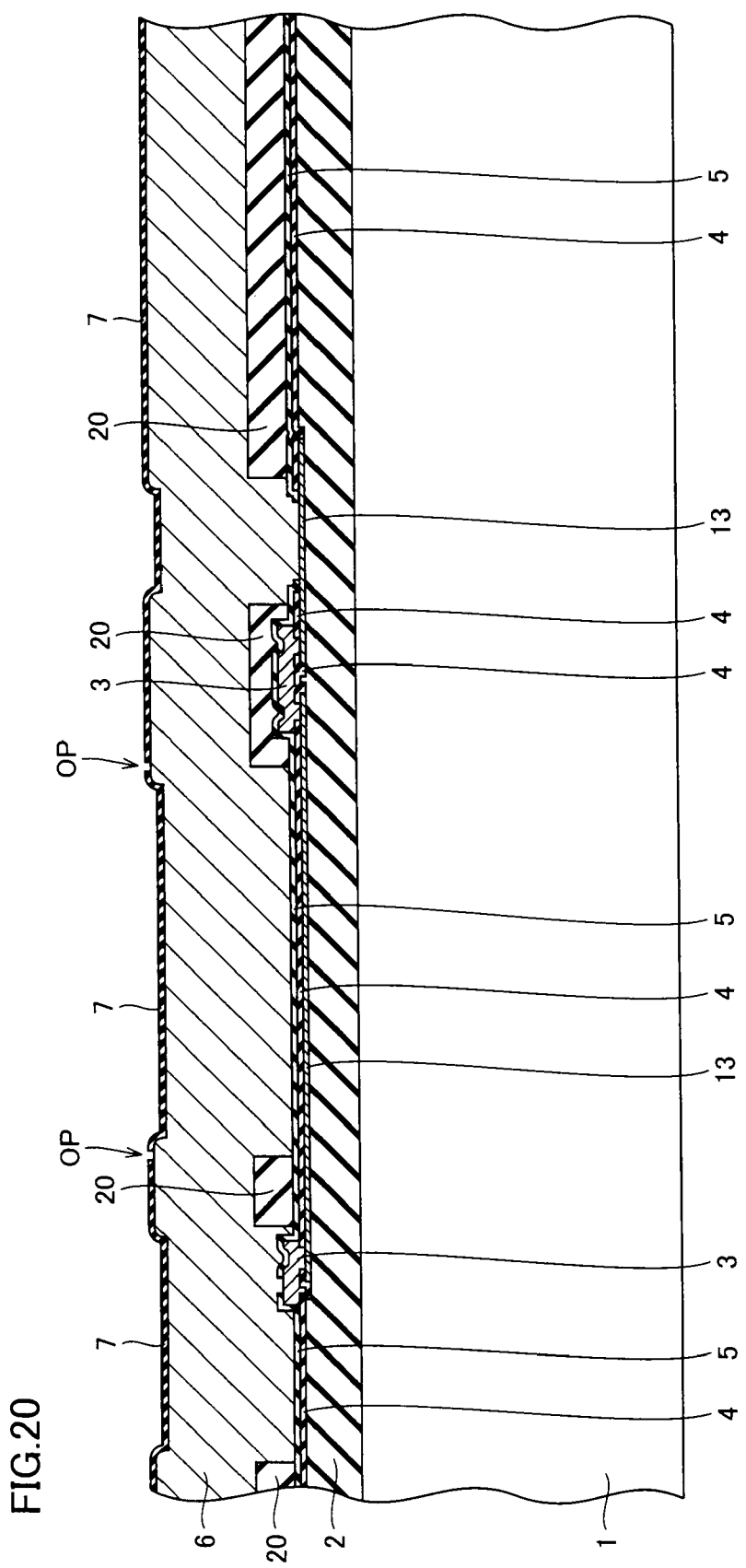

Referring to FIG. 20, an oxide film is formed on doped polycrystalline silicon layer 6, and is patterned by the photoengraving method to form oxide film 7. This patterning forms an opening OP in oxide film 7.

Figure 21:
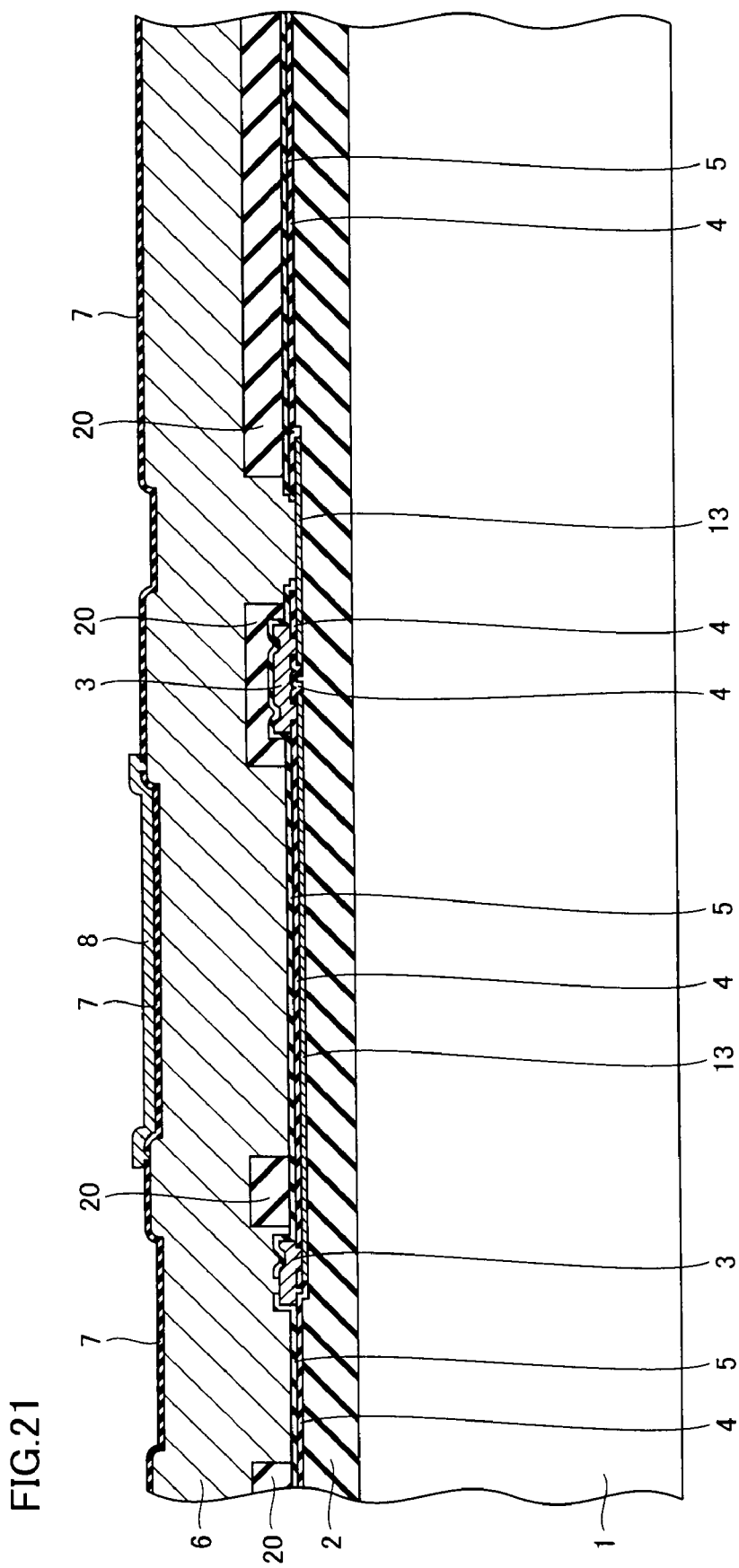

Referring to FIG. 21, a polycrystalline silicon film is formed, and is patterned by the photoengraving method to form polycrystalline silicon film 8.

Figure 22:
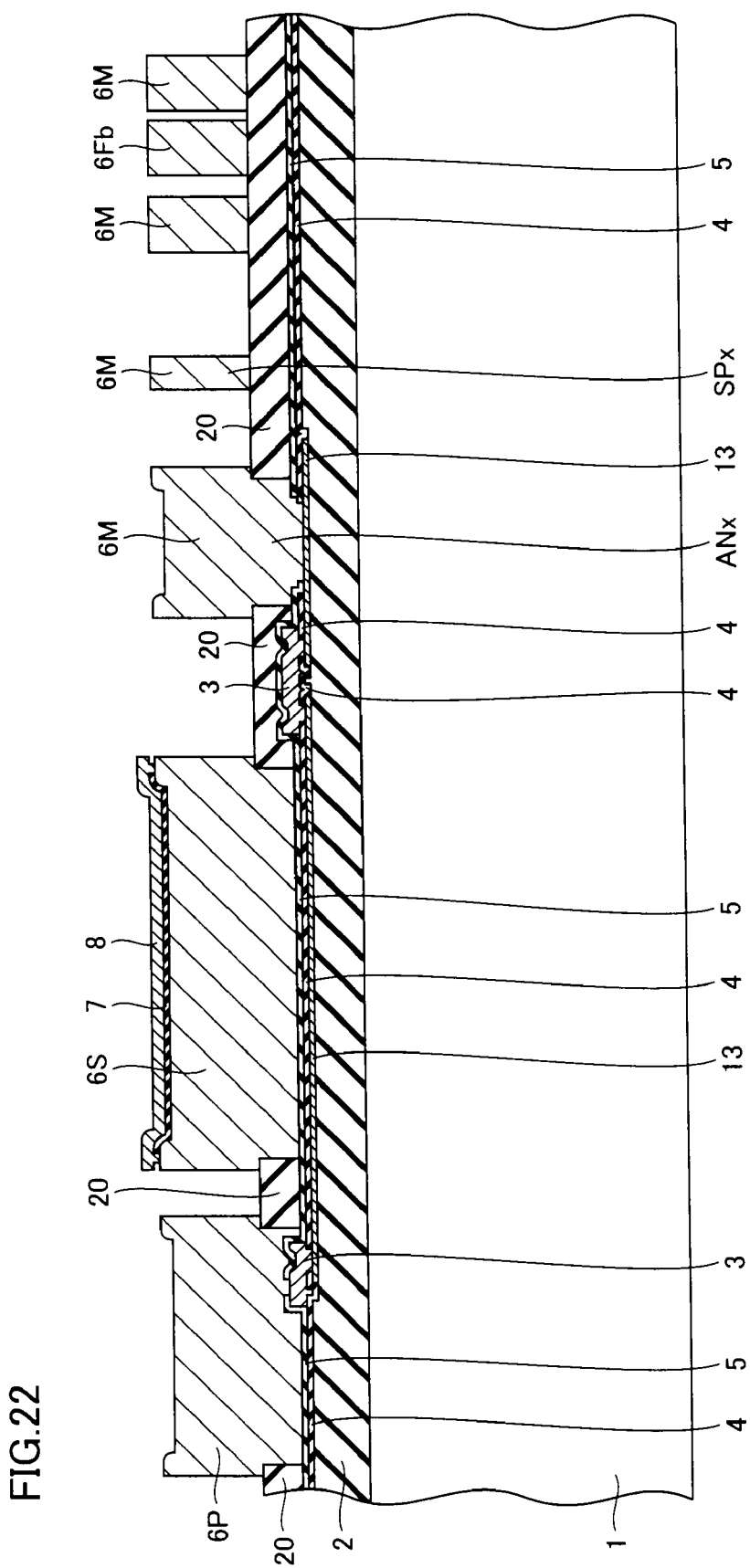

Referring primarily to FIG. 22, doped polycrystalline silicon layer 6, oxide film 7 and polycrystalline silicon film 8 are patterned to form pad base 6P, sealing unit 6S, movable electrode 6M and fixed electrodes 6Fb and 6Fa (FIG. 2).

Figure 23:
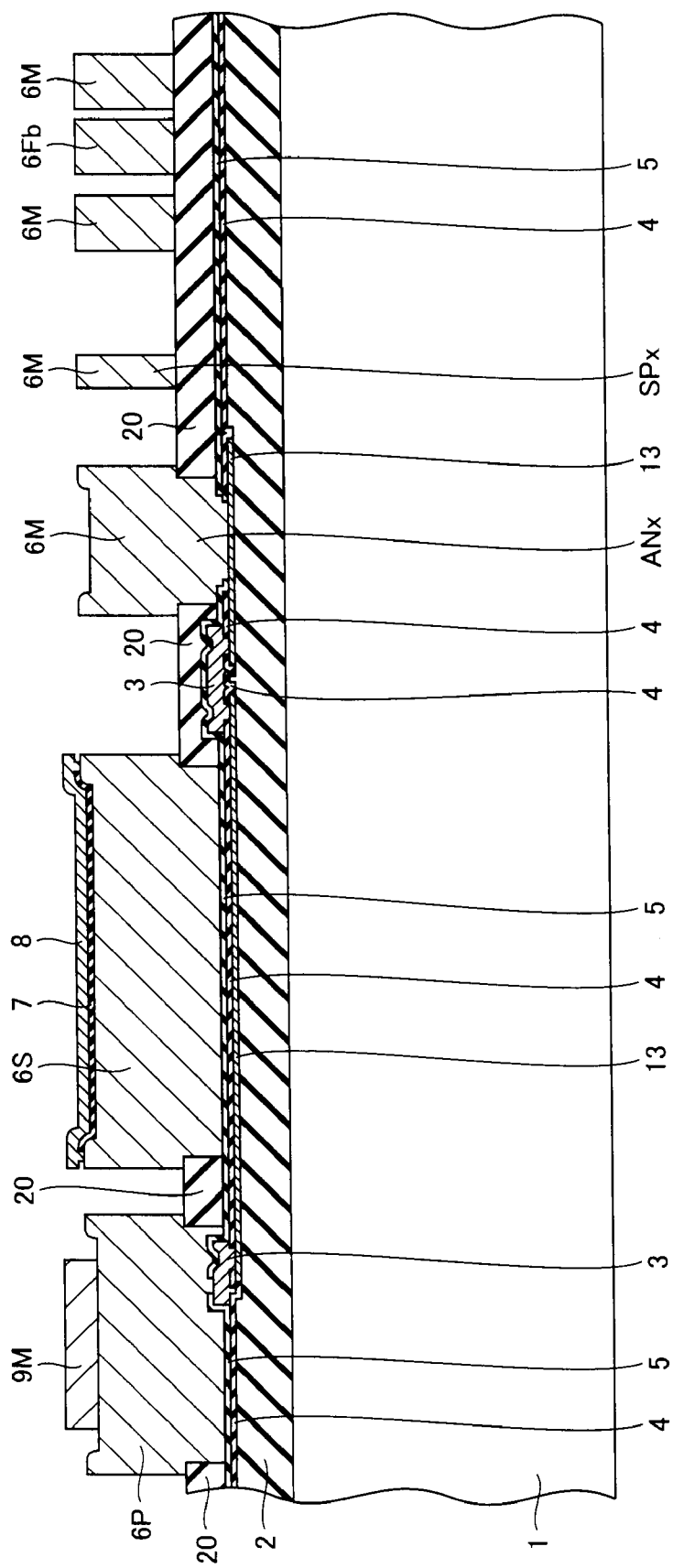

Referring to FIG. 23, electrode pad 9M is formed on pad base 6P.

Figure 24:
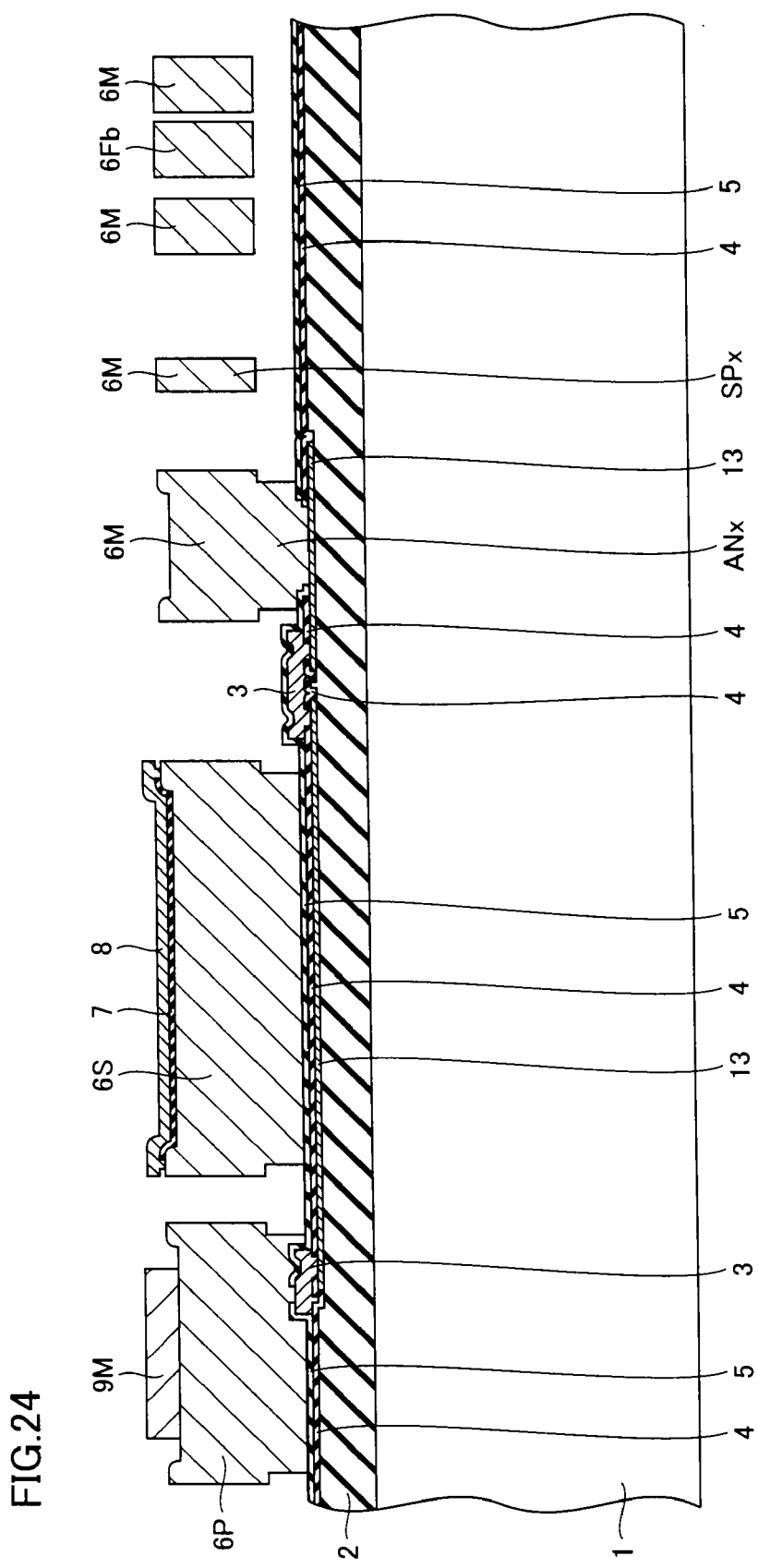

Referring to FIG. 24, a release step for removing sacrifice layer 20 is formed. During this, nitride film 5 protects interlayer insulating film 4.

Referring to FIG. 9 again, cap 10 is joined to sealing unit 6S. For this, anode joining, plasma joining or cold joining may be performed. When the anode joining is performed, oxide film 7 prevents diffusion of impurities from sealing unit 6S into the joined portion, and thus can suppress lowering of the joining strength that may be caused by the impurities.

The process described above provides the acceleration sensor of the embodiment. The description has been given on the state in which the one acceleration sensor is manufactured. In the mass-production process, it is preferable that a wafer level step is performed to form the plurality of acceleration sensors on the single substrate, and then the respective acceleration sensors are separated from each other.

According to the embodiment, doped polycrystalline silicon layer 3 having the second thickness larger than the first thickness is formed as each of interconnections PFa, PFb and PM. Therefore, the electric resistance of the electric connection to acceleration sensing unit EL can be smaller than that in the structure having only doped polycrystalline silicon layer 13 of the first thickness. Further, doped polycrystalline silicon layer 13 having the first thickness smaller than the second thickness is arranged between sealing unit 6S and substrate SB1. Therefore, occurrence of the irregularities at the upper surface of sealing unit 6S can be suppressed as compared with the case where only second doped polycrystalline silicon layer 3 is formed as each of interconnections PFa, PFb and PM, and therefore sealing unit 6S and cap 10 can be closely joined together. Therefore, the airtightness of cavity CV can be ensured and also the electric resistance of each of interconnections PFa, PFb and PM can be reduced.

Since each of acceleration sensing unit EL and sealing unit 6S is made of the doped polycrystalline silicon layer, the electrical conductivity can be given to acceleration sensing unit EL, and acceleration sensing unit EL and sealing unit 6S can be collectively formed as can be seen from the steps in FIGS. 21 and 22.

Further, acceleration sensing unit EL has movable electrode 6M that is displaceable with respect to substrate SB1. Thereby, acceleration sensing unit EL having a movable portion can be formed in cavity CV.

The depth of the groove of substrate SB1 is equal to the thickness (first thickness) of doped polycrystalline silicon layer 13, and this structure can suppress formation of the irregularities at the surface on which sealing unit 6S is formed so that the upper surface (on the cap 10 side) of sealing unit 6S can have high smoothness. Thereby, the joining strength between sealing unit 6S and cap 10 can be increased.

Figure 12:
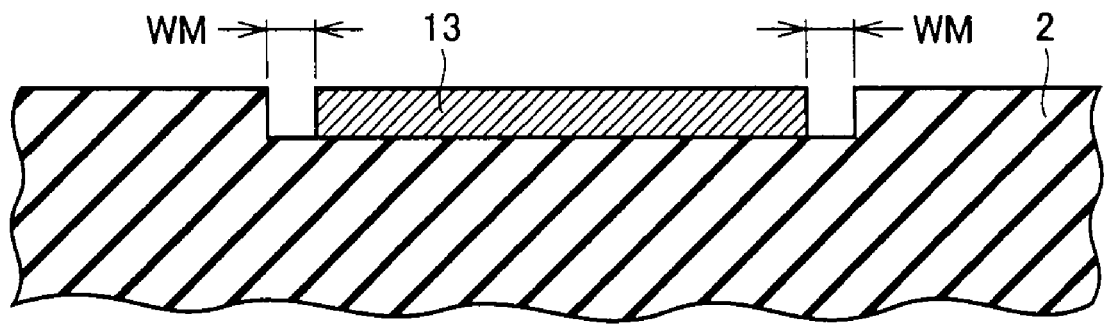
FIG. 12 is a schematic and fragmentary cross section showing a positional relationship between grooves at the substrate and the interconnections of the acceleration sensor that is the semiconductor device in the first embodiment of the invention.
Figure 25:
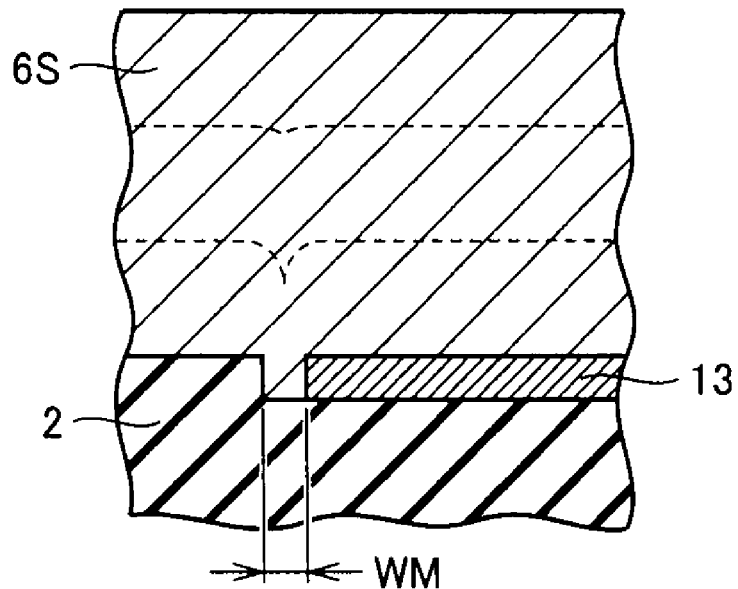
FIG. 25 is a schematic and fragmentary cross section showing a state of formation of a sealing unit of the acceleration sensor that is the semiconductor device in the first embodiment of the invention.
Figure 26:
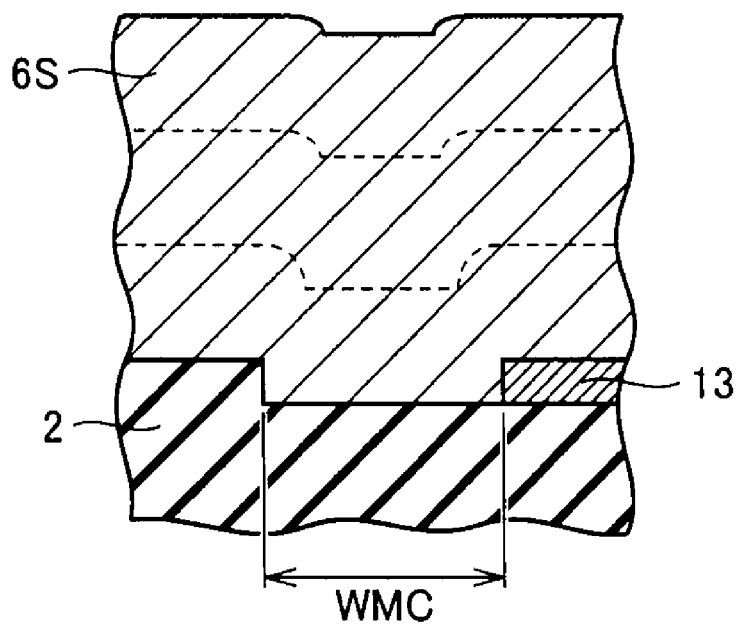
FIG. 26 is a schematic and fragmentary cross section showing a state of formation of a sealing unit of an acceleration sensor in an example for comparison.
Figure 27:
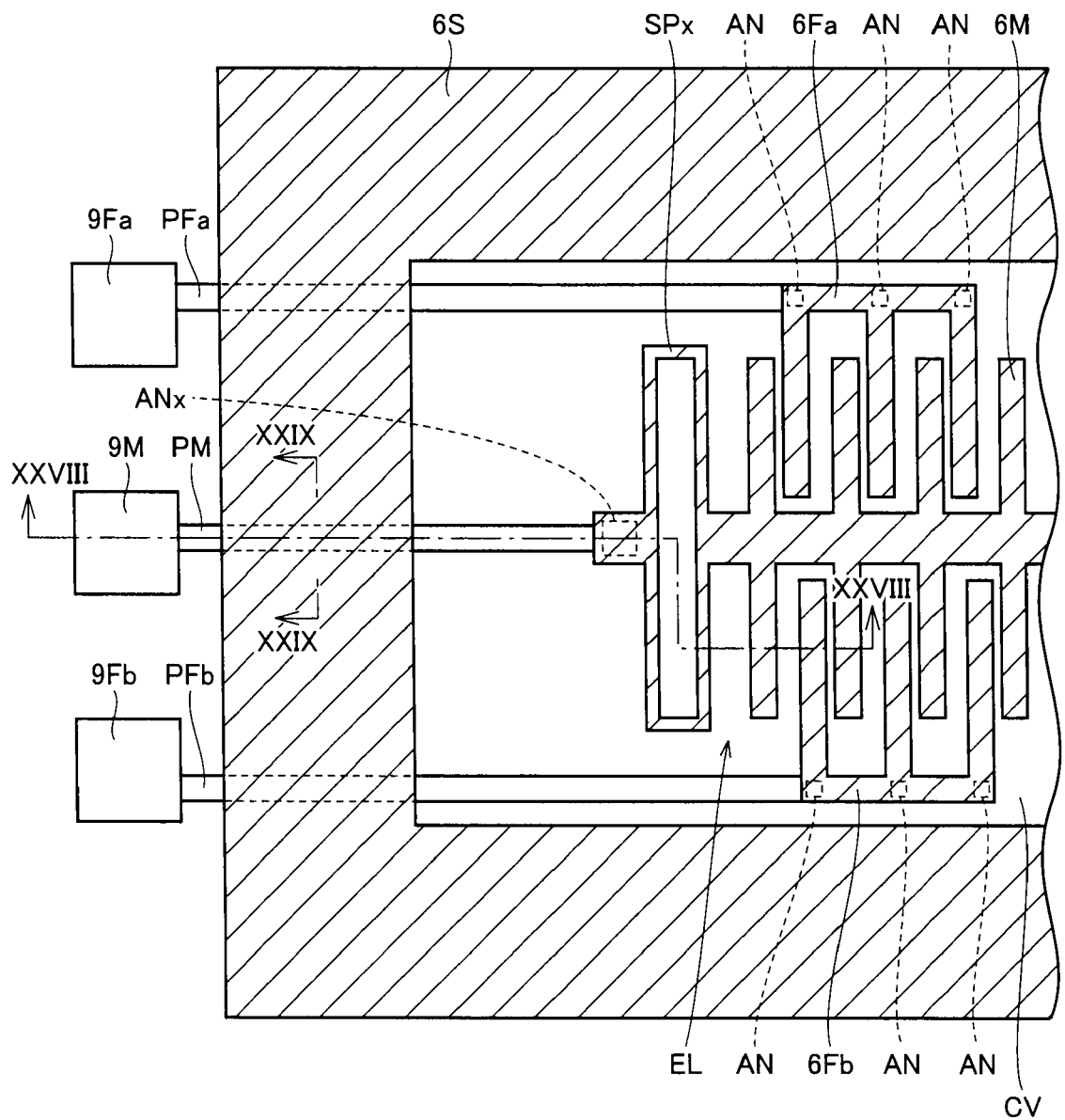
FIG. 27 is a fragmentary plan schematically showing a structure of an acceleration sensor that is a semiconductor device in a second embodiment of the invention, but does not show a cap and a substrate as well as an interlayer insulating film and a nitride film arranged on the substrate.

As shown in FIG. 12, the space between the side surface of the groove of oxide film 2 and the side surface of doped polycrystalline silicon layer 13 has size WM already described. Thereby, sealing unit 6S having substantially a smooth upper surface is formed through the growth step (represented by broken line in the figure) shown in FIG. 25. As shown in FIG. 26, if the space between the side surface of the groove of oxide film 2 and the side surface of doped polycrystalline silicon layer 13 had a size WMC larger than space size WM, a concave portion at the upper surface of sealing unit 6S would increase in size, and thus the joining strength between sealing unit 6S and cap 10 would decrease.

According to the modification of the embodiment, as shown in FIG. 11, it is possible to arranged interconnections that cross each other and are insulated from each other, such as interconnection PFb and interconnection PM having doped polycrystalline silicon layer 13v. Therefore, as compared with the case where interconnections must detour around each other for avoiding crossing thereof, it is possible to reduce the region required for forming the interconnections in the acceleration sensor, and the acceleration sensor can be reduced in size.

(Second Embodiment)

First, description will be given on a structure of an acceleration sensor that is a semiconductor device of a second embodiment.

Figure 4:
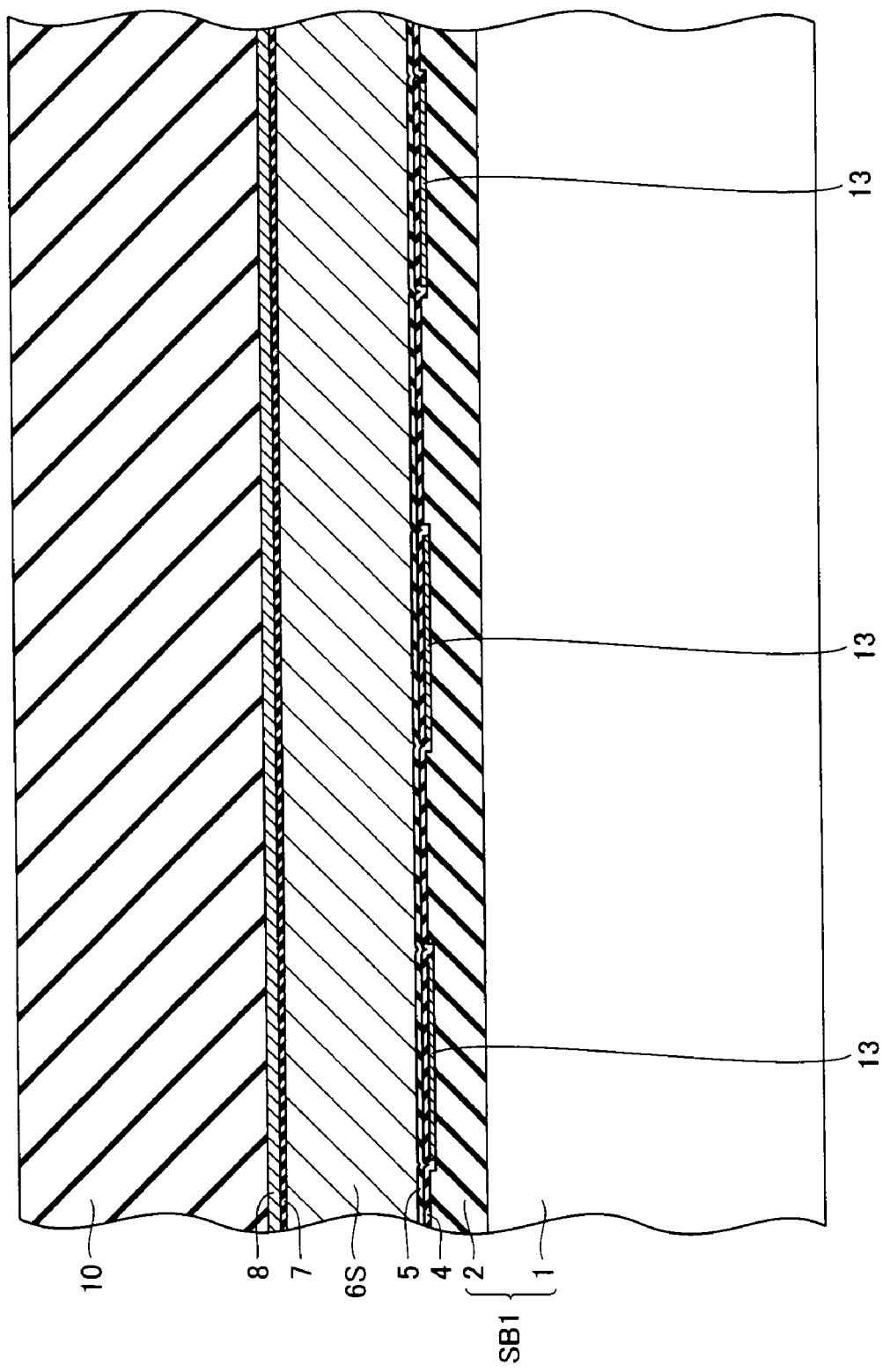
FIGS. 4 to 6 are schematic and fragmentary cross sections taken along lines IV-IV, V-V and VI-VI of FIG. 3, respectively.
Figure 5:
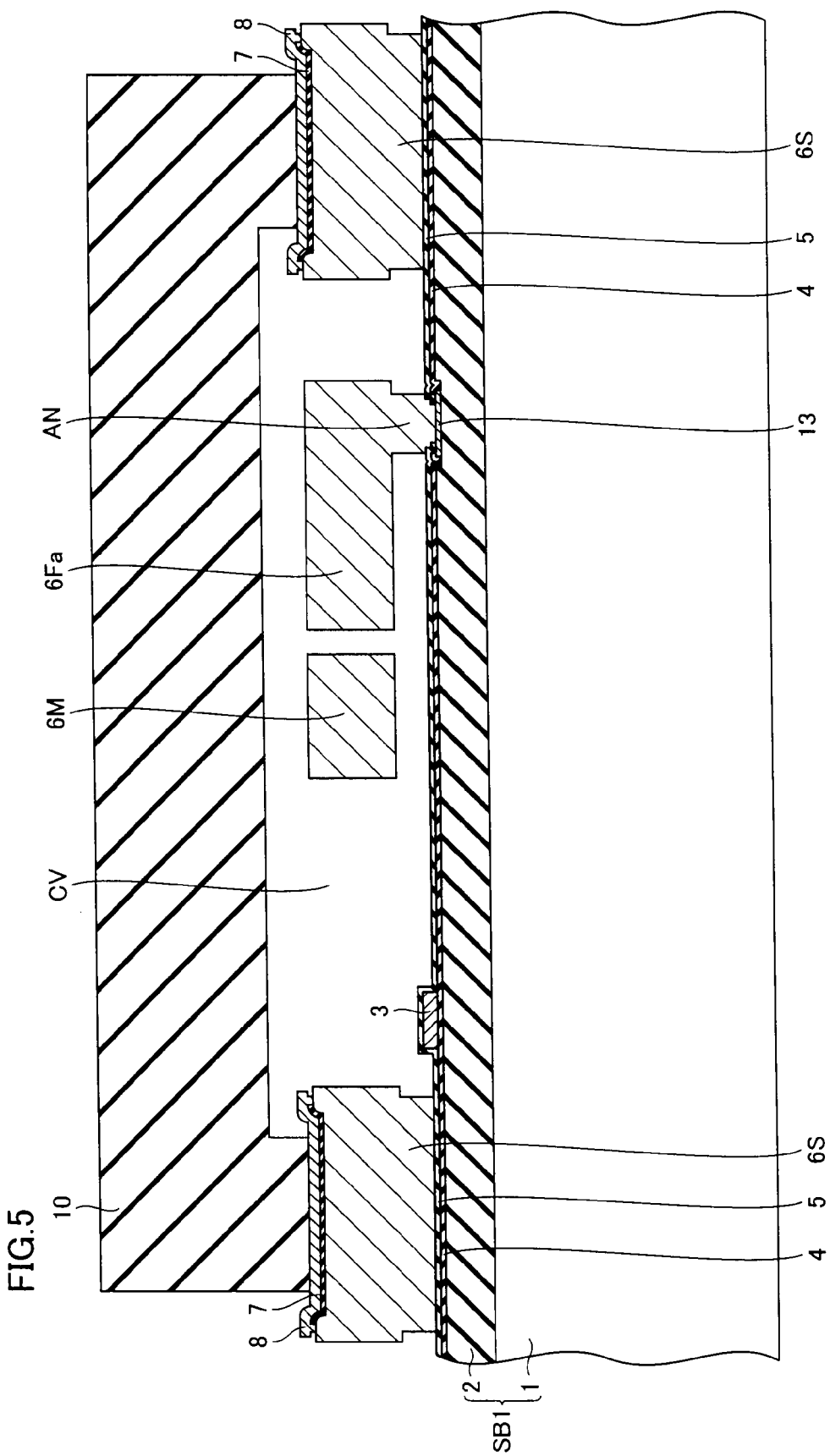
Figure 6:
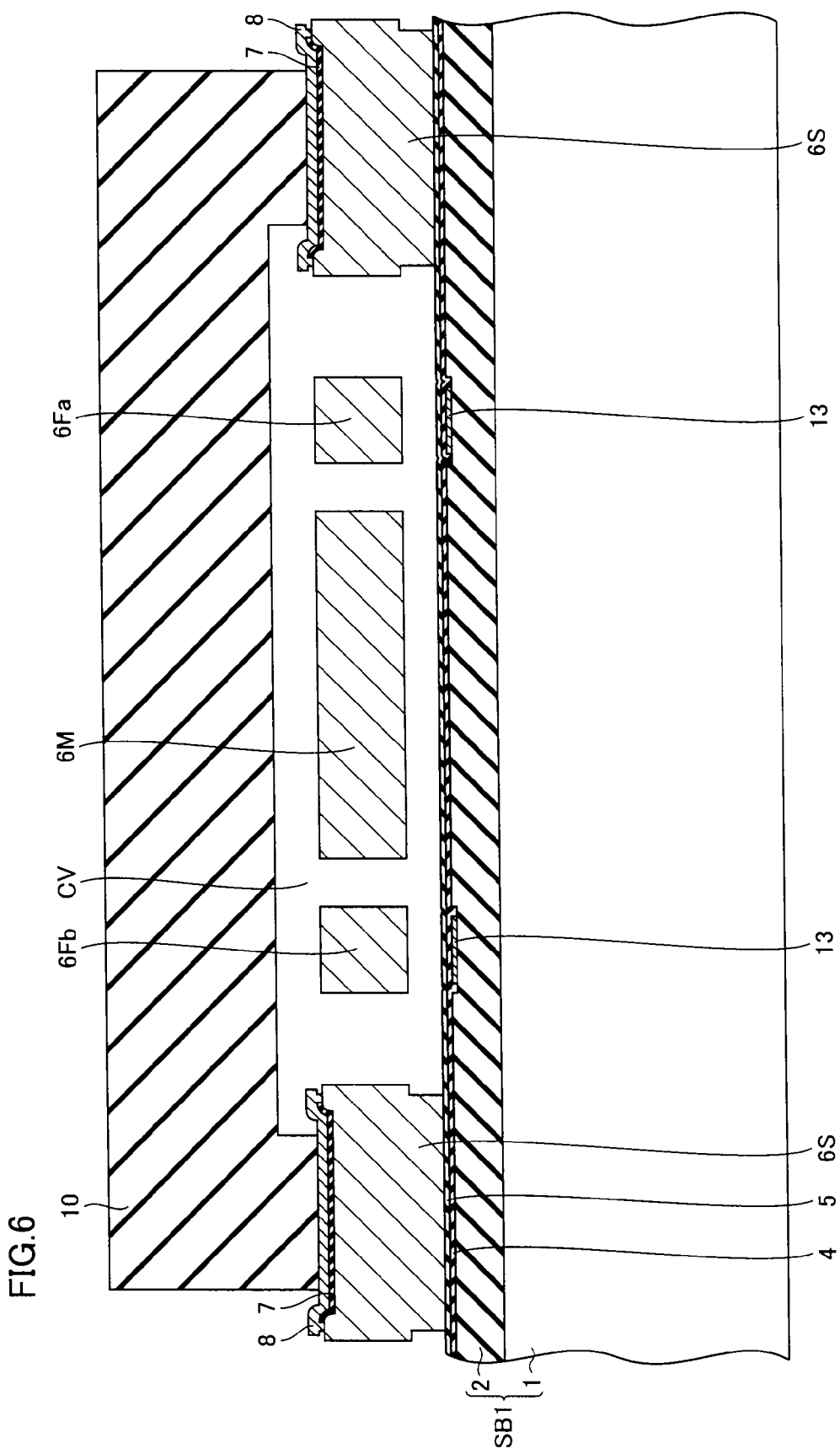
Figure 7:
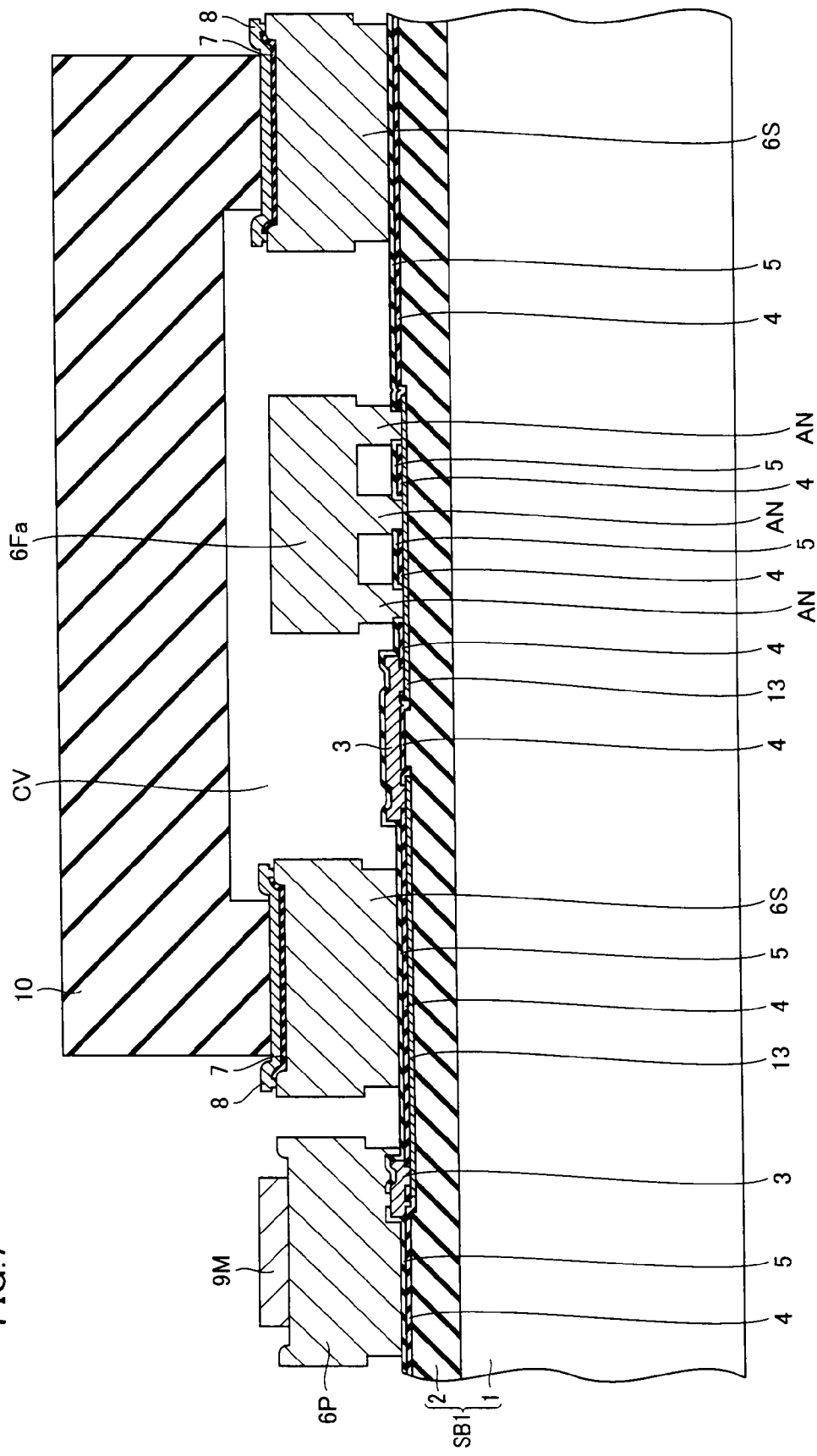
FIG. 7 is a schematic and fragmentary cross section taken along line VII-VII of FIG. 2.
Figure 8:
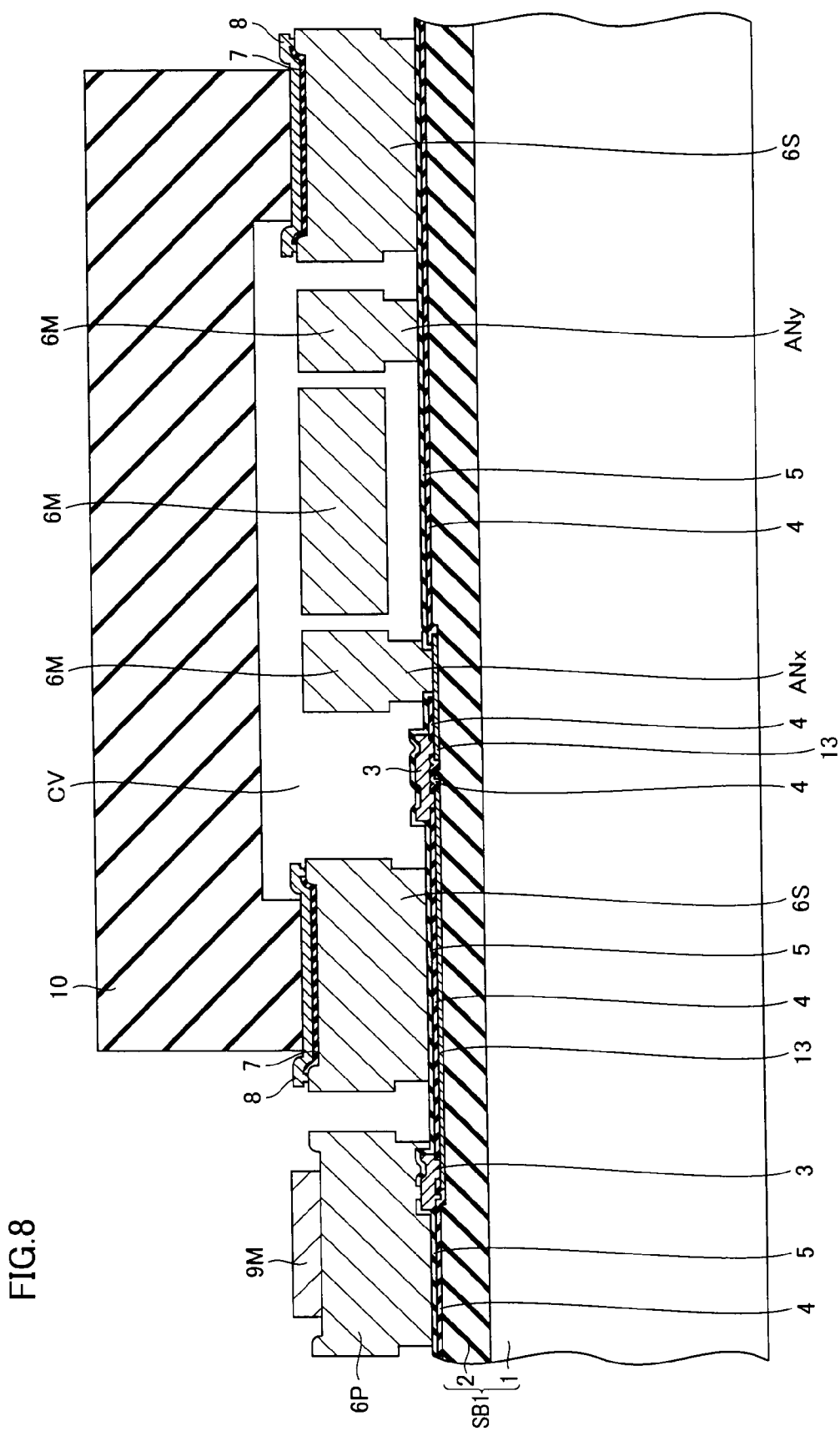
FIG. 8 is a schematic and fragmentary cross section taken along line VIII-VIII of FIG. 2.
Figure 28:
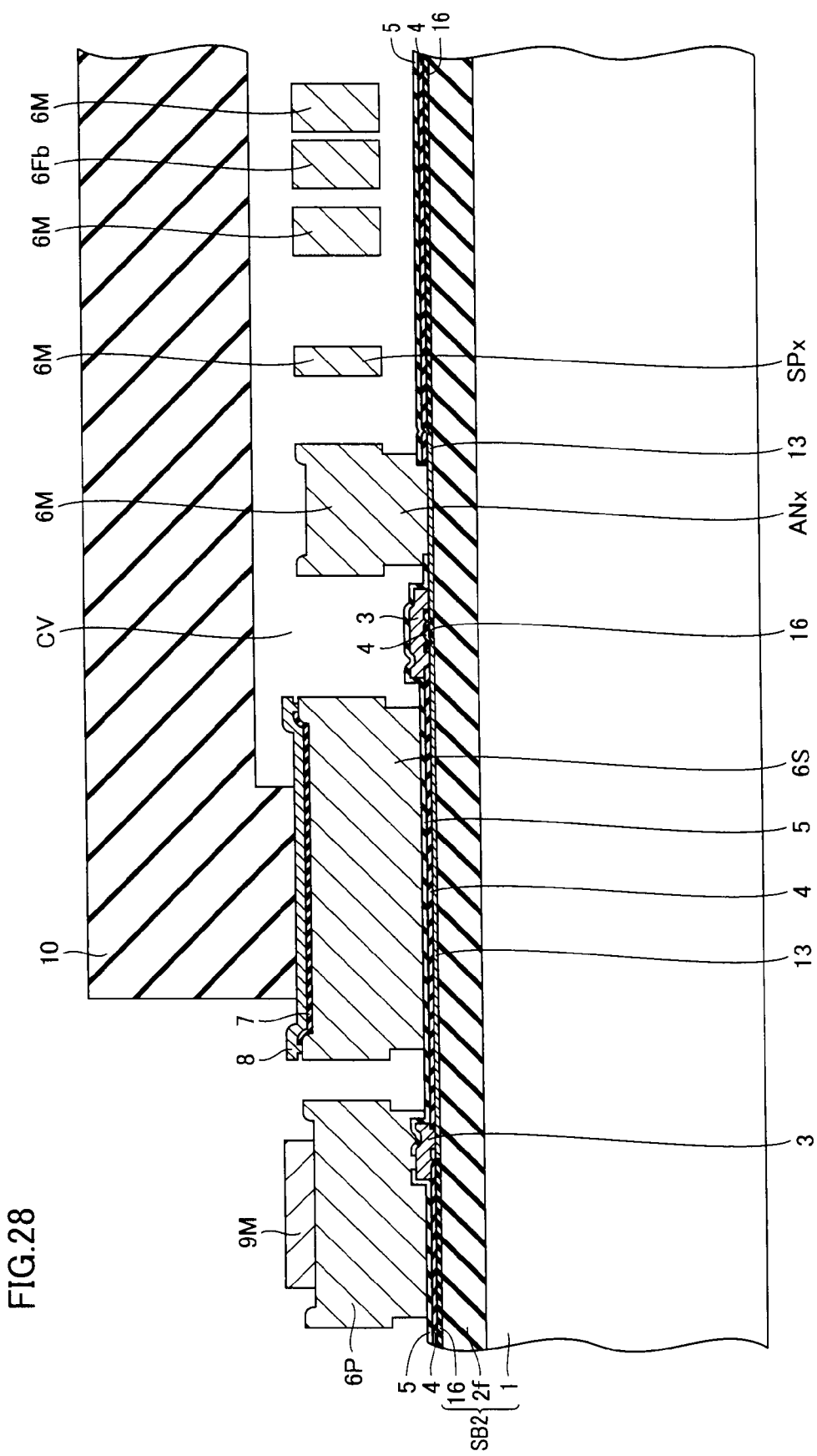
FIG. 28 is a schematic and fragmentary cross section taken along line XXVIII-XXVIII of FIG. 27.
Figure 29:
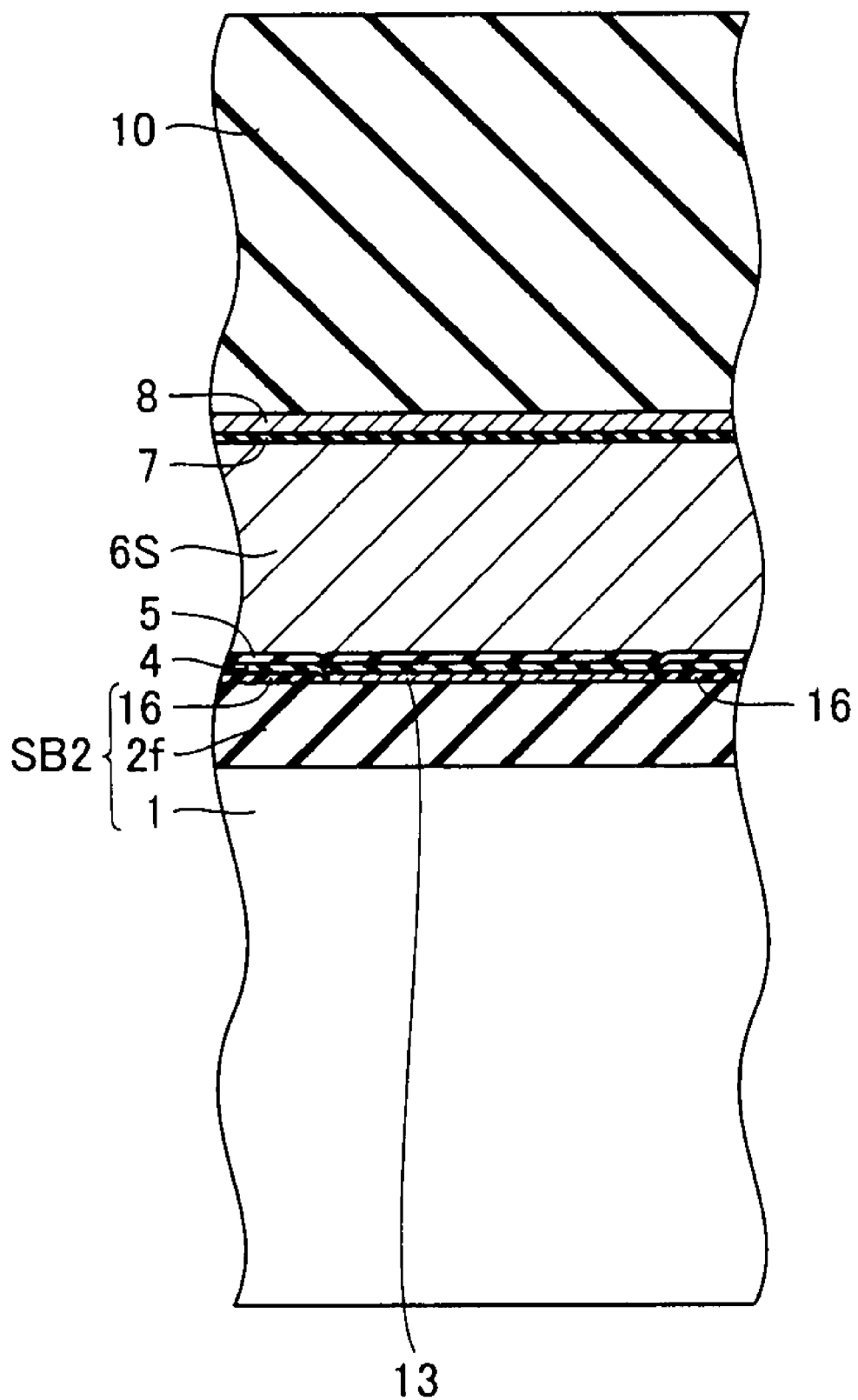
FIG. 29 is a schematic and fragmentary cross section taken along line XXIX-XXIX of FIG. 27.

Referring to FIGS. 28 and 29, the acceleration sensor of this embodiment includes a substrate SB2 having a groove instead of substrate SB1 (FIGS. 4 and 9) having the groove in the first embodiment. Substrate SB2 has silicon substrate 1 (the substrate member forming a bottom of the groove), an oxide film 2f and an oxide film 16 (the insulating film forming a side surface of the groove). Oxide film 2f is arranged on silicon substrate 1. For reducing a parasitic capacitance related to silicon substrate 1, oxide film 2f usually has a thickness of 1 μm or more. Oxide film 16 is formed selectively on oxide film 2f, and a region on oxide film 2f where oxide film 16 is not arranged forms the groove of substrate SB2.

Structures other than the above are substantially the same as those in the first embodiment already described. Therefore, the same or corresponding components bear the same reference numbers, and description thereof is not repeated.

Description will now be given on a method of manufacturing the acceleration sensor that is a semiconductor device of this embodiment.

Figure 30:
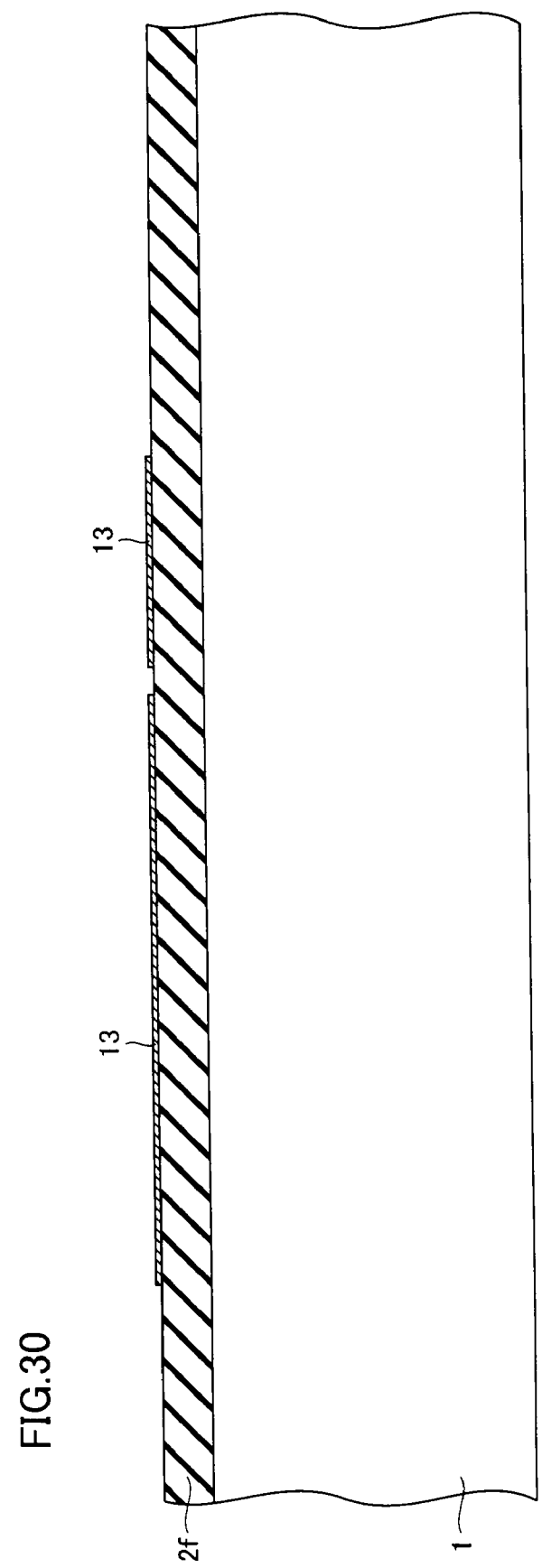
FIGS. 30-33 are schematic and fragmentary cross sections showing first to fourth steps of a method of manufacturing the acceleration sensor that is a semiconductor device in the second embodiment of the invention, respectively, and particularly show sections in the position corresponding to that in FIG. 28.

Referring to FIG. 30, oxide film 2f is formed on silicon substrate 1. Then, a doped polycrystalline silicon film is formed. This layer is patterned by the photoengraving method to form doped polycrystalline silicon layer 13. Doped polycrystalline silicon layer 13 has a thickness, e.g., of 100 nm.

Figure 31:
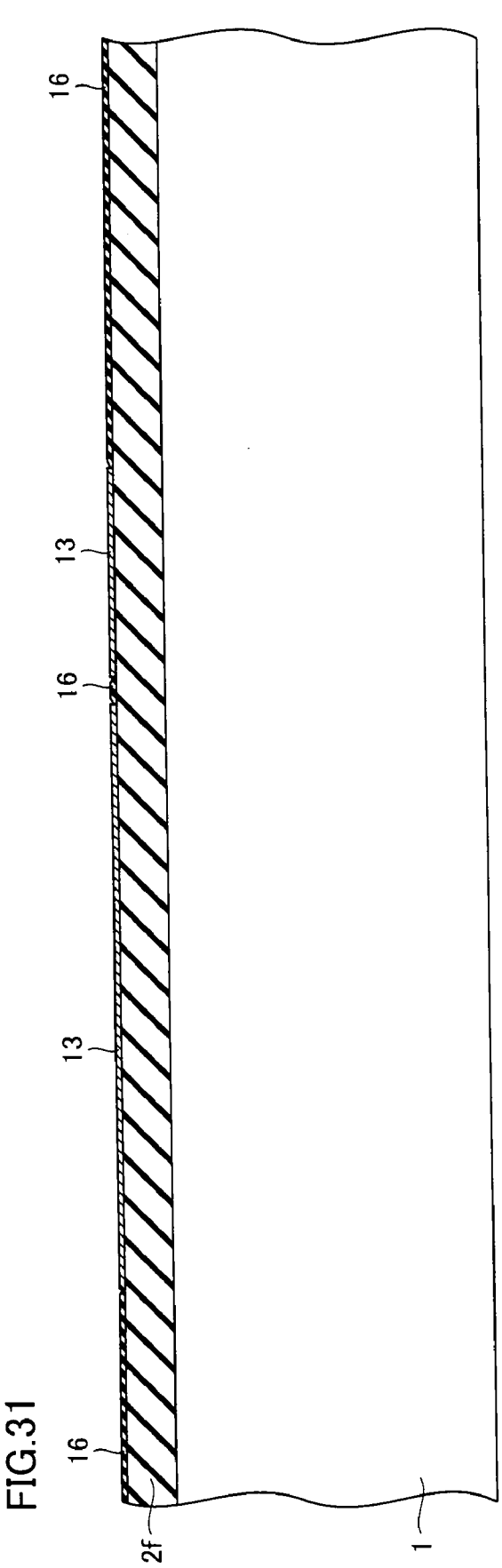

Referring to FIG. 31, an oxide film is formed. This film is patterned by the photoengraving method to form oxide film 16. Oxide film 16 has the same thickness (first thickness) as doped polycrystalline silicon layer 13.

Figure 32:
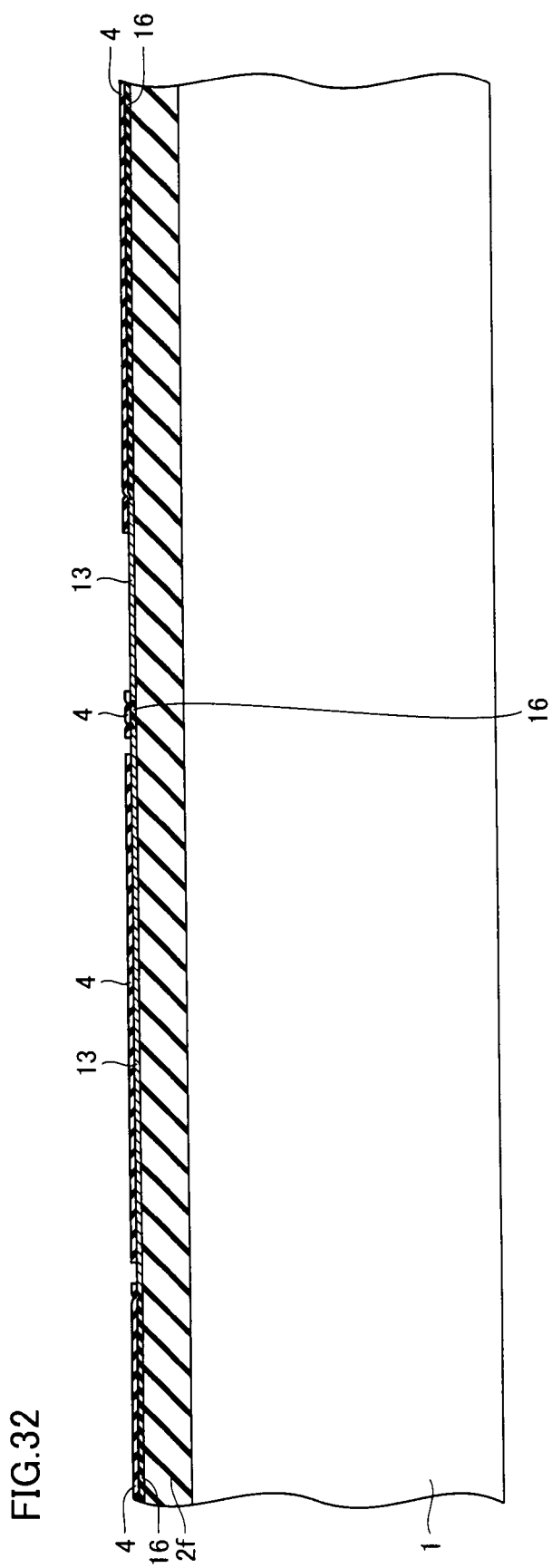

Referring to FIG. 32, an insulating film such as an oxide film is formed, and is patterned by the photoengraving method to form interlayer insulating film 4.

Figure 33:
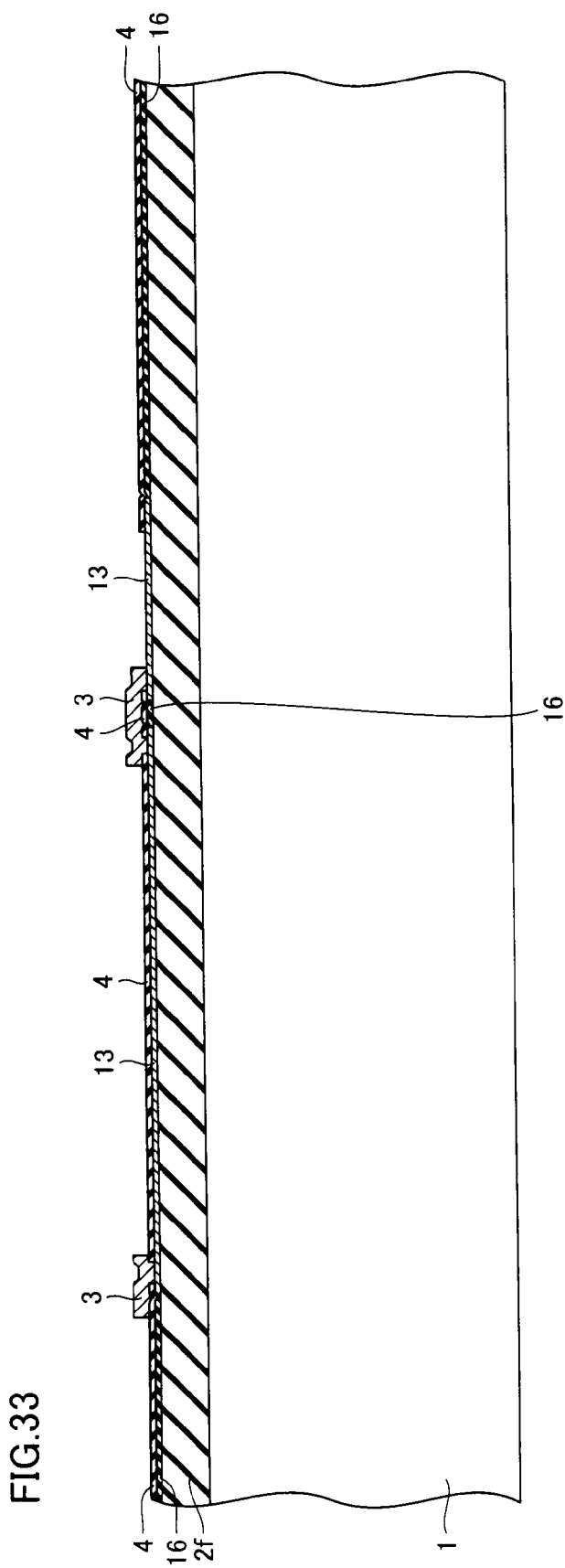

Referring to FIG. 33, a doped polycrystalline silicon layer is formed, and is patterned by the photoengraving method to form doped polycrystalline silicon layer 3. The doped polycrystalline silicon layer thus formed has a thickness, e.g., of 400 nm.

Steps after the above are substantially the same as those of FIGS. 17 to 24 in the first embodiment, and therefore description thereof is not repeated.

This embodiment can achieve substantially the same operations and effects as those of the first embodiment.

(Third Embodiment)

First, description will be given on a structure of an acceleration sensor that is a semiconductor device of a third embodiment.

Figure 35:
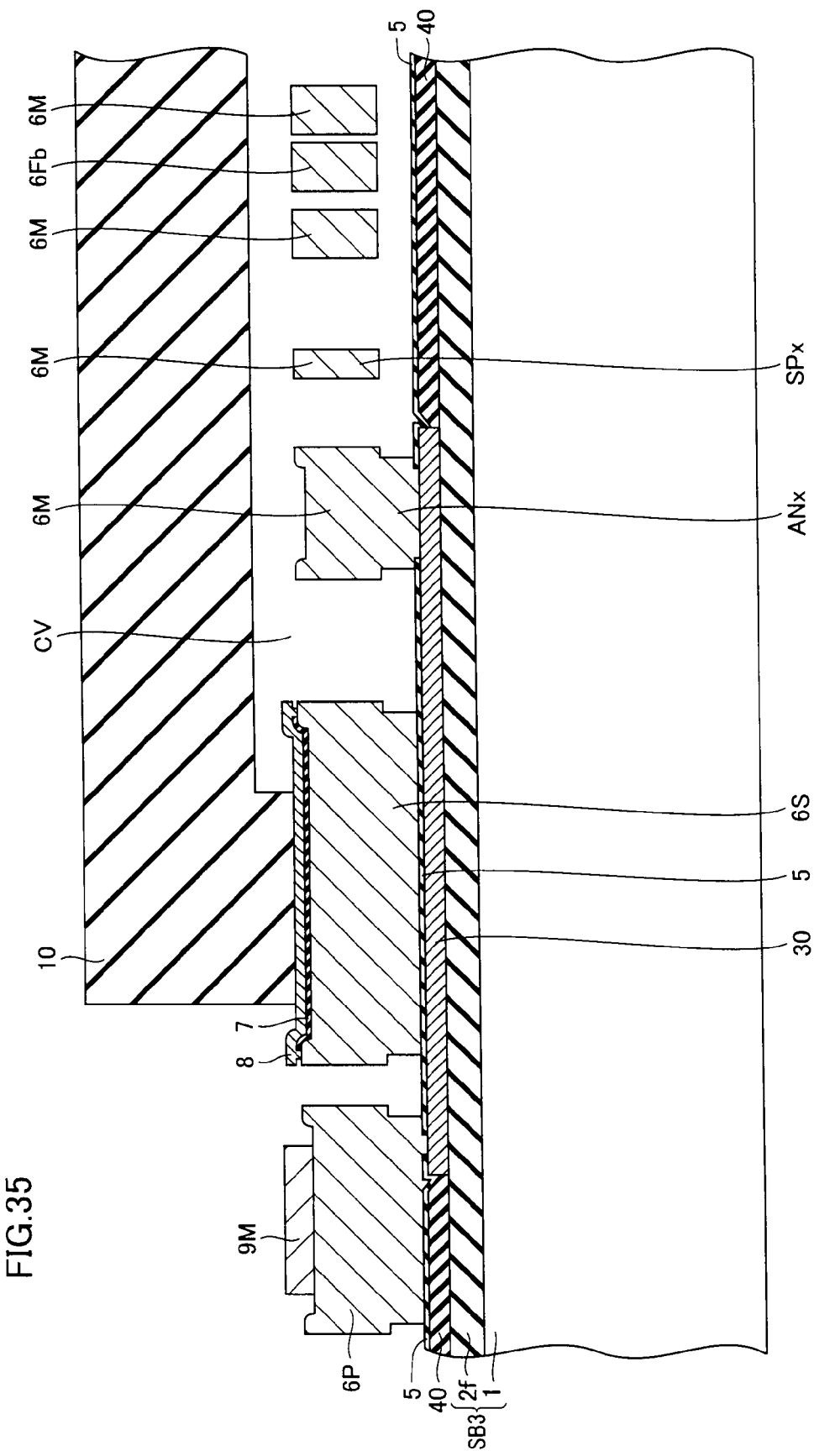
FIG. 35 is a schematic and fragmentary cross section taken along line XXXV-XXXV of FIG. 34.
Figure 36:
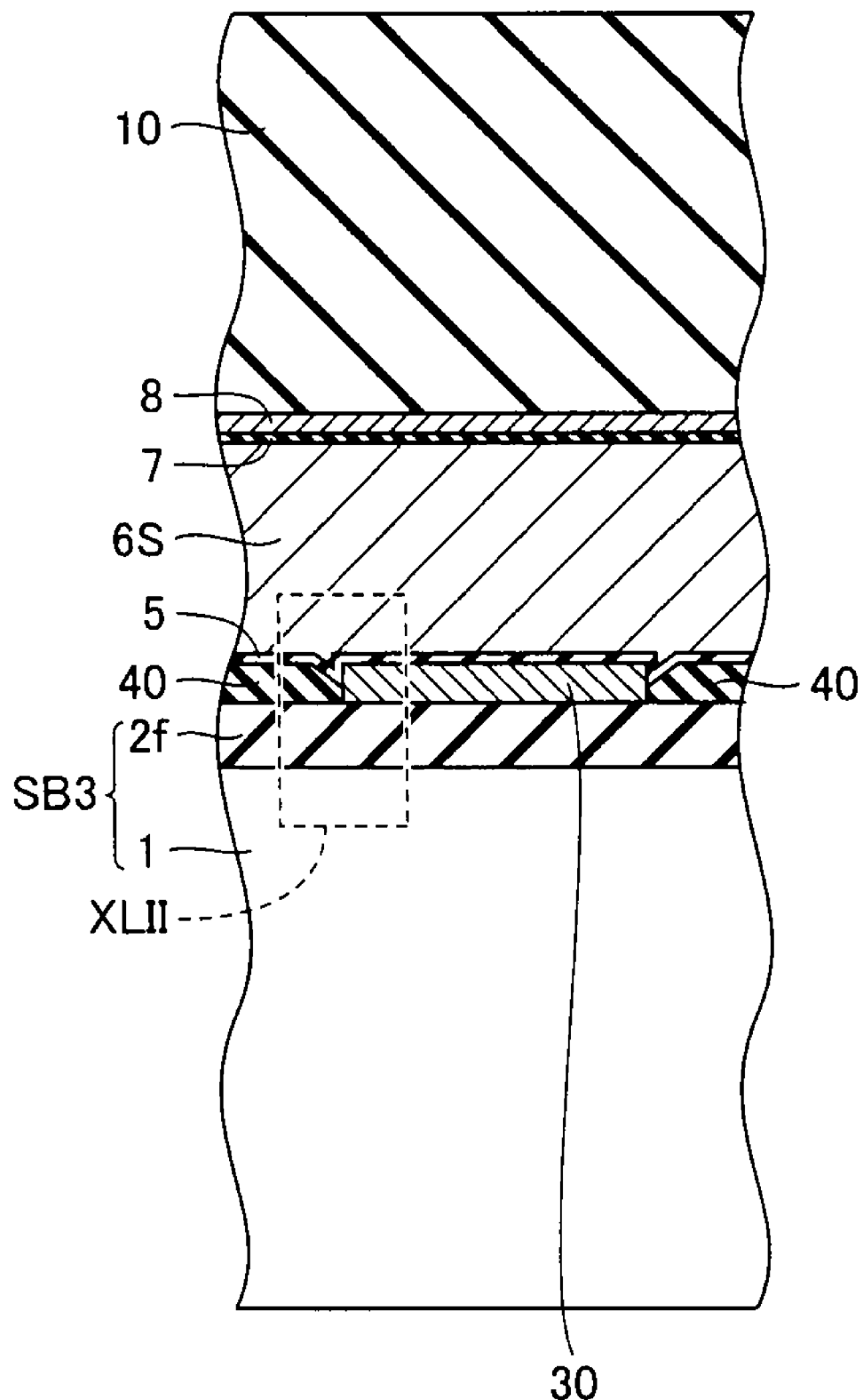
FIG. 36 is a schematic and fragmentary cross section taken along line XXXVI-XXXVI of FIG. 34.

Referring primarily to FIGS. 35 and 36, the acceleration sensor that is the semiconductor device of this embodiment primarily has a substrate SB3, a doped polycrystalline silicon layer 30 and an oxide film 40.

Substrate SB3 has silicon substrate 1 having a main surface, and oxide film 2f formed on this main surface. Oxide film 40 is formed on a part of oxide film 2f. A structure formed of substrate SB3 and oxide film 40 has a groove formed in a region where oxide film 40 is not formed on oxide film 2f.

Figure 34:
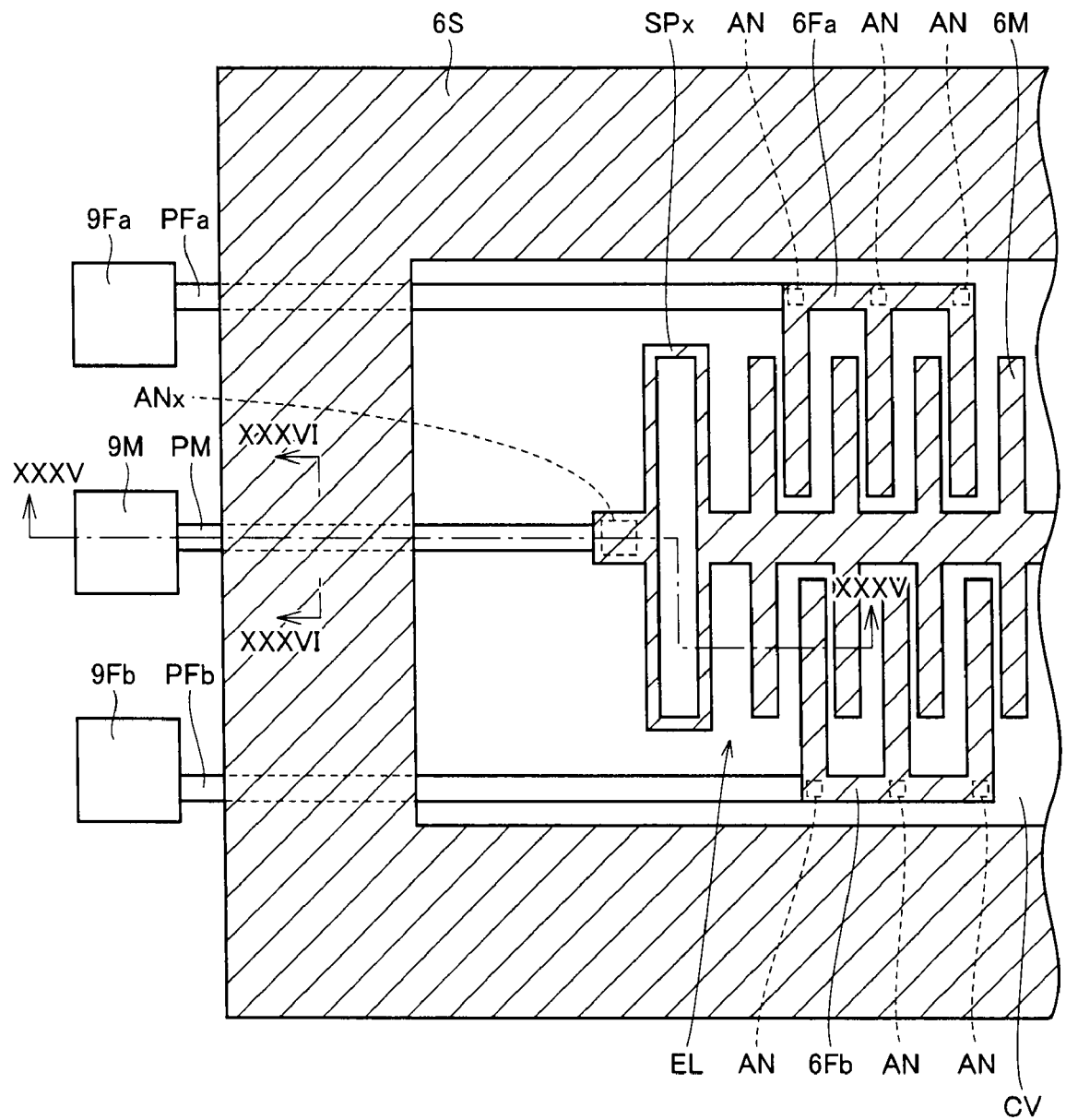
FIG. 34 is a fragmentary plan schematically showing a structure of an acceleration sensor that is a semiconductor device in a third embodiment of the invention, but does not show a cap and a substrate as well as an oxide film and a nitride film arranged on the substrate.

Doped polycrystalline silicon layer 30 extends along this groove and is located on the bottom surface of the groove. Doped polycrystalline silicon layer 30 is formed of doped polycrystalline silicon. Impurities used for doping are, e.g., phosphorus (P). Doped polycrystalline silicon layer 30 has a thickness equal to the depth of the groove and thus to the thickness of oxide film 40. Doped polycrystalline silicon layer 30 forms three systems of interconnections PFa, PFb and PM (FIG. 34) connecting the inside and the outside of cavity CV together.

Structures other than the above are substantially the same as those of the first embodiment already described. Therefore, the same or corresponding components bear the same reference numbers, and description thereof is not repeated.

Description will now be given on a method of manufacturing the acceleration sensor that is the semiconductor device of this embodiment.

Figure 37:
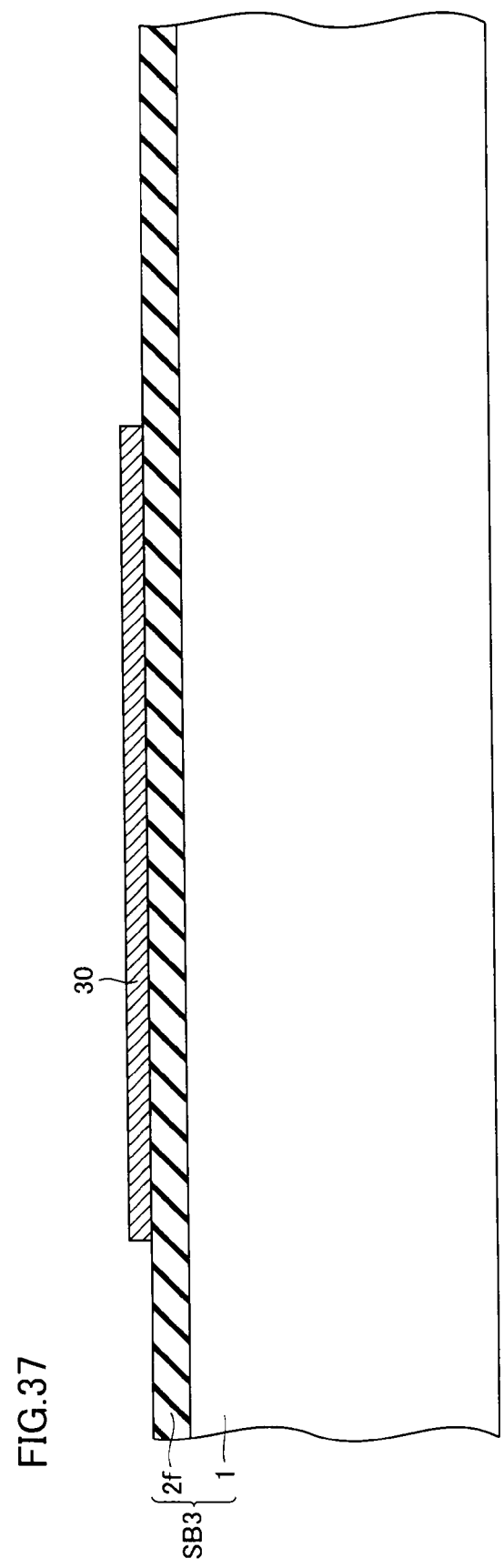
FIGS. 37-39 are schematic and fragmentary cross sections showing first to third steps of a method of manufacturing the acceleration sensor that is the semiconductor device in the third embodiment of the invention, and particularly show sections in the position corresponding to that in FIG. 35.

Referring to FIG. 37, oxide film 2f is formed on silicon substrate 1, and thereby substrate SB3 is formed. For reducing the parasitic capacitance related to silicon substrate 1, oxide film 2f usually has a thickness of 1 μm or more. A doped polycrystalline silicon layer is formed on a main surface (i.e., a surface on the oxide film 2 side) of substrate SB3, and is patterned by the photoengraving method to form doped polycrystalline silicon layer 30 (interconnections) covering a part of the main surface of substrate SB3.

Figure 38:
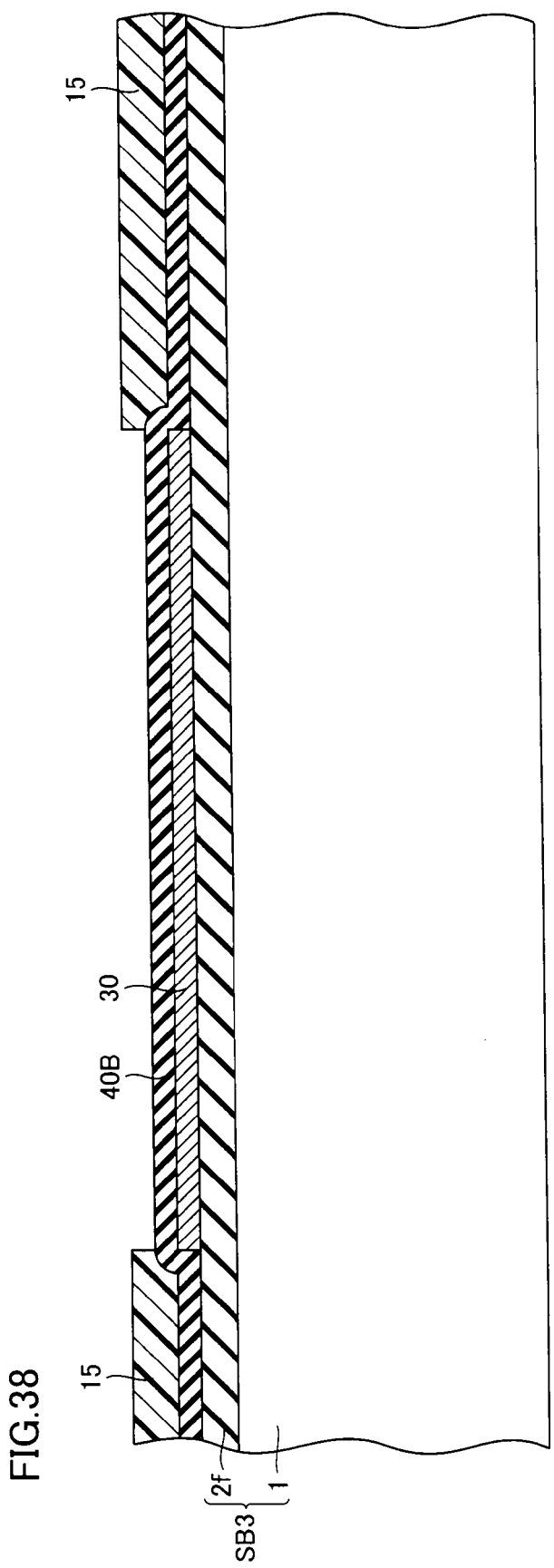

Referring to FIG. 38, an oxide film 40B (insulating film) is formed on substrate SB3. Oxide film 40B has a first portion covering doped polycrystalline silicon layer 30 and a second portion covering the main surface of substrate SB3 that is not covered by doped polycrystalline silicon layer 30. Then, a resist mask layer 15 (first mask layer) that covers the second portion and does not cover the first portion is formed. Then, isotropic etching is performed to remove oxide film 40B not covered with resist mask layer 15. The isotropic etching is, e.g., wet etching using a dilute hydrofluoric acid. Then, resist mask layer 15 is removed.

Figure 39:
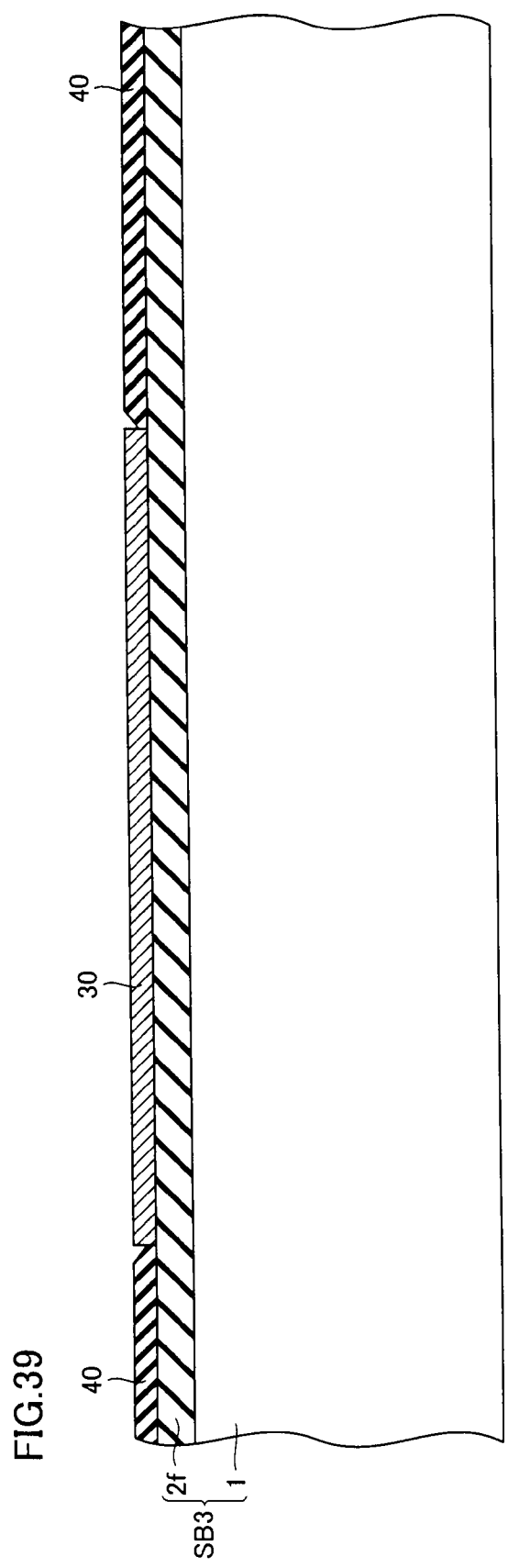

Referring primarily to FIG. 39, the foregoing isotropic etching forms oxide film 40 from oxide film 40B (FIG. 39).

The steps after the above are substantially the same as those of FIGS. 17 to 24 in the first embodiment, and therefore description thereof is not repeated.

Then, a structure of an acceleration sensor that is an example for comparison will be described.

Figure 40:
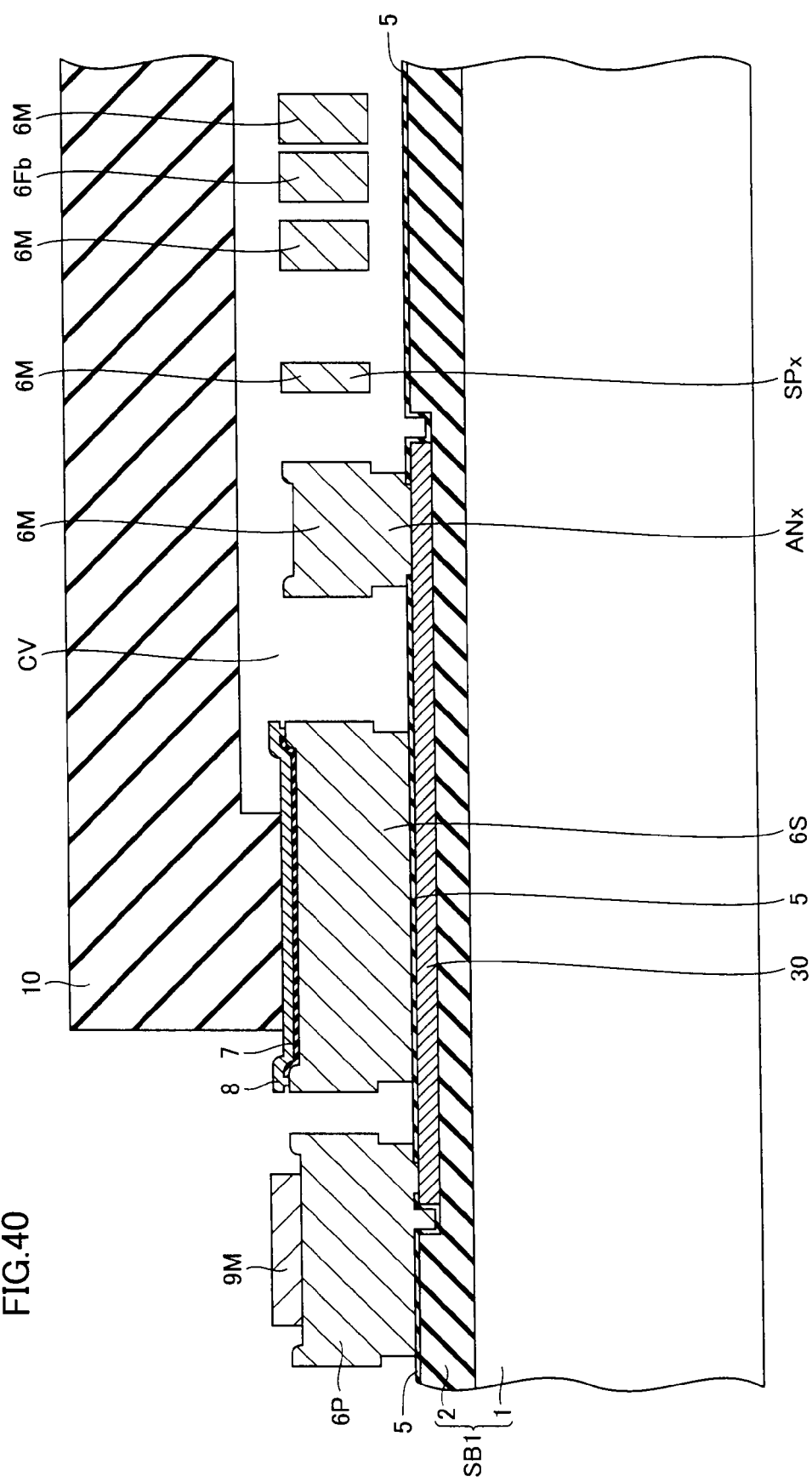
FIGS. 40 and 41 are fragmentary cross sections schematically showing a structure of an acceleration sensor in an example for comparison, and particularly show sections in the position corresponding to those in FIGS. 35 and 36, respectively.
Figure 41:
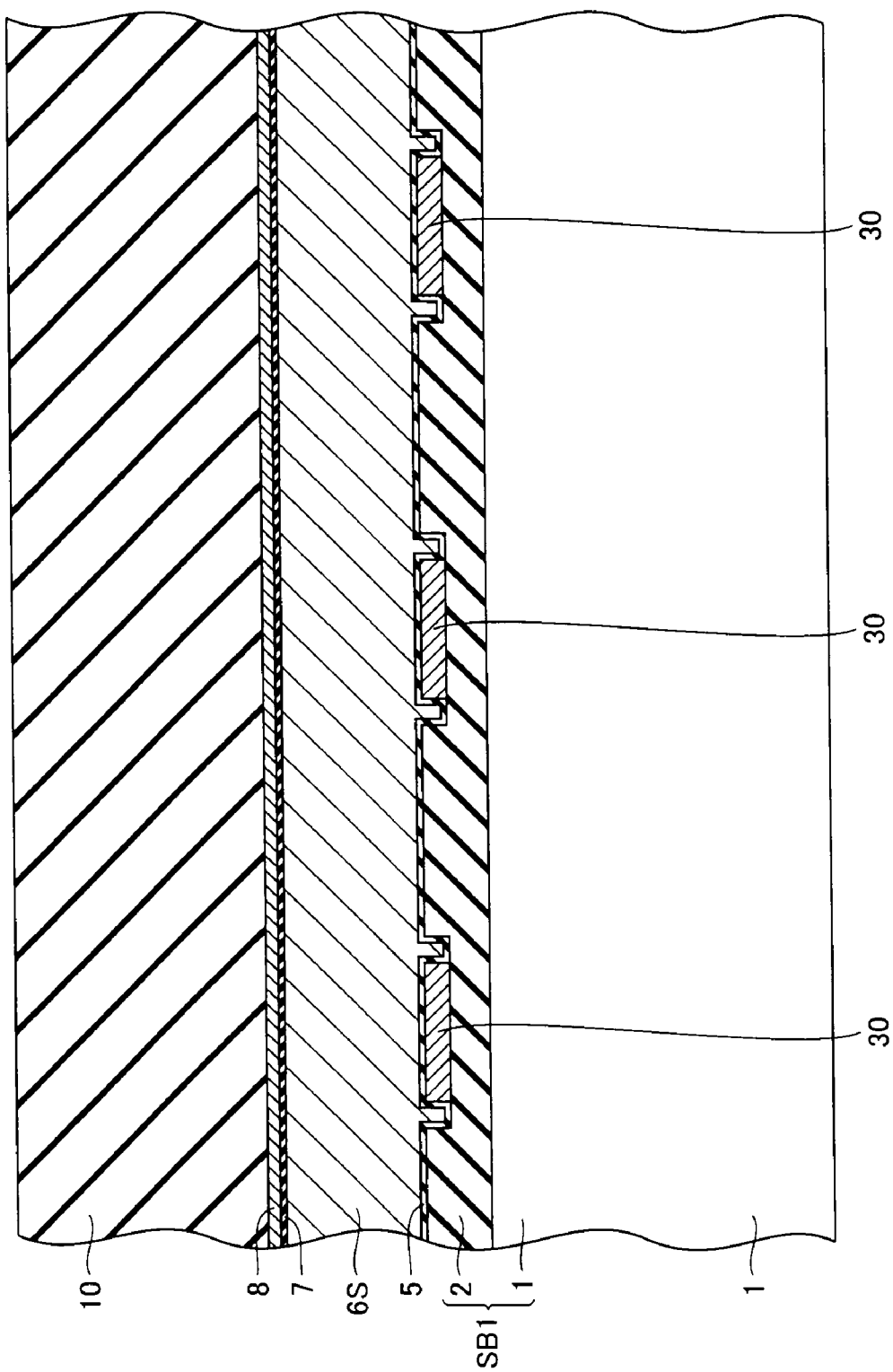

Referring to FIGS. 40 and 41, the acceleration sensor of the example for comparison has substrate SB1 and doped polycrystalline silicon layer 30. Substrate SB1 has the groove formed by the anisotropic etching. Doped polycrystalline silicon layer 30 is arranged on the bottom surface of this groove.

Figure 42:
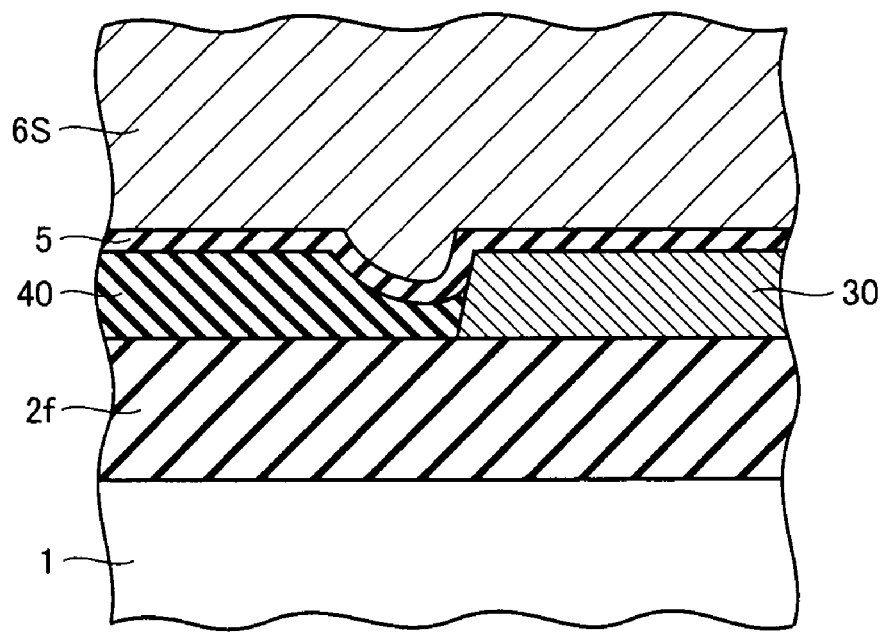
FIG. 42 shows, on an enlarged scale, a portion indicated by broken line XLII of FIG. 36.

According to the third embodiment, the isotropic etching patterns oxide film 40B (FIG. 38) to form oxide film 40. As shown in FIG. 42, therefore, an end or edge of oxide film 40 has a gently stepped sectional form. Accordingly, the irregularities at the upper surfaces of oxide film 40 and doped polycrystalline silicon layer 30 become gentle, and thus the irregularities at the upper surface of sealing unit 6S formed on oxide film 40 and doped polycrystalline silicon layer 30 are small. Accordingly, sealing unit 6S can be closely joined to cap 10 so that the airtightness of cavity CV can be ensured, and also the electric resistances of interconnections PFa, PFb and PM can be reduced. Further, the form of the end of oxide film 40 reduces the stress at the end of oxide film 40. Thereby, the occurrence of cracks can be suppressed so that the acceleration sensor can have higher reliability.

Figure 43:
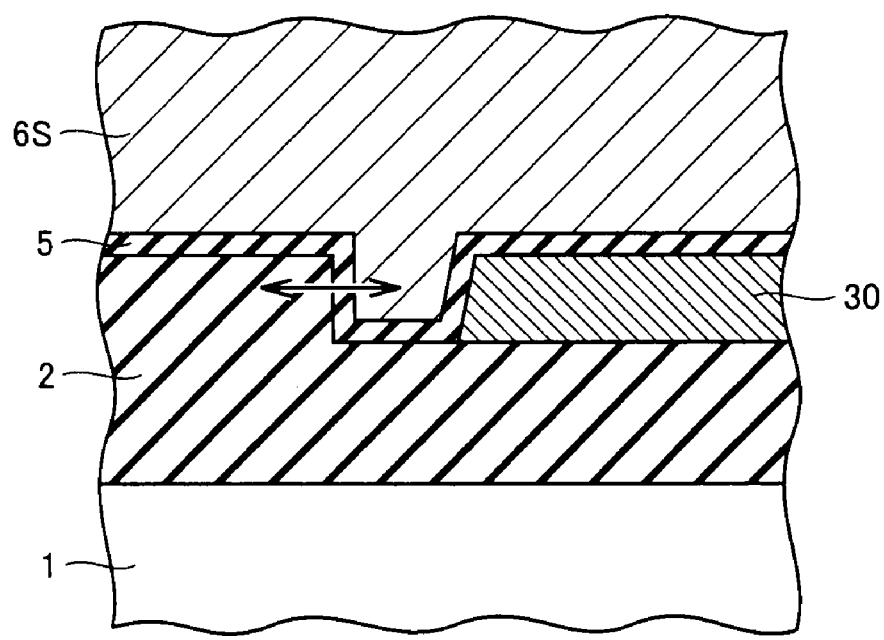
FIG. 43 is a view corresponding to FIG. 42 and shows an acceleration sensor in an example for comparison.

In a structure of the example for comparison in FIGS. 40 and 41, a side surface of the groove of oxide film 2 has a sharply stepped portion as shown in FIG. 43 so that a large stress occurs at a side surface portion of the groove as indicated by an arrow in FIG. 43.

(Fourth Embodiment)

First, description will be given on a structure of an acceleration sensor that is a semiconductor device of a fourth embodiment.

Figure 45:
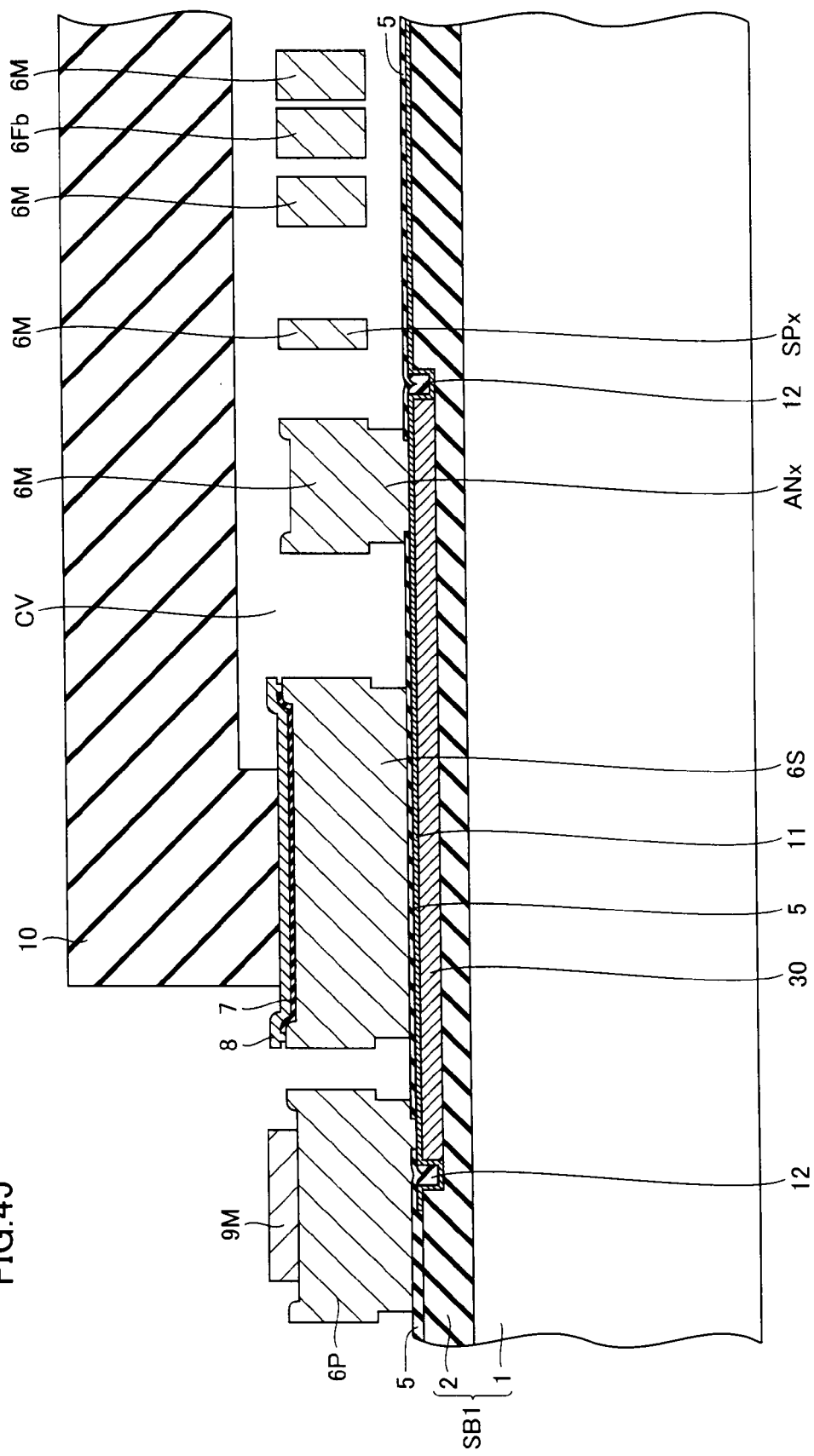
FIG. 45 is a schematic and fragmentary cross section taken along line XLV-XLV of FIG. 44.
Figure 46:
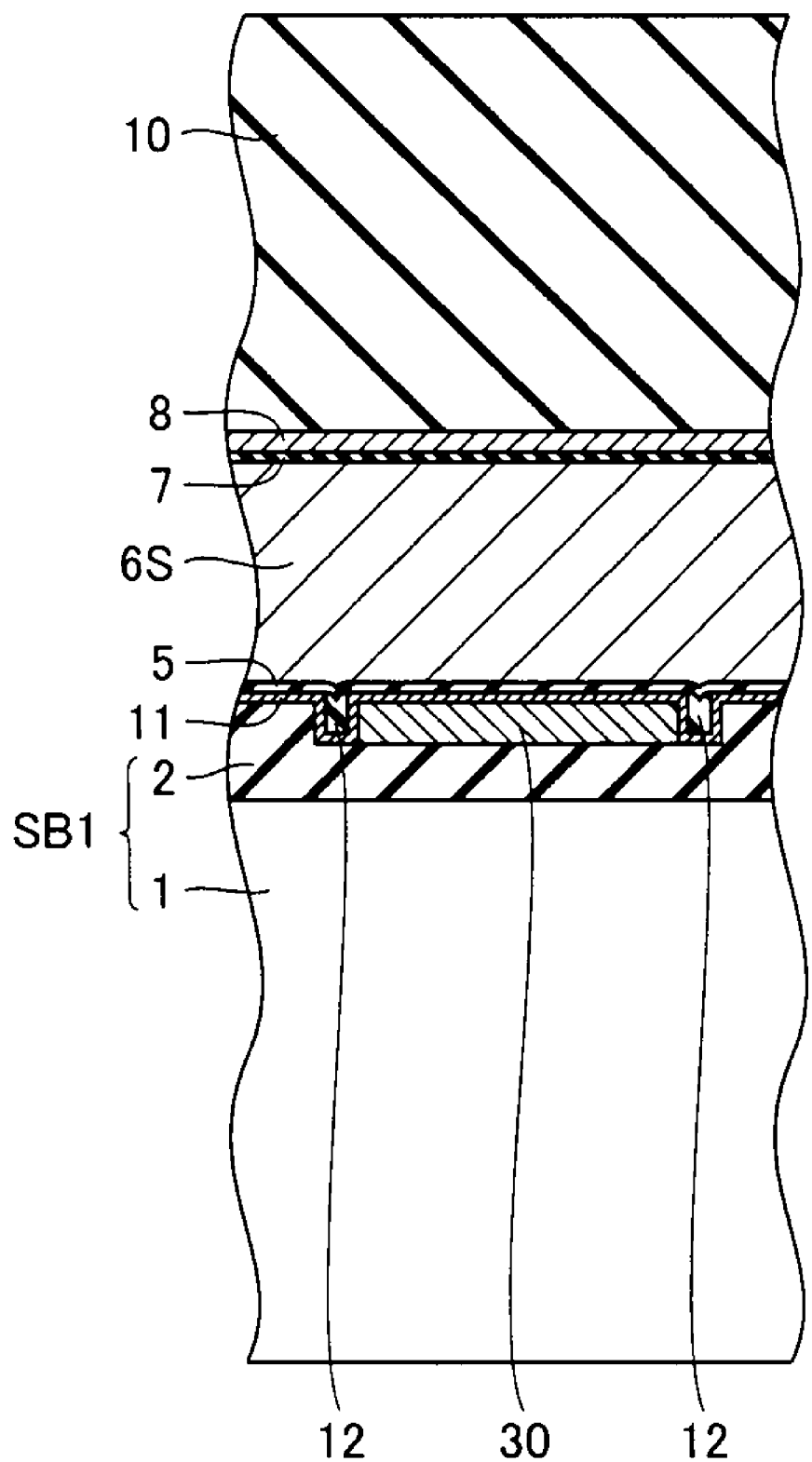
FIG. 46 is a schematic and fragmentary cross section taken along line XLVI-XLVI of FIG. 44.

Referring primarily to FIGS. 45 and 46, the acceleration sensor of this embodiment has substrate SB1 (i.e., the substrate having the groove) instead of substrate SB3 and oxide film 40 (FIGS. 35 and 36) in the third embodiment. The acceleration sensor of the fourth embodiment further has a polycrystalline silicon layer 11 (i.e., a covering film) and an oxide film 12 (i.e., a filling portion).

Figure 44:
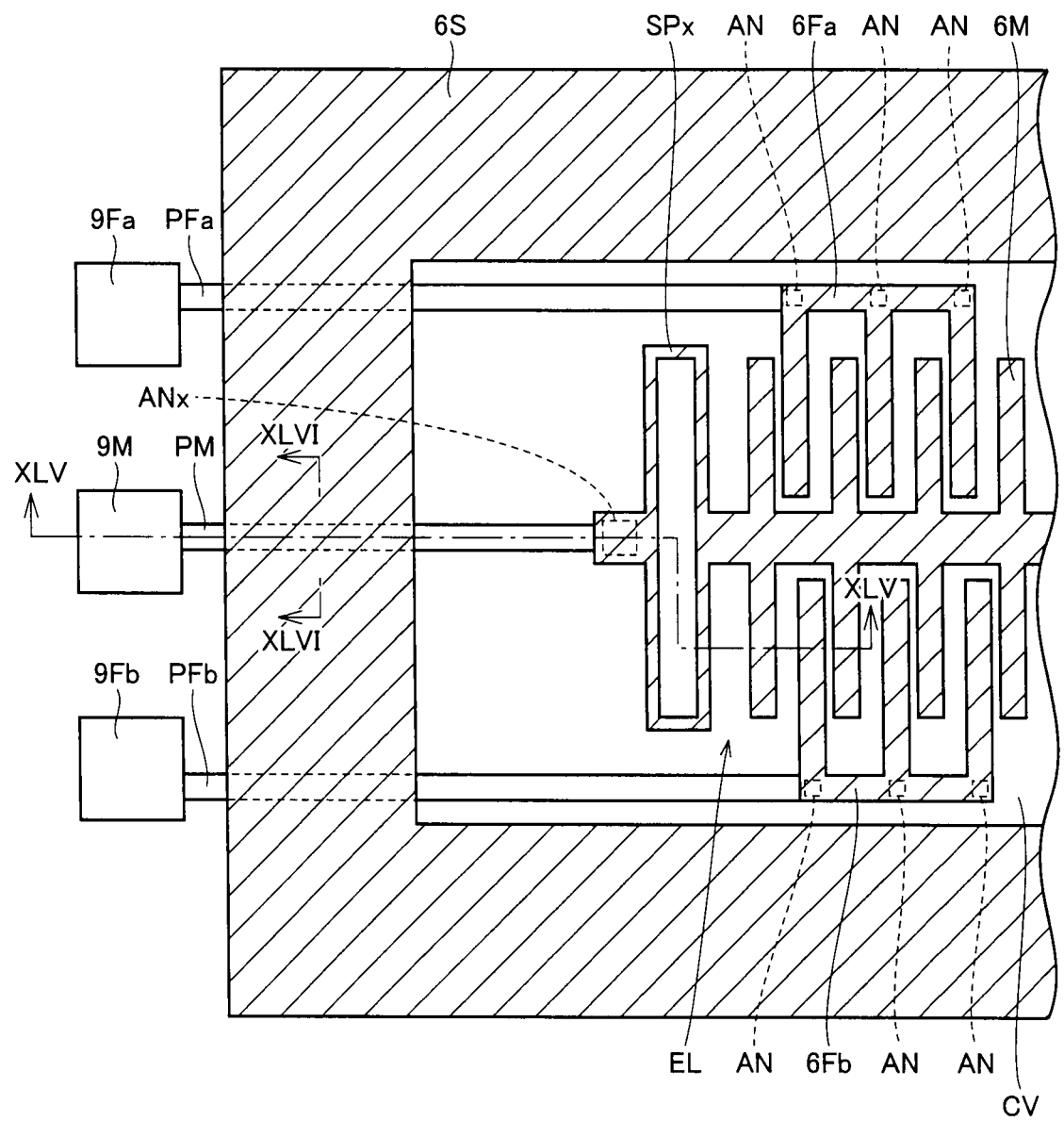
FIG. 44 is a fragmentary plan schematically showing a structure of an acceleration sensor that is a semiconductor device in a fourth embodiment of the invention, but does not show a cap, a substrate and a nitride film arranged on the substrate.

Doped polycrystalline silicon layer 30 extends along the groove of substrate SB1 and is located on the bottom surface of the groove. Doped polycrystalline silicon layer 30 forms interconnections PFa, PFb and PM (FIG. 44). For example, each of the depth of the groove and the thickness of doped polycrystalline silicon layer 30 is 400 nm, and a distance between the side surfaces of the groove and doped polycrystalline silicon layer 30 is 500 nm. This distance depends on the thickness of doped polycrystalline silicon layer 30 and an alignment accuracy in the photoengraving step during manufacturing.

Polycrystalline silicon layer 11 that is made of polycrystalline silicon (i.e., one material) covers the inner surface of the concave portion between the side surface of the groove at substrate SB1 and the side surface of doped polycrystalline silicon layer 30. Oxide film 12 that is made of oxide (i.e., a different material other than the above one material) fills the concave portion covered with polycrystalline silicon layer 11. The upper surface of oxide film 12 is slowly inclined with respect to the main surface of substrate SB1.

Structures other than the above are substantially the same as those of the first or third embodiment already described. Therefore, the same or corresponding components bear the same reference numbers, and description thereof is not repeated.

Description will now be given on a method of manufacturing the acceleration sensor that is the semiconductor device of this embodiment.

Figure 47:
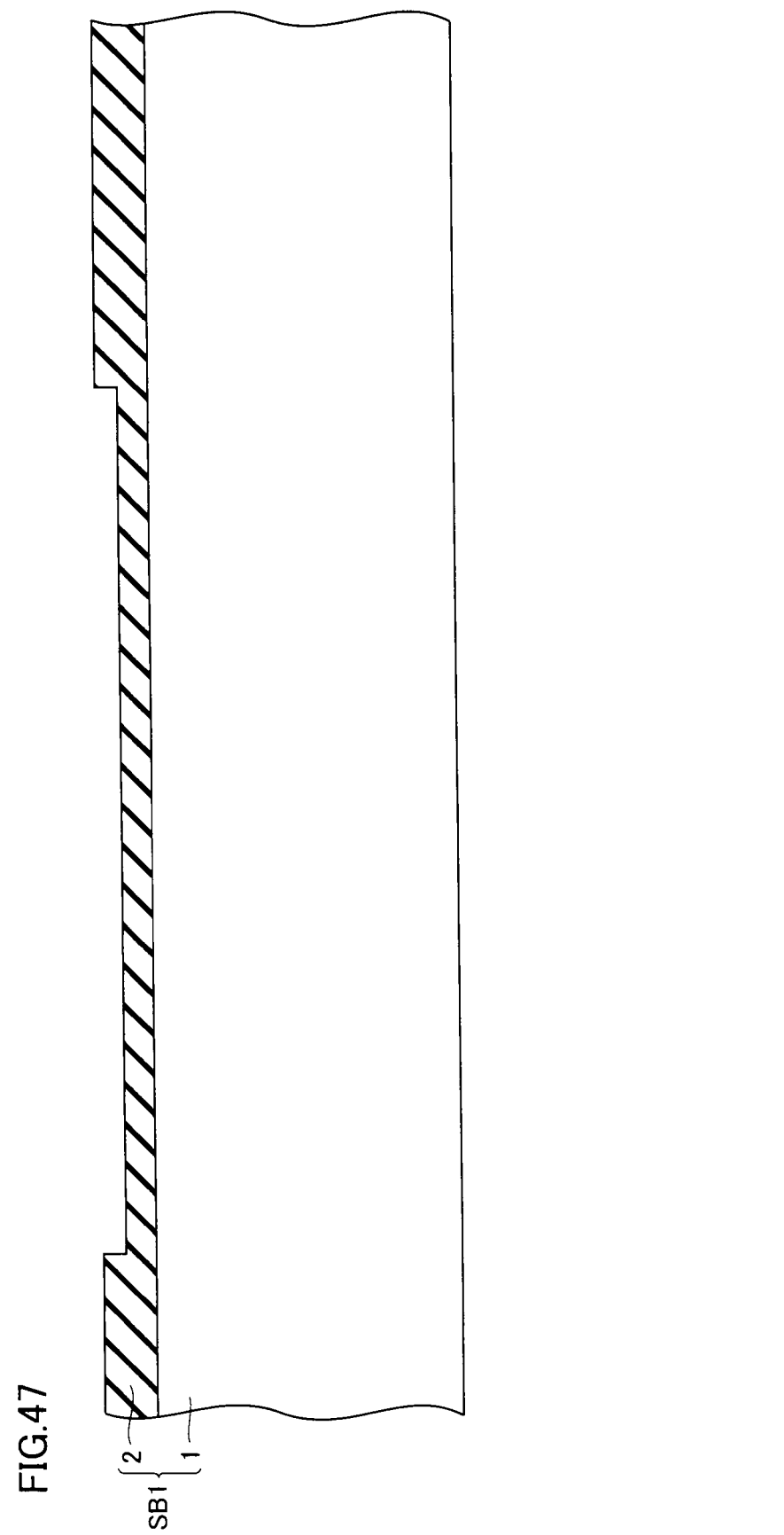
FIGS. 47-52 are schematic and fragmentary cross sections showing first to sixth steps of a method of manufacturing the acceleration sensor that is the semiconductor device in the fourth embodiment of the invention, and particularly show sections in the position corresponding to that in FIG. 45.

Referring to FIG. 47, oxide film 2 is formed on silicon substrate 1. For reducing the parasitic capacitance related to silicon substrate 1, the thickness of oxide film 2 is usually 1 μm or more. Oxide film 2 is provided at its surface with a groove of a depth equal to the thickness of doped polycrystalline silicon layer 30 (FIG. 45). Thereby, substrate SB1 is formed. The groove has the depth, e.g., of 400 nm.

Figure 48:
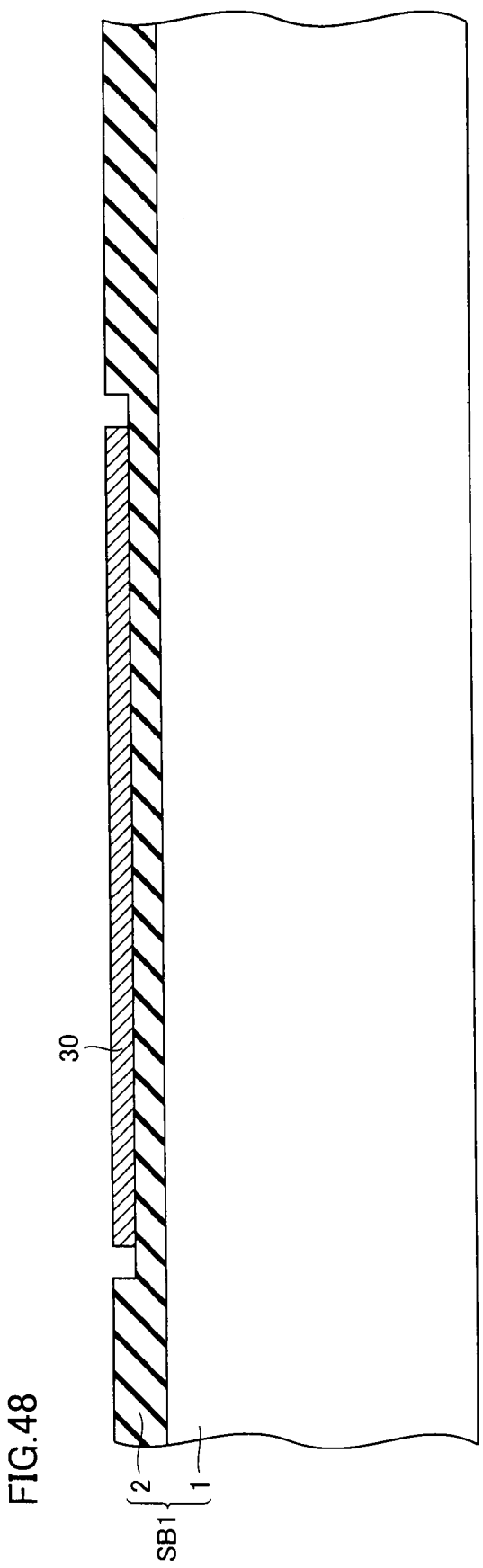

Referring to FIG. 48, a doped polycrystalline silicon layer is formed, and is patterned by the photoengraving method to form doped polycrystalline silicon layer 30. A concave portion is formed between the side surface of the groove of substrate SB1 and the side surface of doped polycrystalline silicon layer 3.

Figure 49:
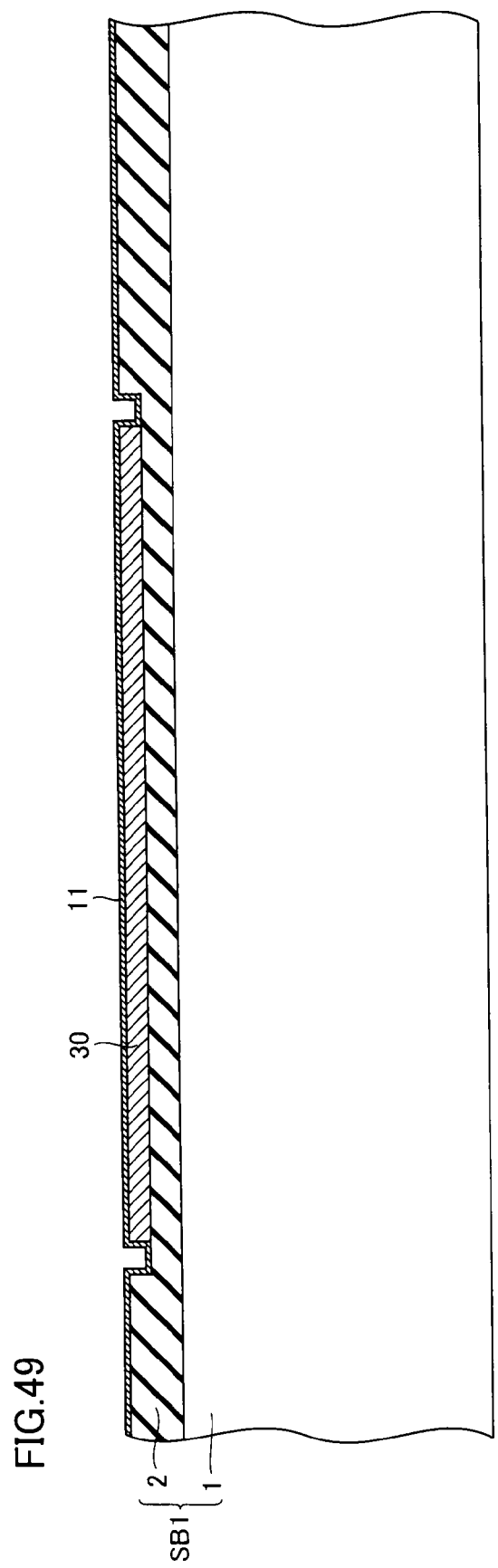

Referring to FIG. 49, polycrystalline silicon layer 11 is formed to cover the inner surface of the concave portion.

Figure 50:
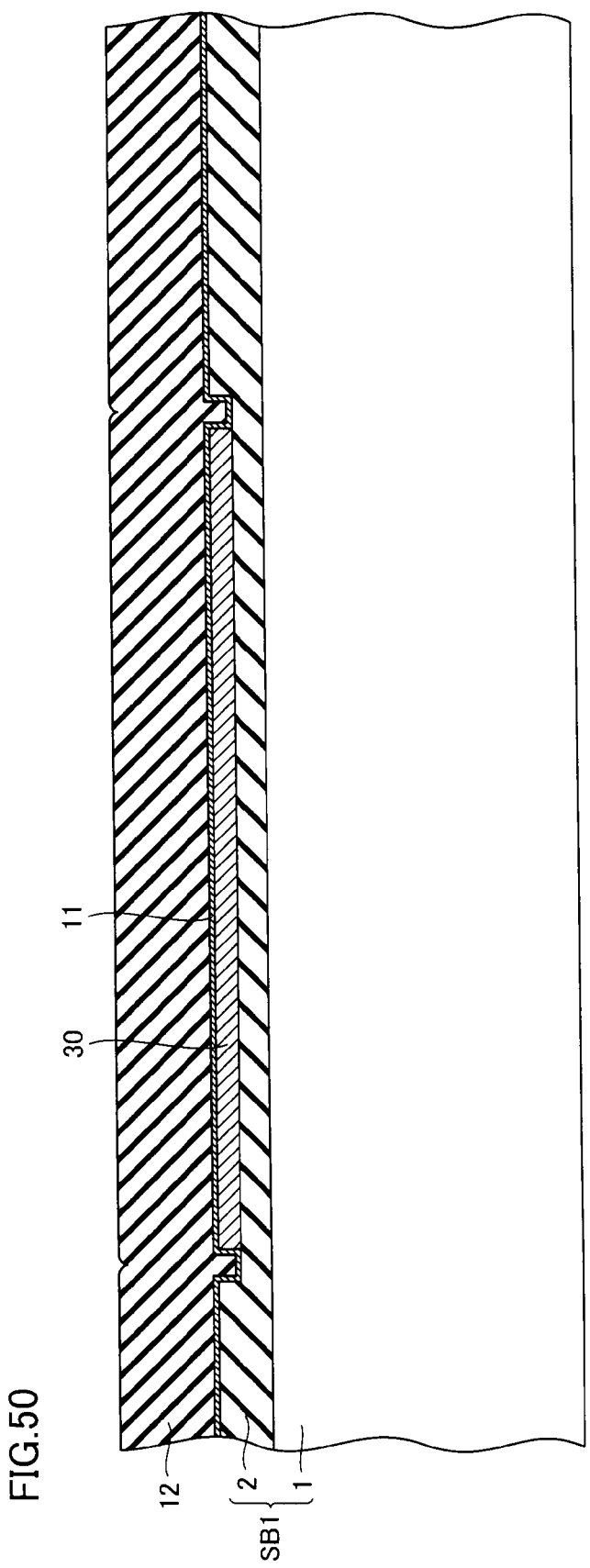

Referring to FIG. 50, oxide film 12 is formed to fill the concave portion covered with polycrystalline silicon layer 11. The thickness of oxide film 12 has much larger than that of doped polycrystalline silicon layer 30 so that the stepped portion at the surface of oxide film 12 can be small. Then, etchback is effected on oxide film 12.

Figure 51:
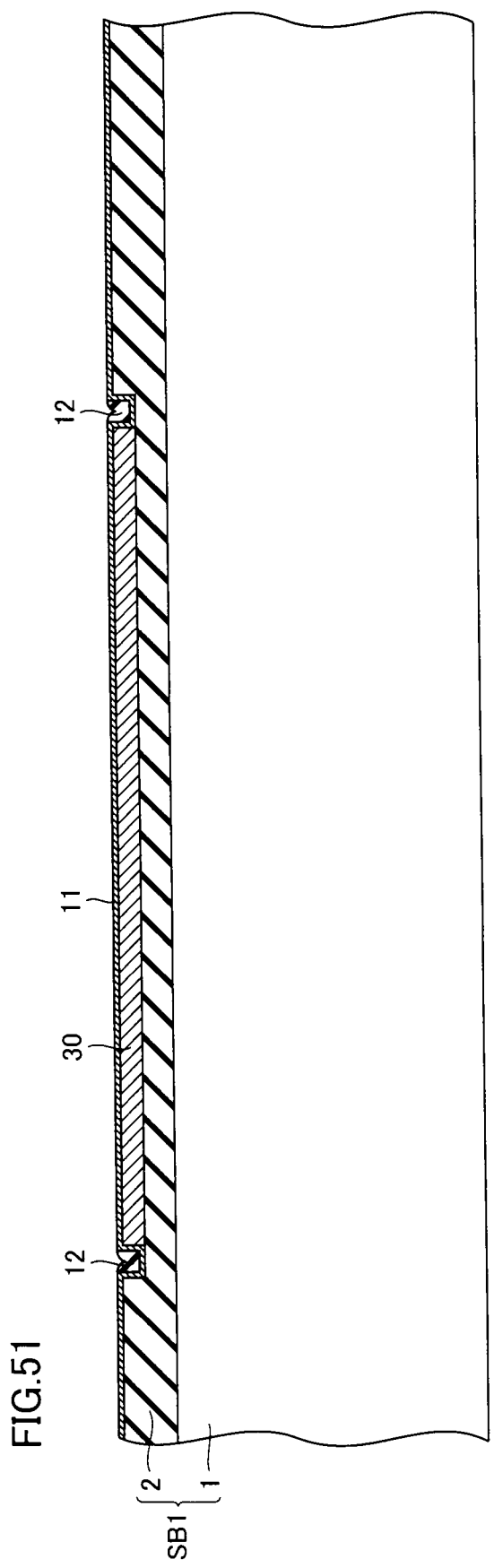

Referring to FIG. 51, polycrystalline silicon layer 11 serves as a stop layer to stop the above etchback.

Figure 52:
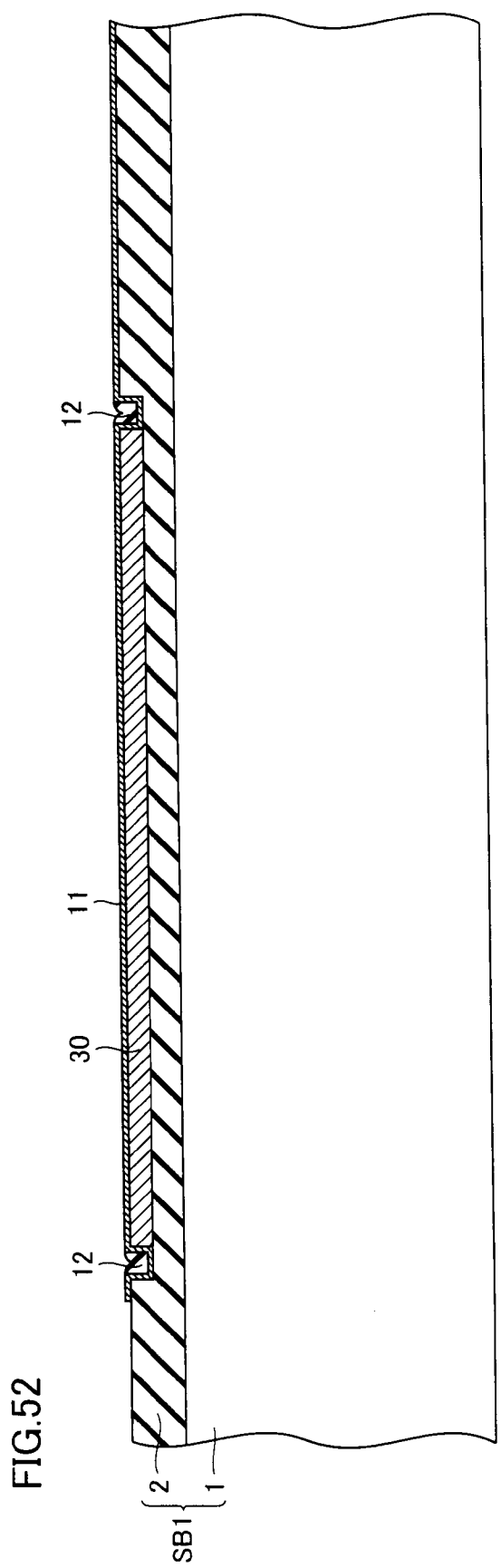

Referring to FIG. 52, polycrystalline silicon layer 11 is patterned. Impurities in doped polycrystalline silicon layer 30 diffuse into polycrystalline silicon layer 11 to lower the resistivity of polycrystalline silicon layer 11. Therefore, different polycrystalline silicon layers 11 are spaced from each other, e.g., by 100 μm or more for preventing short circuit between the plurality of polycrystalline silicon layers 11.

The steps after the above are substantially the same as those of FIGS. 17 to 24 in the first embodiment, and therefore description thereof is not repeated.

According to this embodiment, oxide film 12 fills the concave portion between the side surface of substrate SB1 and the side surface of doped polycrystalline silicon layer 30, and thereby smoothes the surface as shown in FIGS. 45 and 46 so that it is possible to suppress occurrence of irregularities at the upper surface of sealing unit 6S formed on the concave portion. Thereby, the sealing unit 6S and cap 10 can be closed joined together. Accordingly, the airtightness of cavity CV can be ensured and also the electric resistances of interconnections PFa, PFb and PM can be reduced.

The upper surface of oxide film 12 is slowly inclined with respect to the main surface of substrate SB1. Thereby, the stress in the main surface direction of substrate SB1 (i.e., the lateral direction in FIGS. 45 and 46) at the concave portion is relieved. Thereby, the occurrence of cracks can be suppressed, and the reliability of the acceleration sensor can be improved.

(Fifth Embodiment)

First, description will be given on a structure of an acceleration sensor that is a semiconductor device of a fifth embodiment.

Figure 53:
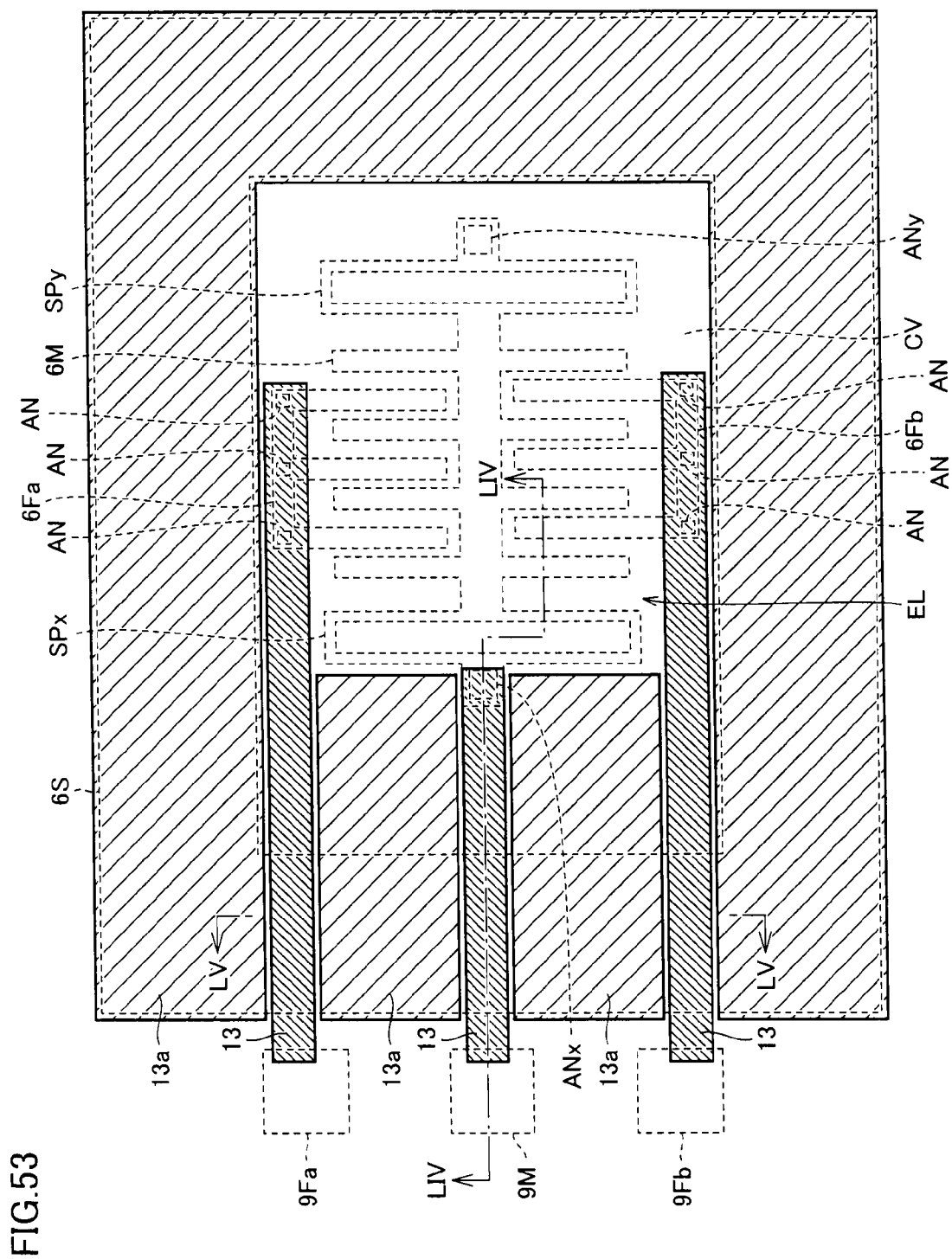
FIG. 53 is a fragmentary plan schematically showing a structure of an acceleration sensor that is a semiconductor device in a fifth embodiment of the invention, but does not show a cap and a substrate as well as an interlayer insulating film and a nitride film arranged on the substrate.
Figure 54:
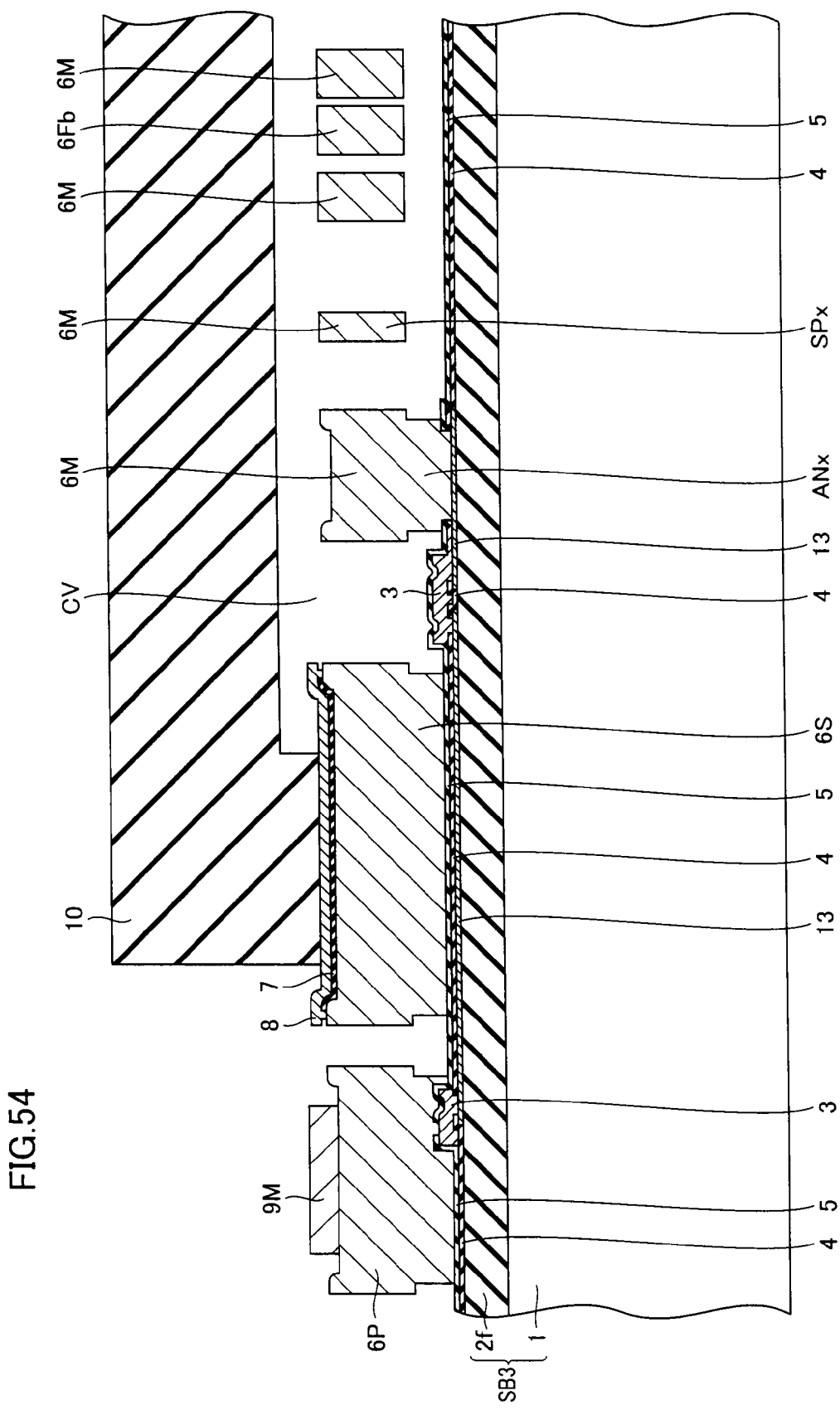
FIG. 54 is a schematic and fragmentary cross section taken along line LIV-LIV of FIG. 53.
Figure 55:
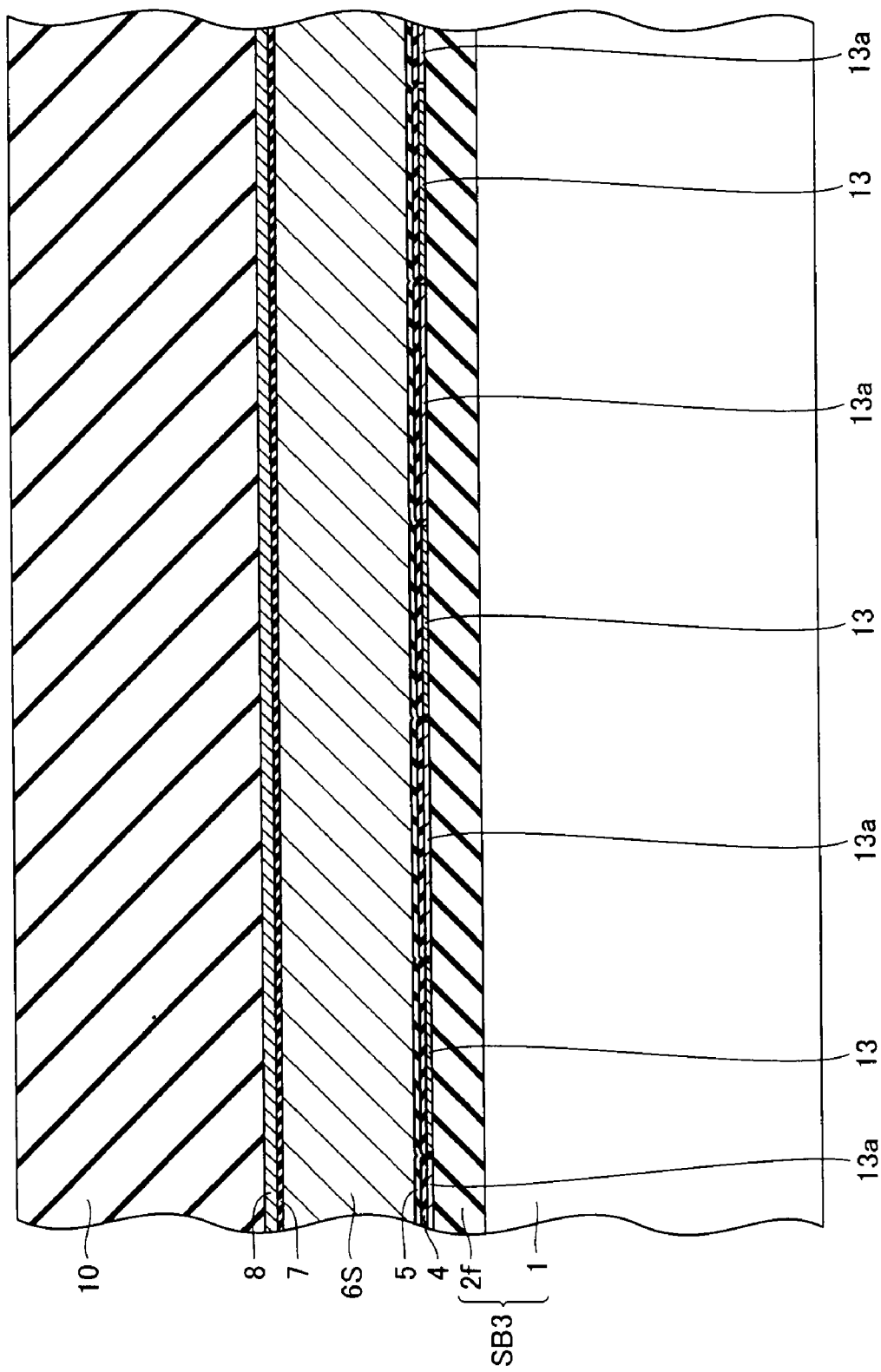
FIG. 55 is a schematic and fragmentary cross section taken along line LV-LV of FIG. 53.

Referring to FIGS. 53-55, the acceleration sensor of this embodiment has substrate SB3 instead of substrate SB1 (FIGS. 4 and 9) in the first embodiment. The acceleration sensor of this embodiment further has a doped polycrystalline silicon layer 13a (the pattern having portions between which the interconnections are present).

Substrate SB3 has silicon substrate 1 having a main surface, and oxide film 2f formed on the main surface. Doped polycrystalline silicon layer 13 serving as the interconnection for acceleration sensing unit EL is formed on substrate SB3.

Doped polycrystalline silicon layer 13a is formed on substrate SB3. Doped polycrystalline silicon layer 13 a has the portions between which doped polycrystalline silicon layer 13 are located with spaces therebetween. Doped polycrystalline silicon layers 13 and 13a are made of the same material and has the same thickness. Sealing unit 6S has a portion that is opposed to substrate SB3 with doped polycrystalline silicon layers 13 and 13a therebetween. On substrate SB3, sealing unit 6S surrounds acceleration sensing unit EL. Sealing unit 6S and acceleration sensing unit EL are made of the doped polycrystalline silicon.

Structures other than the above are substantially the same as those of the first embodiment already described. Therefore, the same or corresponding components bear the same reference numbers, and description thereof is not repeated.

Description will now be given on a method of manufacturing the acceleration sensor that is a semiconductor device of this embodiment.

Figure 56:
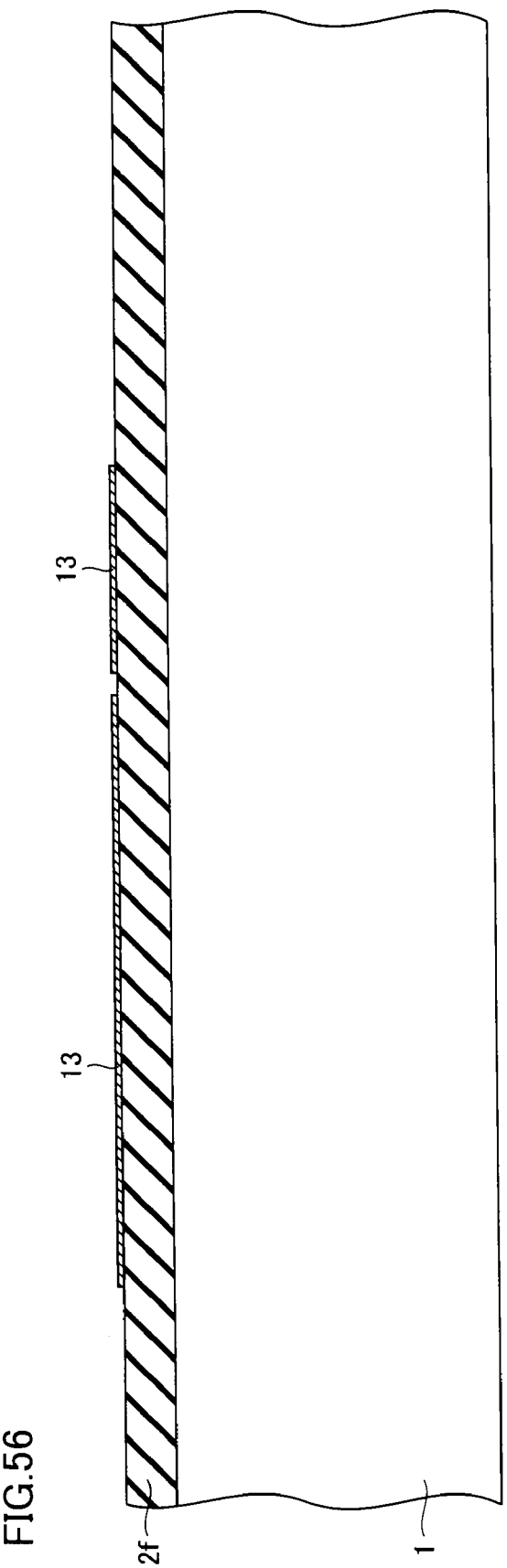
FIGS. 56 and 57 are fragmentary cross sections showing a first step of a method of manufacturing the acceleration sensor that is the semiconductor device in the fifth embodiment of the invention, and particularly show sections in the positions corresponding to those in FIGS. 54 and 55, respectively.
Figure 57:
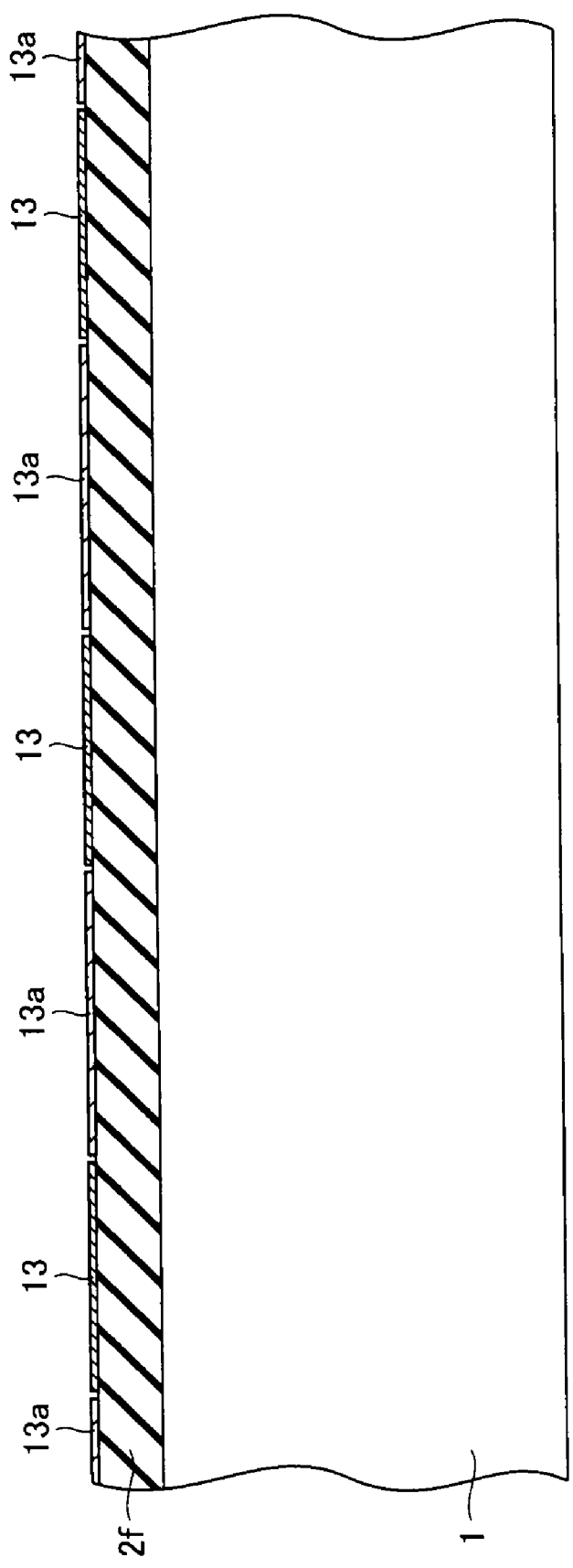

Referring to FIGS. 56 and 57, oxide film 2f is formed on silicon substrate 1. Then, the doped polycrystalline silicon layer is formed, and is patterned by the photoengraving method to form collectively doped polycrystalline silicon layers 13 and 13a. The doped polycrystalline silicon layer has the thickness, e.g., of 100 nm. A distance between doped polycrystalline silicon layers 13 and 13a is, e.g., 1 μm or less.

Figure 58:
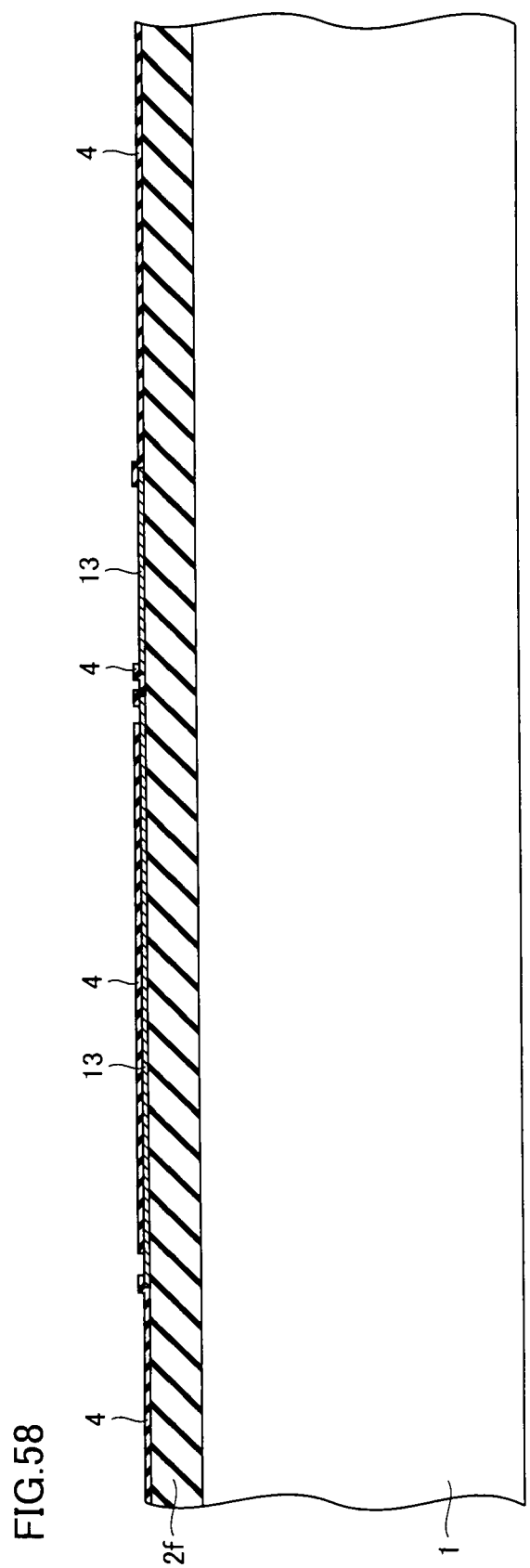
FIGS. 58 and 59 are fragmentary cross sections showing a second step of the method of manufacturing the acceleration sensor that is the semiconductor device in the fifth embodiment of the invention, and particularly show sections in the positions corresponding to those in FIGS. 54 and 55, respectively.
Figure 59:
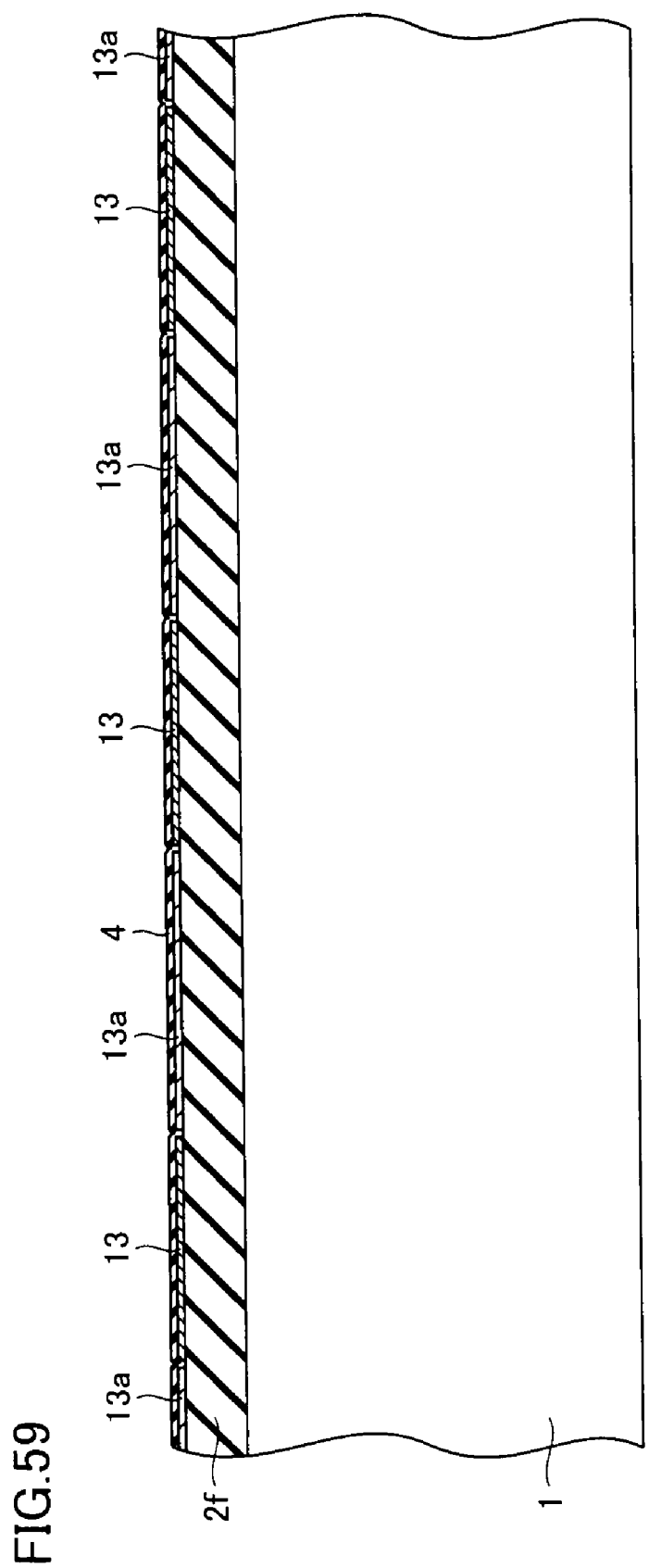
Figure 60:
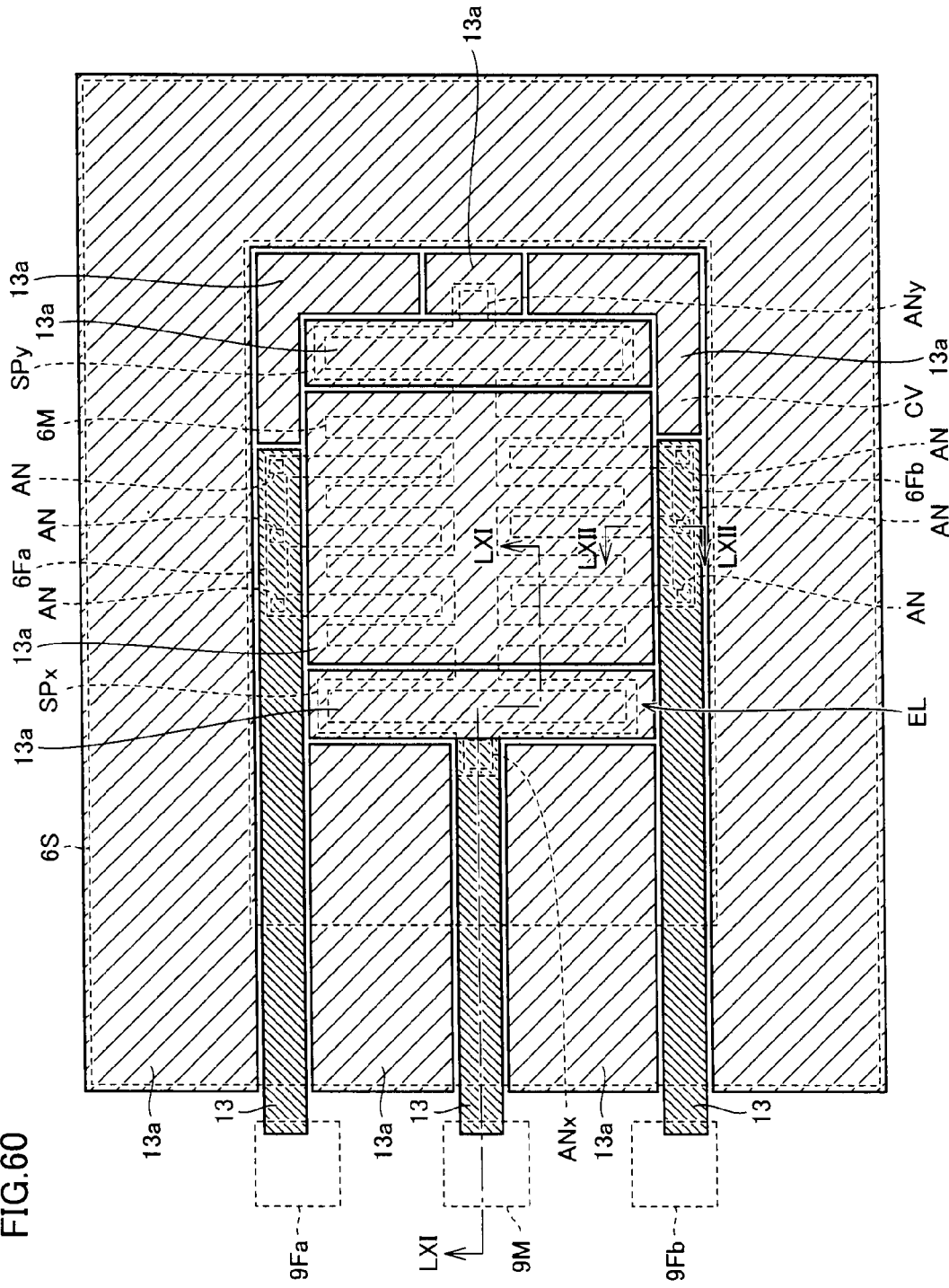
FIG. 60 is a fragmentary plan schematically showing a structure of an acceleration sensor that is a semiconductor device in a sixth embodiment of the invention, but does not show a cap, a substrate and a nitride film arranged on the substrate.

Referring to FIGS. 58 and 59, an oxide film is formed, and is patterned by the photoengraving method to form interlayer insulating film 4.

Steps after the above are substantially the same as those in FIGS. 17-24 in the first embodiment, and therefore description thereof is not repeated.

According to this embodiment, convexities caused by the formation of doped polycrystalline silicon layer 13 on substrate SB3 are located between doped polycrystalline silicon layers 13 and 13a, and thereby the smooth surface is formed. This structure suppresses occurrence of the irregularities caused at the upper surface of sealing unit 6S that is formed with doped polycrystalline silicon layers 13 and 13a located between substrate SB3 and sealing unit 6S. Therefore, sealing unit 6S can be closely joined to cap 10. Accordingly, the airtightness of cavity CV can be ensured and also the electric resistances of interconnections PFa, PFb and PM can be reduced.

Since doped polycrystalline silicon layers 13 and 13a are made of the same doped polycrystalline silicon layer, these doped polycrystalline silicon layers 13 and 13a can reliably have the same thickness. Therefore, the smoothing by doped polycrystalline silicon layer 13 a can be achieved more reliably.

Since doped polycrystalline silicon layers 13 and 13a are formed collectively, an overlapping deviation during the manufacturing process does not occur between doped polycrystalline silicon layers 13 and 13a. Therefore, the smoothing by doped polycrystalline silicon layer 13a can be performed more reliably.

(Sixth Embodiment)

Description will now be given on a structure of an acceleration sensor that is a semiconductor device according to a sixth embodiment.

Figure 61:
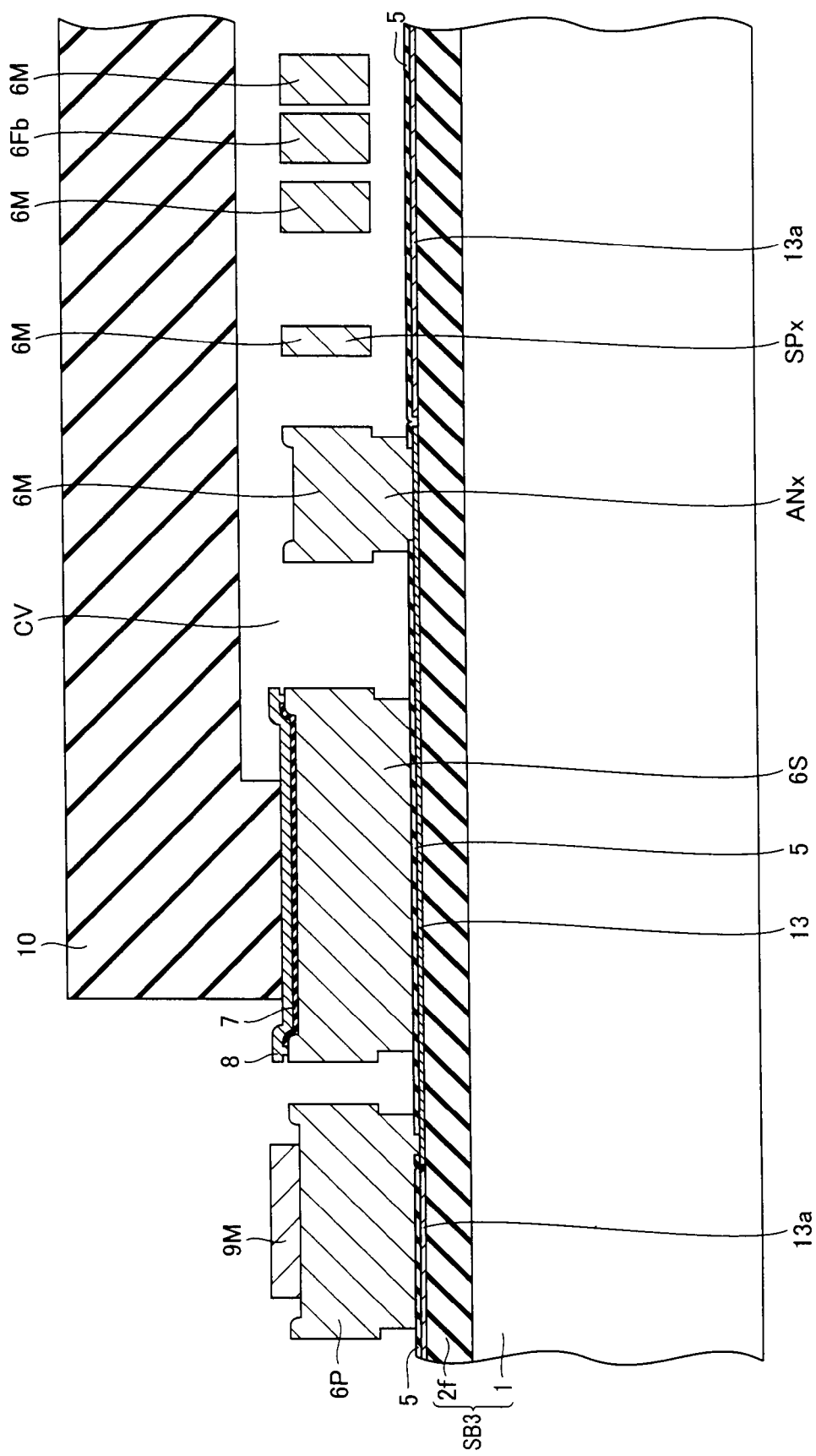
FIG. 61 is a schematic and fragmentary cross section taken along line LXI-LXI of FIG. 60.
Figure 62:
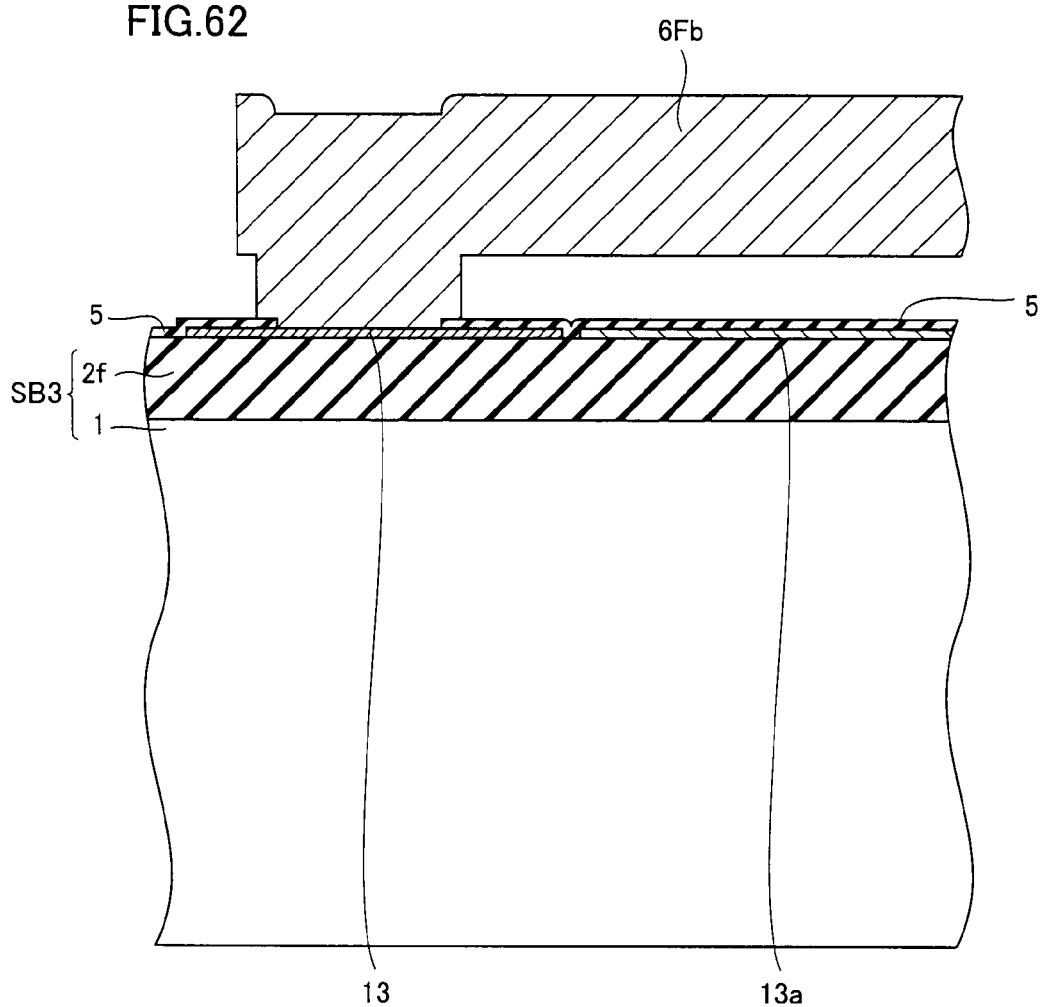
FIG. 62 is a schematic and fragmentary cross section taken along line LXII-LXII of FIG. 60.

Referring primarily to FIGS. 61 and 62, the acceleration sensor of this embodiment does not include doped polycrystalline silicon layer 3 (FIG. 54) in contrast to the fifth embodiment, and the interconnections for acceleration sensing unit EL are formed only by doped polycrystalline silicon layer 13. A part of doped polycrystalline silicon layer 13a is opposed to fixed electrodes 6Fa and 6Fb and movable electrode 6M of acceleration sensing unit EL.

Figure 63:
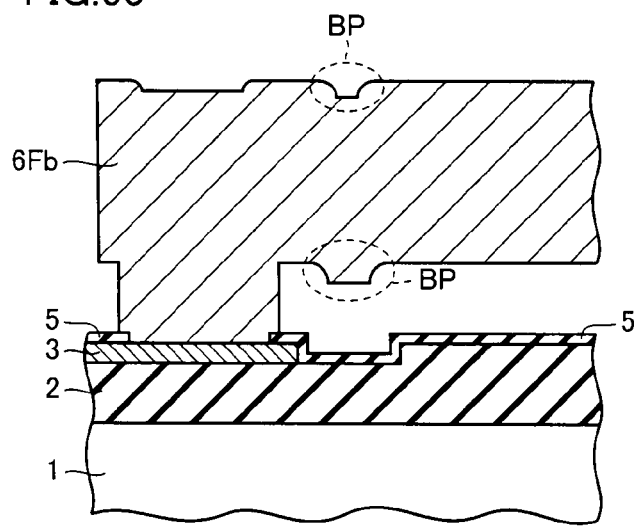
FIG. 63 is a view corresponding to FIG. 62 and shows an acceleration sensor in an example for comparison.

This embodiment can achieve substantially the same operations and effect as the fifth embodiment. Since doped polycrystalline silicon layer 13a is formed on a region of substrate SB3 where acceleration sensing unit EL is formed so that the surface bearing acceleration sensing unit EL can be smoothed to a further extent. Accordingly, this structure suppresses formation of the stepped portion at comb teeth of acceleration sensing unit EL. Particularly, the suppression of the stepped portion of movable electrode 6M can improve mechanical characteristics of acceleration sensing unit EL. If a large stepped portion is formed at the surface bearing acceleration sensing unit EL, a large stepped portion BP is formed at acceleration sensing unit EL as can be seen from an example for comparison in FIG. 63. This deteriorates the mechanical characteristics of acceleration sensing unit EL.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a substrate having a groove;
   a first interconnection including plural separate portions formed along said groove and on a bottom surface of said groove, and having a first thickness;
   a second interconnection formed on said substrate, electrically connecting one of said plural separate portions to another of said plural separate portions and having a second thickness larger than said first thickness;
   an element arranged on said substrate and electrically connected to said second interconnection;
   a member having a portion opposed to said substrate with said first interconnection therebetween, and surrounding said second interconnection and said element on said substrate; and
   a cap arranged on said member to form a cavity on a region of said substrate surrounded by said member.

2. The semiconductor device according to claim 1, wherein each of said element and said member is made of doped polycrystalline silicon.

3. The semiconductor device according to claim 1, wherein said element has a portion arranged displaceably with respect to said substrate.

4. The semiconductor device according to claim 1, wherein a depth of said groove is equal to said first thickness.

5. The semiconductor device according to claim 1, wherein said first interconnection has a crossing portion crossing said second interconnection on said substrate, and
   said semiconductor device further comprises an interlayer insulating film isolating said crossing portion and said second interconnection from each other.

6. The semiconductor device according to claim 1, wherein said substrate has a substrate portion forming a bottom surface of said groove, and an insulating film forming a side surface of said groove.

7. A semiconductor device comprising:
   a substrate having a groove;
   an interconnection formed along said groove and on a bottom surface of said groove to form a concave portion between said interconnection and a side surface of said groove;
   a covering film made of one material and covering an inner surface of said concave portion;
   a filling portion made of a material different from said one material and substantially filling said concave portion covered with said covering film;

an element formed on said substrate and electrically connected to said interconnection;

a member having a portion opposed to said substrate with said interconnection and said filling portion therebetween, and surrounding said element on said substrate; and a cap arranged on said member to form a concavity on a region of said substrate surrounded by said member.

8. The semiconductor device according to claim 7, wherein each of said element and said member is made of doped polycrystalline silicon layer.

9. The semiconductor device according to claim 7, wherein said element has a portion arranged displaceably with respect to said substrate.

10. A semiconductor device comprising:

a substrate;

an interconnection arranged on said substrate;

a pattern made of the same material as said interconnection, located on said substrate and having portions located on the opposite sides of said interconnection with spaces therebetween, respectively;

an element arranged on said substrate, electrically isolated from said pattern and electrically connected to said interconnection;

a member having a portion opposed to said substrate with said interconnection and said pattern therebetween, located on said substrate and surrounding said element; and a cap arranged on said member to form a cavity on a region of said substrate surrounded by said member.

11. The semiconductor device according to claim 10, wherein each of said element and said member is made of doped poly crystalline silicon.

12. The semiconductor device according to claim 10, wherein said element has a portion arranged displaceably with respect to said substrate.

13. The semiconductor device according to claim 12, wherein a part of said pattern is opposed to said displaceably arranged portion.

\* \* \* \* \*